United States Patent
Hashimoto et al.

(10) Patent No.: US 11,640,110 B2
(45) Date of Patent: May 2, 2023

(54) RESIN COMPOSITION, METHOD FOR PRODUCING HEAT-RESISTANT RESIN FILM, AND DISPLAY DEVICE

(71) Applicant: TORAY INDUSTRIES, INC., Tokyo (JP)

(72) Inventors: Keika Hashimoto, Otsu (JP); Kazuto Miyoshi, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 330 days.

(21) Appl. No.: 16/800,674

(22) Filed: Feb. 25, 2020

(65) Prior Publication Data

US 2020/0192227 A1    Jun. 18, 2020

Related U.S. Application Data

(63) Continuation of application No. 15/517,093, filed as application No. PCT/JP2015/077898 on Oct. 1, 2015, now abandoned.

(30) Foreign Application Priority Data

Oct. 6, 2014   (JP) ................................. 2014-205400
Oct. 6, 2014   (JP) ................................. 2014-205401

(51) Int. Cl.

| | |
|---|---|
| G03F 7/022 | (2006.01) |
| G03F 7/023 | (2006.01) |
| C08L 101/02 | (2006.01) |
| H01L 21/027 | (2006.01) |
| H01L 29/786 | (2006.01) |
| G03F 7/037 | (2006.01) |
| G03F 7/004 | (2006.01) |
| G03F 7/038 | (2006.01) |
| G03F 7/40 | (2006.01) |
| C09D 179/08 | (2006.01) |

(52) U.S. Cl.
CPC .......... *G03F 7/0226* (2013.01); *C08L 101/02* (2013.01); *G03F 7/0046* (2013.01); *G03F 7/0233* (2013.01); *G03F 7/0236* (2013.01); *G03F 7/037* (2013.01); *G03F 7/0387* (2013.01); *G03F 7/40* (2013.01); *H01L 21/027* (2013.01); *H01L 29/786* (2013.01); *H10K 50/87* (2023.02); *H10K 59/124* (2023.02); *C09D 179/08* (2013.01); *H10K 59/122* (2023.02)

(58) Field of Classification Search
CPC ............. G03F 7/0387; G03F 7/023226; G03F 7/0233; G03F 7/0236; G03F 7/0226; G03F 7/023
See application file for complete search history.

(56) References Cited

U.S. PATENT DOCUMENTS

| | | |
|---|---|---|
| 6,929,890 B2 | 8/2005 | Miyoshi et al. |
| 2003/0082464 A1 | 5/2003 | Takashima et al. |
| 2004/0197703 A1 * | 10/2004 | Miyoshi .................. G03F 7/105 430/270.1 |
| 2006/0019195 A1 * | 1/2006 | Hatakeyama ........... G03F 7/091 430/311 |
| 2006/0057468 A1 | 3/2006 | Igawa et al. |
| 2011/0284855 A1 | 11/2011 | Miyoshi et al. |
| 2014/0191222 A1 * | 7/2014 | Miyoshi .................. H05B 33/14 252/586 |

FOREIGN PATENT DOCUMENTS

| | | |
|---|---|---|
| JP | 2002-356668 A | 12/2002 |
| JP | 2004-326094 A | 11/2004 |
| JP | 2014-162818 A | 9/2014 |
| JP | 2014-186186 A | 10/2014 |
| WO | WO 2014/046062 A1 | 3/2014 |

OTHER PUBLICATIONS

English translation of JP 2002-356668 (a) year 2002 from machine translation from AIPN Japan Patent Office National center for Industrial Property Information and Training, generated Aug. 2, 2017, 38 pages.
English translation of JP 2004-326094 (a) year 2004 from machine translation from AIPN Japan Patent Office National center for Industrial Property Information and Training, generated Aug. 2, 2017, 43 pages.
International Search Report tor PCT/JP2015/077898 (PCT/ISA/210) dated Dec. 8, 2015.
Written Opinion of the International Searching Authority for PCs /JP2015/077898 (PCT/ISA/237) dated Dec. 8, 2015.

* cited by examiner

*Primary Examiner* — John S Chu
(74) *Attorney, Agent, or Firm* — Birch, Stewart, Kolasch & Birch, LLP

(57) ABSTRACT

A resin composition which is configured such that if the resin composition is formed into a resin composition film that has a thickness of 3.0 μm after a heat treatment at a temperature within the range of 200-350° C., the resin composition film forms a heat-resistant resin film that has a light transmittance of 50% or more at a wavelength of 365-436 nm before the heat treatment, while having a light transmittance of 10% or less at a wavelength of 365-436 nm after the heat treatment. Provided is a resin composition having a function of absorbing ultraviolet light and visible light in a short wavelength range, which is suitable for the formation of a planarization film, an insulating layer and a partition wall that are used for organic light emitting devices or display devices.

2 Claims, 1 Drawing Sheet

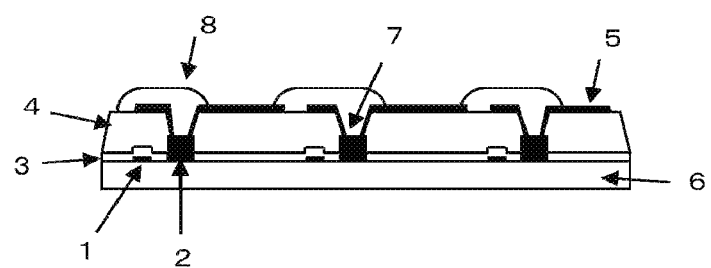

RESIN COMPOSITION, METHOD FOR PRODUCING HEAT-RESISTANT RESIN FILM, AND DISPLAY DEVICE

CROSS-REFERENCE TO RELATED APPLICATIONS

This application is a Continuation of application Ser. No. 15/517,093, filed on Apr. 5, 2017, which is the National Phase under 35 U.S.C. § 371 of International Application No. PCT/JP2015/077898, filed on Oct. 1, 2015, which claims the benefit under 35 U.S.C. § 119(a) to Patent Application No. 2014-205400, filed in Japan on Oct. 6, 2014 and to Patent Application No. 2014-205401, filed in Japan on Oct. 6, 2014, all of which are hereby expressly incorporated by reference into the present application.

TECHNICAL FIELD

The present invention relates to a resin composition produced using a compound capable of developing a color by a heat treatment and a method for producing a heat-resistant resin film. The present invention also relates to a resin composition from which a heat-resistant resin film that can absorb ultraviolet light and visible light in a short wavelength range can be formed. More specifically, the present invention relates to: a photosensitive resin composition which is suitable for applications including a surface-protecting film or an interlayer insulating film for semiconductor elements, an insulating layer for organic electroluminescence (wherein an electroluminescence is referred to as an "EL", hereinafter) elements, a planarization film for thin film transistor (wherein a thin film transistor is referred to as a "TFT", hereinafter) substrates for driving display devices equipped with organic EL elements, a protective/insulating film for wiring lines on circuit boards, a planarization film for on-chip microlenses for solid-state imaging elements, various displays/solid-state imaging elements, and a solder resist for circuit boards; and a method for producing a heat-resistant resin film.

BACKGROUND ART

A cured film produced by curing a composition containing a polyimide or a polybenzoxazole has been widely used as an insulating film, a protective film or a planarization film for semiconductor elements and display devices, or the like. Particularly when used in a display device, for example when used as an insulating layer for organic EL displays or a black matrix for liquid crystal displays, it is required to reduce the light transmittance of the cured film for the purpose of improving the contrast in the displays. Furthermore, for the purpose of preventing the deterioration or malfunctions of a display device or the development of a leakage current in the display device which can be caused by the penetration of light into TFTs for driving the display device, an insulating layer in an organic EL display or a planarization film to be provided on a TFT substrate in an organic EL display is also required to have a reduced transmittance.

As an example of the technique for reducing the light transmittance to light having a wavelength within a visible light wavelength range, which is longer than 400 nm, in a cured film, a method can be mentioned in which a coloring agent such as carbon black, an organic or inorganic pigment or a dye is added to a resin composition, as employed in a black matrix material for liquid crystal displays and an RGB paste material. A resin composition containing the coloring agent can absorb light having a wavelength of 350 to 460 nm, and therefore is hardly used as a positive-working photosensitive resin composition which can be photosensitized by exposing the composition to light in the above-mentioned wavelength range so as to penetrate the light to the bottom of a resin film produced from the composition. For this reason, the resin composition is generally used as a negative-working photosensitive resin composition from which a film is produced by photocuring from the surface thereof.

As examples of the technique for reducing the light transmittance of a cured film produced from a positive-working photosensitive resin composition, the following resin compositions can be mentioned: a positive-working radioactive resin composition which comprises an alkali-soluble resin, a quinone diazide compound and a color-developing composition comprising, for example, a leuco dye and a color developer (see, e.g., Patent Document 1); a photosensitive resin to which a heat-sensitive material that can turn black upon the application of heat is added in advance (see, e.g., Patent Document 2); a positive-working photosensitive resin composition which comprises an alkali-soluble resin, a quinone diazide compound, a thermally color-developing compound capable of developing a color upon heating and having an absorption maximum at a wavelength of 350 to 700 nm inclusive, and a compound having no absorption at a wavelength of 350 nm or more and less than 500 nm and having an absorption maximum at a wavelength of 500 to 750 nm inclusive (see, e.g., Patent Document 3); and a resin composition which comprises a polyimide, a polybenzoxazole, a polyimide precursor or a polybenzoxazole precursor, dihydroxynaphthalene and a thermal crosslinking agent having a specific structure, and which is characterized in that the light transmittance of a cured film produced from the resin composition to light having a wavelength within a visible light wavelength range can be reduced while maintaining the light transmittance of an uncured resin film produced from the resin composition (see, e.g., Patent Document 4). These are techniques in which a color-developing compound that can produce a color upon the application of an energy such as heat is used to reduce the transmittance of a cured film while keeping the transmittance of an uncured resin film to light having a wavelength within an exposing-light wavelength range at a high level.

When a color-developing compound that can produce a color upon the application of an energy such as heat is used, it becomes possible to reduce the (light) transmittance of a heat-resistant resin film, which is a cured product of a resin film produced using the color-developing compound, while keeping the (light) transmittance of the resin film that is not cured yet to light having a wavelength within an exposing-light wavelength range at a high level. Therefore, the color-developing compound can impart both positive-working photosensitive properties and negative-working photosensitive properties. In these techniques, however, it cannot be considered that the degree of the reduction in (light) transmittance of a cured heat-resistant resin film is a sufficiently low value.

PRIOR ART DOCUMENTS

Patent Documents

Patent Document 1: Japanese Patent Laid-open Publication No. 2008-122501

Patent Document 2: Japanese Patent Laid-open Publication No. 10-170715

Patent Document 3: Japanese Patent Laid-open Publication No. 2004-326094

Patent Document 4: International Publication No. 2010/87238

SUMMARY OF THE INVENTION

Problems to be Solved by the Invention

The present invention addresses the problem of providing a resin composition which enables the formation of a heat-resistant resin film that has high sensitivity to ultraviolet light and visible light in a short wavelength range and can be greatly reduced in transmittance particularly to light having a wavelength of 350 to 460 nm. The present invention also addresses the problem of providing a highly reliable organic EL display which does not undergo malfunctions associated with the penetration of light into the device, by using the resin composition.

The present invention also addresses the problem of providing a photosensitive resin composition which enables the formation of a heat-resistant resin film that is highly sensitive to ultraviolet light and visible light in a short wavelength range and can be reduced in transmittance particularly to light having a wavelength of 365 to 436 nm by a heat treatment. The present invention also addresses the problem of providing a highly reliable organic EL display which does not undergo malfunctions associated with the penetration of light into the device, by using the photosensitive resin composition.

Solutions to the Problems

That is, a first aspect of the present invention is a resin composition which is configured such that, when the resin composition is formed into a resin composition film having a thickness of 2.0 µm after a heat treatment at a temperature within the range from 200 to 350° C., the resin composition film forms a heat-resistant resin film having a light transmittance of 50% or more at a wavelength of 365 to 436 nm before the heat treatment and having a light transmittance of 5% or less at a wavelength of 350 to 460 nm after the heat treatment. The resin composition is a resin composition having positive-working photosensitivity which contains a photo-acid generator. The present invention also provides a resin composition having positive-working photosensitivity and comprising (A1) a polyimide, a polybenzoxazole, a polyimide precursor or a polybenzoxazole precursor, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A1).

The present invention also provides a resin composition having positive-working photosensitivity and comprising (A2) a resin having such a backbone structure that two cyclic structures are bonded to a cyclic-structure-constituting quaternary carbon atom, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A2).

The present invention also provides a method for producing a heat-resistant resin film, comprising the steps of: applying the resin composition onto a substrate to form a coating film; drying the coating film; exposing the dried photosensitive resin film to light; developing the light-exposed photosensitive resin film; and subjecting the developed photosensitive resin film to a heat treatment.

The present invention also provides a display device comprising a substrate, a first electrode which is formed on the substrate, an insulating layer which is formed on the first electrode in such a manner as to allow the first electrode to be partially exposed to light, and a second electrode which is provided opposed to the first electrode, wherein the insulating layer is a heat-resistant resin film produced by the production method according to the present invention.

The present invention also provides a display device comprising a substrate on which thin film transistors (TFTs) are formed, a planarization film which is provided in such a manner as to cover projections and depressions on the substrate, and display elements which are provided on the planarization film, wherein the planarization film is a heat-resistant resin film produced by the production method according to the present invention.

A second aspect of the present invention is a resin composition which is configured such that, when the resin composition is formed into a resin composition film that has a thickness of 3.0 µm after a heat treatment at a temperature within the range from 200 to 350° C., the resin composition film forms a heat-resistant resin film having a light transmittance of 50% or more at a wavelength of 365 to 436 nm before the heat treatment and having a light transmittance of 10% or less to light having a wavelength of 365 to 436 nm after the heat treatment.

The present invention is a resin composition having positive-working photosensitivity which contains a photo-acid generator.

The present invention also provides a resin composition having positive-working photosensitivity and comprising (A) an alkali-soluble resin, (I) a compound whose maximum absorption wavelength shifts by a heat treatment, (C) a photo-acid generator, and (D) a solvent.

The present invention also provides a method for producing a heat-resistant resin film, comprising the steps of: applying the resin composition onto a substrate to form a coating film; drying the coating film; exposing the dried photosensitive resin film to light; developing the light-exposed photosensitive resin film; and subjecting the developed photosensitive resin film to a heat treatment.

The present invention also provides a display device comprising a substrate, a first electrode which is formed on the substrate, an insulating layer which is formed on the first electrode in such a manner as to allow the first electrode to be partially exposed to light, and a second electrode which is provided opposed to the first electrode, wherein the insulating layer is a heat-resistant resin film produced by the production method according to the present invention.

The present invention also provides a display device comprising a substrate on which thin film transistors (TFTs) are formed, a planarization film which is provided in such a manner as to cover projections and depressions on the substrate, and display elements which are provided on the planarization film, wherein the planarization film is a heat-resistant resin film produced by the production method according to the present invention.

Effects of the Invention

According to the first aspect of the present invention, it is possible to provide a resin composition which enables the formation of a heat-resistant resin film that has high sensitivity to ultraviolet light and visible light in a short wavelength range and can be greatly reduced in transmittance particularly to light having a wavelength of 350 to 460 nm by a heat treatment. An organic EL display equipped with a heat-resistant resin film produced using the resin composition of the present invention does not undergo deterioration or malfunctions, the development of a leakage current therein or the like which can be caused by the penetration of light into TFTs for driving the device. Therefore, the resin composition is suitable for the improvement in reliability of an organic EL display.

According to the second aspect of the present invention, it is possible to provide a resin composition which enables the formation of a heat-resistant resin film that is highly sensitive to ultraviolet light and visible light in a short wavelength range, allows the penetration of ultraviolet light and visible light in a short wavelength range therethrough before a heat treatment, and is reduced in transmittance particularly to light having a wavelength of 365 to 436 nm by a heat treatment. An organic EL display equipped with a heat-resistant resin film produced using the resin composition of the present invention does not undergo deterioration or malfunctions, the development of a leakage current therein or the like which can be caused by the penetration of light into TFTs for driving the device. Therefore, the resin composition is suitable for the improvement in reliability of an organic EL display.

BRIEF DESCRIPTION OF THE DRAWINGS

The FIGURE shows a cross-sectional view of a TFT substrate.

EMBODIMENTS OF THE INVENTION

The present invention is categorized into the following two aspects.

A first aspect of invention is a resin composition which is configured such that, when the resin composition is formed into a resin composition film having a thickness of 2.0 μm after a heat treatment at a temperature within the range from 200 to 350° C., the resin composition film forms a heat-resistant resin film having alight transmittance of 50% or more at a wavelength of 365 to 436 nm before the heat treatment and having a light transmittance of 5% or less at a wavelength of 350 to 460 nm after the heat treatment.

It is preferred that the resin composition according to the present invention contains a photo-acid generator to impart positive-working photosensitivity to the resin composition. It is also preferred that the resin composition according to the present invention contains a dye and/or a pigment, because the resin composition becomes able to absorb visible light in the whole wavelength range and therefore a contrast-improving effect can also be imparted to the resin composition.

The present invention also provides a resin composition comprising (A1) a polyimide, a polybenzoxazole, a polyimide precursor or a polybenzoxazole precursor, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A1).

The present invention also provides a resin composition having positive-working photosensitivity and comprising (A2) a resin having such a backbone structure that two cyclic structures are bonded to a cyclic-structure-constituting quaternary carbon atom, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A2).

A second aspect of invention is a resin composition which is configured such that, when the resin composition is formed into a resin composition film that has a thickness of 3.0 μm after a heat treatment at a temperature within the range from 200 to 350° C., the resin composition film forms a heat-resistant resin film having a light transmittance of 50% or more at a wavelength of 365 to 436 nm before the heat treatment and having a light transmittance of 10% or less to light having a wavelength of 365 to 436 nm after the heat treatment.

It is preferred that the resin composition according to the present invention contains a compound which does not have an absorption maximum at a wavelength of 340 nm or more and less than 436 nm and has an absorption maximum at a wavelength of 436 to 750 nm inclusive, because the resin composition becomes able to absorb visible light in the whole wavelength range and therefore a contrast-improving effect can also be imparted to the resin composition. It is also preferred that the resin composition according to the present invention contains a photo-acid generator and therefore has positive-working photosensitivity.

The present invention also provides a resin composition having positive-working photosensitivity and comprising (A) an alkali-soluble resin, (I) a compound whose maximum absorption wavelength shifts by a heat treatment, (C) a photo-acid generator, and (D) a solvent.

Hereinbelow, the present invention will be described in detail.

First, the first aspect of the invention will be described in detail.

The present invention relates to a resin composition which is configured such that, when the resin composition is formed into a resin composition film having a thickness of 2.0 μm after a heat treatment at a temperature within the range from 200 to 350° C., the resin composition film forms a heat-resistant resin film having a light transmittance of 50% or more at a wavelength of 365 to 436 nm before the heat treatment and having a light transmittance of 5% or less at a wavelength of 350 to 460 nm after the heat treatment. The term "heat-resistant resin" as used herein refers to a resin which produces a reduced degassing amount under a high temperature of 200° C. or higher after being cured by a heat treatment and has excellent heat resistance. Examples of the heat-resistant resin include, but not limited to, a polyimide, a polybenzoxazole, a polyimide precursor, a polybenzoxazole precursor, a resin having such a backbone structure that two cyclic structures are bonded to a cyclic-structure-constituting quaternary carbon atom, a cyclic olefin polymer, and a polysiloxane. Two or more of these resins may be contained. The term "resin composition from which a heat-resistant resin film can be formed which has a light transmittance of 5% or less to light having a wavelength of 350 to 460 nm after the heat treatment" refers to a resin composition from which a heat-resistant resin film can be formed which has a transmittance of 5% or less to light having a wavelength of 350 to 460 nm after a heat treatment at a temperature of 200 to 350° C. An organic EL display or the like equipped with the heat-resistant resin film does not undergo deterioration or malfunctions, the development of a leakage current therein or the like which can be caused by the penetration of light into TFTs for driving the device. Therefore, the resin composition has an effect of improving the reliability of an organic EL display or the like. When the heat-resistant resin film does not have a thickness of 2.0 μm after a heat treatment, the light transmittance of the heat-resistant resin film can be determined by converting the thickness of the heat-resistant resin film to 2.0 μm in accordance with the Lambert's law.

It is preferred that the resin composition according to the present invention contains a photo-acid generator to impart positive-working photosensitivity to the resin composition. It is also preferred that the resin composition according to the present invention contains a dye and/or a pigment, because the resin composition becomes able to absorb visible light in the whole wavelength range and therefore a contrast-improving effect can also be imparted to the resin composition.

The present invention also relates to a resin composition comprising (A1) a polyimide, a polybenzoxazole, a polyimide precursor or a polybenzoxazole precursor, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A1).

The present invention also relates to a resin composition having positive-working photosensitivity and comprising (A2) a resin having such a backbone structure that two cyclic structures are bonded to a cyclic-structure-constituting quaternary carbon atom, (A3) a phenolic resin and/or a polyhydroxystyrene resin, (B) a thermally color-developing compound, (C) a photo-acid generator, and (D) a solvent, wherein the component (A3) is contained in an amount of 5 to 50 parts by weight inclusive relative to 100 parts by weight of the component (A2).

The resin composition according to the present invention contains (A1) a polyimide, a polybenzoxazole, a polyimide precursor or a polybenzoxazole precursor.

These resins produce a small degassing amount under a high temperature of 200° C. or higher after a heat treatment, have excellent heat resistance, and can exhibit excellent properties for use as a planarization film or an insulating layer used in organic light emitting devices and display elements or for the formation of a partition wall in the devices.

With respect to the component (A1) to be used in the present invention, the polyimide is not particularly limited as long as it has an imide ring, and the polybenzoxazole is not particularly limited as long as it has a benzoxazole ring. The polyimide precursor is not particularly limited as long as it has a structure that can be dehydrated and ring-closed to produce a polyimide having an imide ring. The polybenzoxazole precursor is not particularly limited as long as it has a structure that can be dehydrated and ring-closed to produce a polybenzoxazole having a benzoxazole ring. In the present invention, the component (A1) is more preferably a polyimide precursor or a polybenzoxazole precursor, and more preferably contains a structural unit represented by general formula (1) as the main component.

[Chemical formula 1]

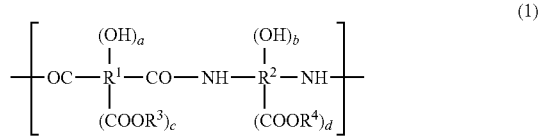

(1)

In general formula (1), $R^1$ and $R^2$ may be the same as or different from each other, and independently represent a bivalent to octavalent organic group having 2 or more carbon atoms. The bivalent to octavalent organic group having 2 or more carbon atoms may be a group in which —$CH_2$— is substituted by —CO—, —COO—, —NH—, —NHCO—, —O—, —S—, —$SO_2$—, —Si— or —Si($CH_3$)$_2$—, or may be a group in which a hydrogen atom contained therein is substituted by a fluoroalkyl group, a hydroxyl group, an alkoxyl group, a nitro group, a cyano group, a fluorine atom, a chlorine atom or —COOR$^{1'}$. $R^{1'}$ represents a hydrogen atom or an alkyl group having 1 to 20 carbon atoms. $R^3$ and $R^4$ may be the same as or different from each other, and independently represent a hydrogen atom or an alkyl group having 1 to 20 carbon atoms. a and b independently represent an integer of 0 to 4, and c and d independently represent an integer of 0 to 2. Provided that a+b>0.

The above-shown general formula (1) represents a polyimide precursor or a polybenzoxazole precursor each having a hydroxyl group, which has superior solubility in an aqueous alkaline solution due to the presence of the hydroxyl group, compared with a polyimide precursor or a polybenzoxazole precursor each having no hydroxyl group.

Each of the polyimide precursor and the polybenzoxazole precursor is a resin having an amide bond in the main chain thereof, and is generally composed of an amine component and an acid component. Each of the polyimide precursor and the polybenzoxazole precursor can be dehydrated and ring-closed by a heat treatment or a chemical treatment to produce the above-mentioned polyimide or polybenzoxazole. The number of repeats of the structural unit in the present invention is preferably 10 to 100000. Specific examples of the polyimide precursor include a polyamic acid ester and a polyisoimide, and a polyamic acid ester is preferred. Specific examples of the polybenzoxazole precursor include a polyhydroxyamide, a polyaminoamide, a polyamide and a polyamideimide, and a polyhydroxyamide is preferred. In each of the polyimide precursor and the polybenzoxazole precursor, it is preferred that an acid residue or an amine residue has an acidic group or an acidic group derivative such as $OR^5$, $SO_3R^5$, $CONR^5R^6$, $COOR^5$ and $SO_2NR^5R^6$, more preferably a hydroxyl group, from the viewpoint of the solubility in an aqueous alkaline solution. $R^5$ and $R^6$ independently represent a hydrogen atom, a hydrocarbon group having 1 to 20 carbon atoms or a group having such a structure that a hydrogen atom in a hydrocarbon group having 1 to 20 carbon atoms is substituted by another type of atom. The term "acidic group" refers to a case where all of $R^5$'s or $R^6$'s are hydrogen atoms, and the term "acidic group derivative" refers to a case where a hydrocarbon group having 1 to 20 carbon atoms or a group having such a structure that a hydrogen atom in a hydrocarbon group having 1 to 20 carbon atoms is substituted by another type of atom is contained in $R^5$ or $R^6$.

In the present invention, preferred examples of the structure of an acid component to be used in the production of the polyimide precursor and the polybenzoxazole precursor are shown below. Structures in each of which 1 to 4 hydrogen atoms is substituted by an alkyl group having 1 to 20 carbon atoms, a fluoroalkyl group, an alkoxyl group, an ester group, a nitro group, a cyano group, a fluorine atom or a chlorine atom can also be included in the preferred examples.

[Chemical formula 2]

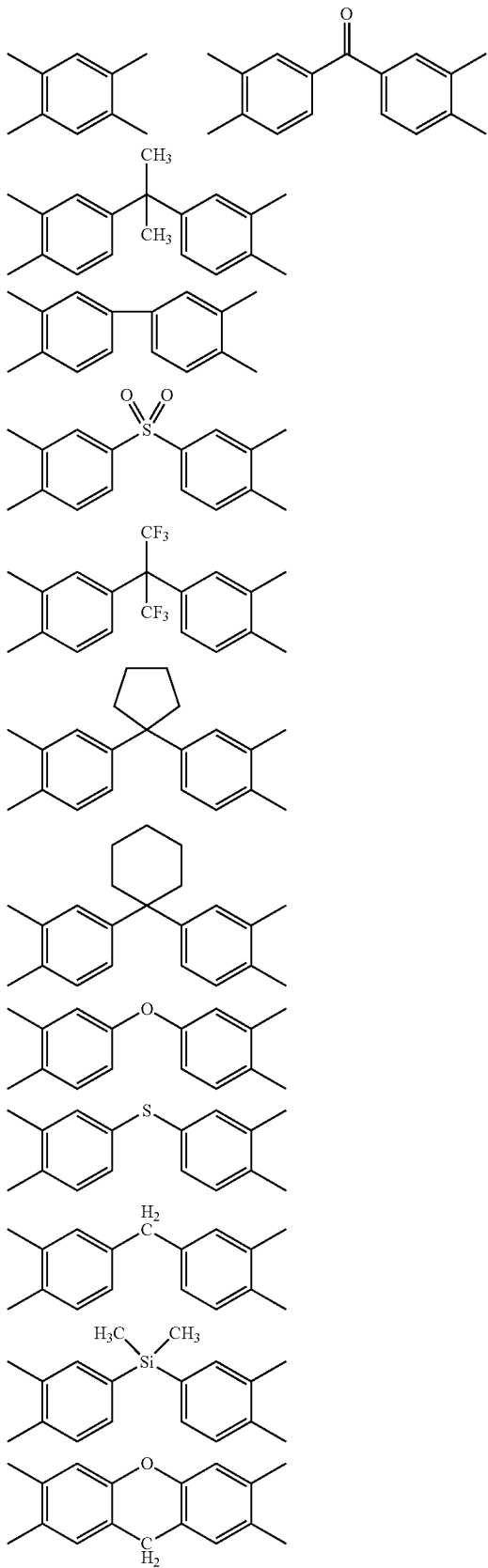

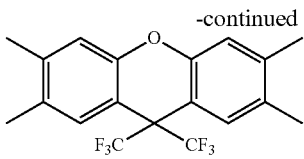

[Chemical formula 3]

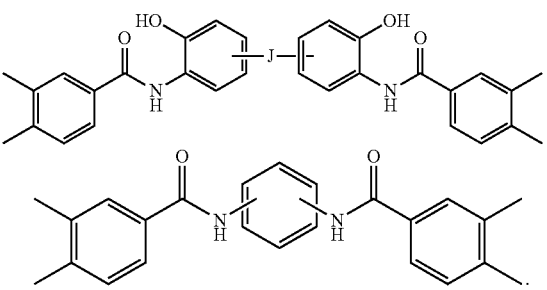

In the formulae, J represents a direct bond, —COO—, —CONH—, —CH$_2$—, —C$_2$H$_4$—, —O—, —C$_3$H$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$— or —C$_6$H$_4$—C$_3$F$_6$—C$_6$H$_4$—.

Examples of the acid component to be used in the production of the polyimide precursor and the polybenzoxazole precursor include a dicarboxylic acid, a tricarboxylic acid and a tetracarboxylic acid.

Preferred examples of the dicarboxylic acid include terephthalic acid, isophthalic acid, diphenyl ether dicarboxylic acid, bis(carboxyphenyl)hexafluoropropane, biphenyldicarboxylic acid, benzophenone dicarboxylic acid and triphenyldicarboxylic acid.

Examples of the tricarboxylic acid may include trimellitic acid, trimesic acid, diphenylethertricarboxylic acid, and biphenyltricarboxylic acid.

Examples of the tetracarboxylic acid may include aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, and aliphatic tetracarboxylic acids such as butanetetracarboxylic acid and 1,2,3,4-cyclopentanetetracarboxylic acid.

It is more preferred to use an acid produced by substituting each of the above-exemplified dicarboxylic acids, tricarboxylic acids and tetracarboxylic acids by 1 to 4 acidic groups or acidic group derivatives (e.g., OR$^5$ groups, SO$_3$R$^5$ groups, CONR$^5$R$^6$ groups, COOR$^5$ groups and SO$_2$NR$^5$R$^6$ groups), preferably 1 to 4 hydroxyl groups or sulfonic acid groups, sulfonic acid amide groups, sulfonic acid ester groups or the like. R$^5$ and R$^6$ independently represent a hydrogen atom or a monovalent hydrocarbon group having 1 to 20 carbon atoms.

Each of these acids may be used without any modification or with modification into an acid anhydride or an active ester. These acids may be used singly, or two or more of them may be used in combination.

A silicon-atom-containing tetracarboxylic acid, such as dimethylsilanediphthalic acid and 1,3-bis(phthalic acid)tetramethyldisiloxane, can also be used to improve the bonding to a substrate and the resistance to oxygen plasma to be used in washing or the like or a UV ozone treatment. It is preferred that the silicon-atom-containing tetracarboxylic acid is used in an amount of 0.0130 mol % relative to the total amount of the acid components.

In the present invention, examples of the preferred structure of the amine component to be used in the production of the polyimide precursor or the polybenzoxazole precursor are shown below. In addition, variants of the structures, in each of which 1 to 4 hydrogen atoms are independently substituted by an alkyl group having 1 to 20 carbon atoms, a fluoroalkyl group, an alkoxyl group, an ester group, a nitro group, a cyano group, a fluorine atom or a chlorine atom are also preferred.

[Chemical formula 4]

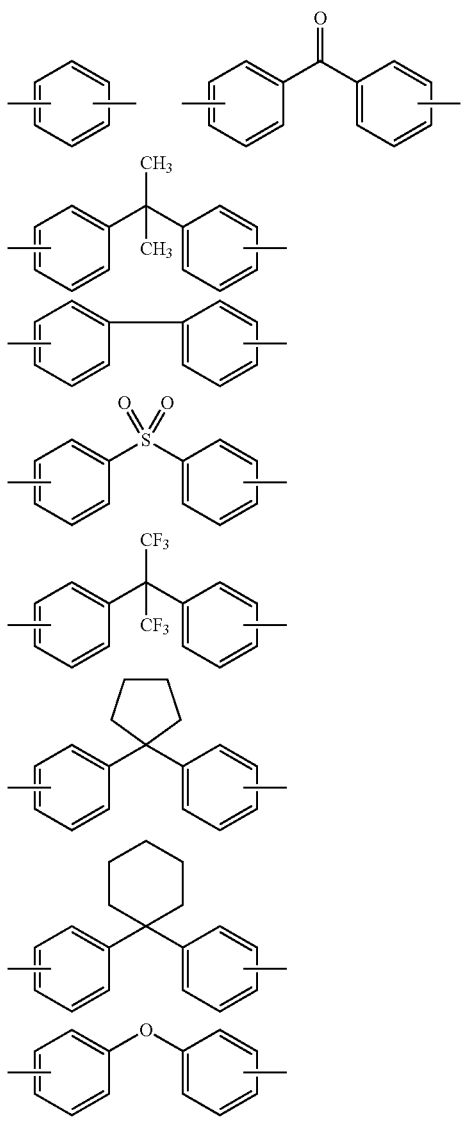

-continued

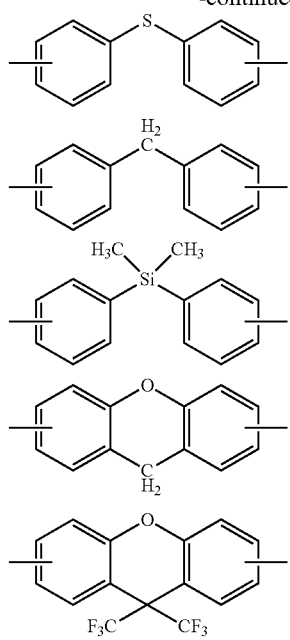

[Chemical formula 5]

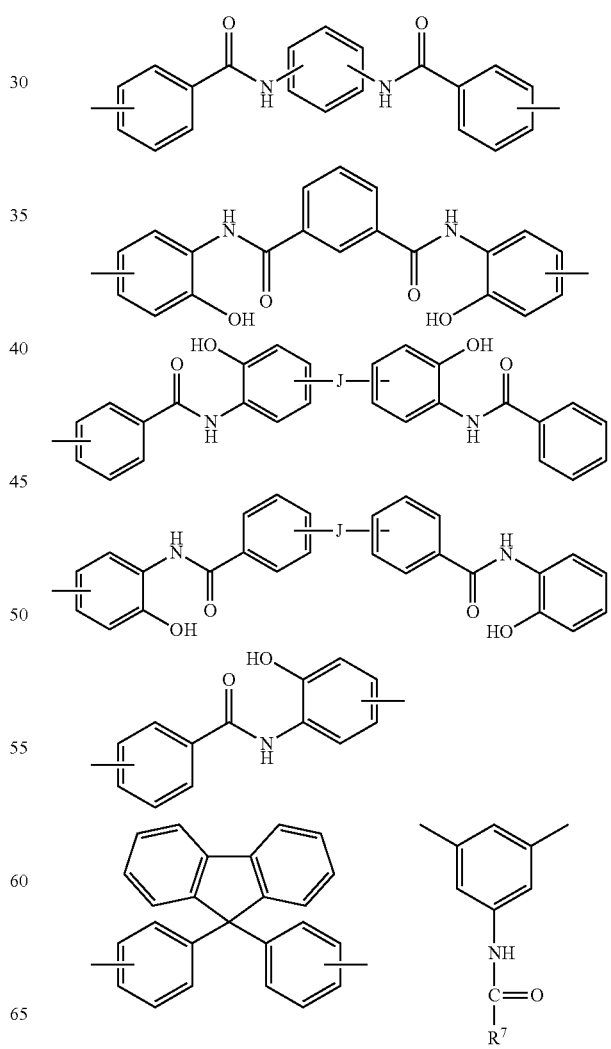

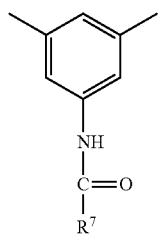

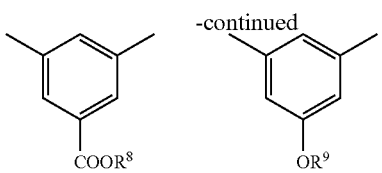

In the formulas, J represents a direct bond, —CO—, —COO—, —CONH—, —CH$_2$—, —C$_2$H$_4$—, —O—, —C$_3$H$_6$—, —C$_3$F$_6$—, —C$_{13}$H$_8$—, —SO$_2$—, —S—, —Si(CH$_3$)$_2$—, —O—Si(CH$_3$)$^2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—. R$^7$ to R$^9$ independently represent a hydrogen atom or a monovalent hydrocarbon group having 1 to 20 carbon atoms, and are preferably monovalent alkyl groups each having 1 to 20 carbon atoms.

As the amine component to be used in the production of the polyimide precursor and the polybenzoxazole precursor, a diamine can be used.

Preferred examples of the diamine may include hydroxyl group-containing diamines such as bis(3-amino-4-hydroxyphenyl)hexafluoropropane, bis(3-amino-4-hydroxyphenyl)sulfone, bis(3-amino-4-hydroxyphenyl) propane, bis(3-amino-4-hydroxyphenyl)methylene, bis(3-amino-4-hydroxyphenyl) ether, bis(3-amino-4-hydroxy) biphenyl, bis(3-amino-4-hydroxyphenyl)fluorene, carboxyl group-containing diamines such as 3,5-diaminobenzoic acid and 3-carboxy-4,4'-diaminodiphenyl ether, sulfonic acid-containing diamines such as 3-sulfonic acid-4,4-diaminodiphenyl ether, dithiohydroxyphenylenediamine, 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or compounds each resulting from replacing some hydrogen atoms of the aromatic ring of each of the foregoing by an alkyl group or a halogen atom, and aliphatic diamines such as cyclohexyldiamine and methylenebiscyclohexylamine. Each of these diamines may be substituted by an alkyl group having 1 to 10 carbon atoms (e.g., a methyl group, an ethyl group), a fluoroalkyl group having 1 to 10 carbon atoms (e.g., a trifluoromethyl group), or a group such as F, Cl, Br and I. Each of the above-exemplified diamines preferably has an acidic group or an acidic group derivative (e.g., OR$^5$, SO$_3$R$^5$, CONR$^5$R$^6$, COOR$^5$, SO$_2$NR$^5$R$^6$), and more preferably has a hydroxyl group. R$^5$ and R$^6$ independently represent a hydrogen atom or a monovalent hydrocarbon group having 1 to 20 carbon atoms.

These diamines may be used without any modification, or diisocyanate compounds and trimethylsilylated diamines corresponding to the diamines may be used, and two or more of them may be used in combination. In applications in which heat resistance is required, it is preferred to use an aromatic diamine in an amount of 50 mol % or more relative to the total amount of the diamine components.

As the diamine component, a silicon-atom-containing diamine, such as 1,3-bis(3-aminopropyl)tetramethyldisiloxane and 1,3-bis(4-anilino)tetramethyldisiloxane, can also be used to improve the bonding to a substrate and the resistance to oxygen plasma to be used in washing or the like or a UV ozone treatment. It is preferred that the silicon-atom-containing diamine is used in an amount of 1 to 30 mol % relative to the total amount of the diamine components.

In the present invention, it is preferred to cap a terminal of the polyimide precursor or the polybenzoxazole precursor by a monoamine, an acid anhydride, an acid chloride or a monocarboxylic acid each having a hydroxyl group, a carboxyl group, a sulfonic acid group or a thiol group. Two or more of these capping substances may be used in combination. When the resin has the above-mentioned group at a terminal thereof, it becomes possible to easily adjust the dissolution rate of the resin in an aqueous alkaline solution to a value within a desirable range.

Examples of the monoamine include aniline, naphthylamine, and aminopyridine, compounds having a phenolic hydroxyl group, such as 3-amino-4,6-dihydroxypyrimidine, 2-aminophenol, 3-aminophenol, 4-aminophenol, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, and 1-amino-2-hydroxynaphthalene, compounds having a carboxyl group, such as 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-O-toluic acid, ammelide, 2-aminobenzoic acid, 3-aminobenzoic acid, 4-aminobenzoic acid, 2-aminobenzenesulfonic acid, 3-aminobenzenesulfonic acid, and 4-aminobenzenesulfonic acid, and compounds having a thiol group, such as 5-amino-8-mercaptoquinoline, 4-amino-8-mercaptoquinoline, 1-mercapto-8-aminonaphthalene, 1-mercapto-7-aminonaphthalene, 1-mercapto-6-amino-naphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, and 4-aminothiophenol.

Among them, preferred examples of the monoamine may include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. These monoamines may be used singly, or two or more of them may be used in combination.

Examples of the acid anhydride, the acid chloride, and the monocarboxylic acid include acid anhydrides such as phthalic anhydride, maleic anhydride, nadic anhydride, cyclohexanedicarboxylic anhydride, and 3-hydroxyphthalic anhydride, monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, and 4-carboxybenzenesulfonic acid, and monoacid chloride compounds with the carboxyl group of the monocarboxylic acid formed into an acid chloride, monoacid chloride compounds with only one carboxy group of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene formed into an acid chloride, and active ester compounds obtained by reaction of a monoacid chloride compound with N-hydroxybenzotriazole and N-hydroxy-5-norbornene-2,3-dicarboxyimide.

Among them, preferred examples of the acid anhydride, the acid chloride, and the monocarboxylic acid may include acid anhydrides such as phthalic anhydride, maleic anhydride, nadic acid, cyclohexanedicarboxylic anhydride, and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, monoacid chloride compounds with the carboxyl group of the monocarboxylic acid formed into an acid chloride, monoacid chloride compounds with only one carboxy group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene formed into an acid chloride, and active ester compounds obtained by reaction of a monoacid chloride compound with N-hydroxybenzotriazole and N-hydroxy-5-norbornene-2,3-dicarboxyimide. These monoamines may be used singly, or two or more of them may be used in combination.

The content of the terminal-capping agent (e.g., a monoamine, an acid anhydride, an acid chloride, a monocarboxylic acid) is preferably 0.1 to 70 mol %, more preferably 5 to 50 mol %, relative to the number of moles of the acid component monomer or the diamine component monomer to be charged. When the content is adjusted to the above-mentioned value, it becomes possible to produce a resin composition which has a proper solution viscosity during the application of the resin composition and can exert excellent film properties.

The resin may also have a polymerizable functional group at a terminal thereof. Examples of the polymerizable functional group include an ethylenically unsaturated bond group, an acethylene group, a methylol group and an alkoxymethyl group.

The terminal-capping agent introduced into the resin can be detected easily by the following methods. For example, the resin having the terminal-capping agent introduced thereinto is dissolved in an acidic solution to decompose the resin into an amine component and an acid component which are constituent units of the resin, and these components are subjected to a measurement by gas chromatography (GC) or NMR to detect the terminal-capping agent easily. Alternatively, the resin having the terminal-capping agent introduced thereinto may be directly subjected to a measurement by thermal decomposition gas chromatography (PGC) or infrared or $^{13}$C-NMR spectroscopy to detect the terminal-capping agent.

The reaction solvent which can be used preferably in the synthesis of the polyimide, the polybenzoxazole, the polyimide precursor or the polybenzoxazole precursor in the present invention is not particularly limited, as long as the polymer can be synthesized. Specific examples of the reaction solvent include: a polar aprotic solvent, such as N-methyl-2-pyrrolidone, γ-butyrolactone, N,N-dimethylformamide, N,N-dimethylacetamide and dimethyl sulfoxide; a glycol ether, such as tetrahydrofuran, dioxane, propylene glycol monomethyl ether, propylene glycol monoethyl ether, diethylene glycol dimethyl ether, diethylene glycol diethyl ether and diethylene glycol ethyl methyl ether; a ketone, such as acetone, methyl ethyl ketone, diisobutyl ketone and diacetone alcohol; an ester, such as ethyl acetate, butyl acetate, isobutyl acetate, propyl acetate, propylene glycol monomethyl ether acetate, glycol ether acetate and 3-methyl-3-methoxy butyl acetate; an alcohol, such as ethyl lactate, methyl lactate, diacetone alcohol and 3-methyl-3-methoxybutanol; and an aromatic hydrocarbon, such as toluene and xylene. Two or more of these solvents may be contained. The content of the solvent is preferably 100 to 2000 parts by weight relative to the total amount, i.e., 100 parts by weight, of the compound having an amino group and the compound having an acid anhydride group.

The resin composition according to the present invention contains (A2) a resin having such a backbone structure that two cyclic structures are bonded to a cyclic-structure-constituting quaternary carbon atom. The resin having such a backbone structure that two cyclic structures are bonded to a cyclic-structure-constituting quaternary carbon atom is a resin having such a backbone structure that two cyclic structures are bonded to a cyclic-structure-constituting quaternary carbon atom, i.e., a cardo structure. A common cardo structure is a structure in which a benzene ring is bonded to a fluorene ring.

Specific examples of the backbone structure in which two cyclic structures are bonded to a cyclic-structure-constituting quaternary carbon atom include a fluorene backbone, a bisphenolfluorene backbone, a bisaminophenylfluorene backbone, a fluorene backbone having an epoxy group, and a fluorene backbone having an acryl group.

The resin having such a backbone structure that two cyclic structures are bonded to a cyclic-structure-constituting quaternary carbon atom can be produced by polymerizing a backbone having the cardo structure through a reaction between functional groups bonding to the backbones or the like. The resin having such a backbone structure that two cyclic structures are bonded to a cyclic-structure-constituting quaternary carbon atom has a structure in which the main chain is linked to a highly bulky side chain through one element (i.e., a cardo structure), and has a cyclic structure in the direction substantially perpendicular to the main chain.

Specific example of the monomer having a cardo structure include: a cardo-structure-containing bisphenol, such as a bis(glycidyloxyphenyl)fluorene-type epoxy resin, 9,9-bis(4-hydroxyphenyl)fluorene and 9,9-bis(4-hydroxy-3-methylphenyl)fluorene; a 9,9-bis(cyanoalkyl)fluorene, such as 9,9-bis(cyanomethyl)fluorene; and a 9,9-bis(aminoalkyl)fluorene, such as 9,9-bis(3-aminopropyl)fluorene.

The resin having such a backbone structure that two cyclic structures are bonded to a cyclic-structure-constituting quaternary carbon atom is a polymer produced by polymerizing a monomer having a cardo structure, and may also be a copolymer of the monomer with another copolymerizable monomer.

As the method for polymerizing the monomer, any conventional method can be employed. Examples of the method include a ring opening polymerization method and an addition polymerization method.

The resin composition according to the present invention may additionally contain a cyclic olefin polymer. Examples of the cyclic olefin polymer that can be used in the present invention include a homopolymer and a copolymer of a cyclic olefin monomer having a cyclic structure (an alicyclic or aromatic structure) and a carbon-carbon double bond. The cyclic olefin polymer may also have a monomer other than the cyclic olefin monomer.

Examples of the monomer constituting the cyclic olefin polymer include a cyclic olefin monomer having a protic polar group, a cyclic olefin monomer having an aprotic polar group, a cyclic olefin monomer having no polar group, and a monomer other than a cyclic olefin. The monomer other than a cyclic olefin may have a protic polar group or another polar group, or may have no polar group.

Specific examples of the cyclic olefin monomer having a protonic polar group include carboxyl group-containing cyclic olefins such as 5-hydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 5-exo-6-end-dihydroxycarbonylbicyclo[2.2.1]hept-2-ene, 8-hydroxycarbonyltetracyclo[4.4.0.1$^{2,5}$.1$^{7,10}$]dodeca-3-ene, 8-methyl-8-hydroxycarbonyltetracyclo[4.4.0.1$^{2,5}$.1$^{7,10}$]dodeca-3-ene, and 8-exo-9-end-dihydroxycarbonyltetracyclo[4.4.0.1$^{2,5}$.1$^{7,10}$]dodeca-3-ene, and hydroxyl group-containing cyclic olefins such as 5-(4-hydroxyphenyl)bicyclo[2.2.1]hept-2-ene, 5-methyl-5-(4-hydroxyphenyl)bicyclo[2.2.1]hept-2-ene, 8-(4-hydroxyphenyl)tetracyclo[4.4.0.1$^{2,5}$.1$^{7,10}$]dodeca-3-ene, and 8-methyl-8-(4-hydroxyphenyl)tetracyclo[4.4.0.1$^{2,5}$.1$^{7,10}$]dodeca-3-ene. These monomers may be used singly, or two or more of them may be used in combination.

Specific examples of the cyclic olefin monomer having a polar group other than a protonic polar group include cyclic olefins having an ester group such as 5-acetoxybicyclo[2.2.1]hept-2-ene, 5-methoxycarbonylbicyclo[2.2.1]hept-2-ene, 5-methyl-5-methoxycarbonylbicyclo[2.2.1]hept-2-ene, 8-acetoxytetracyclo[4.4.0.1$^{2,5}$.1$^{7,10}$]dodeca-3-ene, 8-methoxycarbonyltetracyclo[4.4.0.1$^{2,5}$.1$^{7,10}$]dodeca-3-ene, 8-ethoxycarbonyltetracyclo[4.4.0.1$^{2,5}$.1$^{7,10}$]dodeca-3-ene, 8-n-propoxycarbonyltetracyclo[4.4.0.11$^{2,5}$.1$^{7,10}$]dodeca-3-ene, 8-isopropoxycarbonyltetracyclo[4.4.0.1$^{2,5}$.1$^{7,10}$]dodeca-3-ene, 8-n-butoxycarbonyltetracyclo[4.4.0.1$^{2,5}$.1$^{7,10}$]dodeca-3-ene, 8-methyl-8-methoxycarbonyltetracyclo[4.4.0.1$^{2,5}$.1$^{7,10}$]dodeca-3-ene, 8-methyl-8-ethoxycarbonyltetracyclo[4.4.0.1$^{2,5}$.1$^{7,10}$]dodeca-3-ene, 8-methyl-8-n-propoxycarbonyltetracyclo[4.4.0.1$^{2,5}$.1$^{7,10}$]dodeca-3-ene, 8-methyl-8-isopropoxycarbonyltetracyclo[4.4.0.1$^{2,5}$.1$^{7,10}$]dodeca-3-ene, 8-methyl-8-n-butoxycarbonyltetracyclo[4.4.0.1$^{2,5}$.1$^{7,10}$]dodeca-3-ene, 8-(2,2,2-trifluoroethoxycarbonyl)tetracyclo[4.4.0.1$^{2,5}$.1$^{7,10}$]dodeca-3-ene, and 8-methyl-8-(2,2,2-trifluoroethoxycarbonyl)tetracyclo[4.4.0.1$^{2,5}$.0.1$^{7,10}$]dodeca-3-ene, cyclic olefins having an N-substituted imide group such as N-phenyl-(5-norbornene-2,3-dicarboximide), cyclic olefins having a cyano group such as 8-cyanotetracyclo[4.4.0.1$^{2,5}$.1$^{7,10}$]dodeca-3-ene, 8-methyl-8-cyanotetracyclo[4.4.0.1$^{2,5}$.1$^{7,10}$]dodeca-3-ene, and 5-cyanobicyclo[2.2.1]hept-2-ene, and cyclic olefins having a halogen atom such as 8-chlorotetracyclo[4.4.0.1$^{2,5}$.1$^{7,10}$]dodeca-3-ene and 8-methyl-8-chlorotetracyclo[4.4.0.1$^{2,5}$.1$^{7,10}$]dodeca-3-ene. These monomers may be used singly, or two or more of them may be used in combination.

Specific examples of the cyclic olefin monomer having no polar group include bicyclo[2.2.1]hept-2-ene, 5-ethyl-bicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[4.3.0.1$^{2,5}$]deca-3,7-diene, tetracyclo[8.4.0.1$^{11,14}$.0$^{3,7}$]pentadeca-3,5,7,12,11-pentaene, tetracyclo[4.4.0.1$^{2,5}$.1$^{7.10}$]deca-3-ene, 8-methyl-tetracyclo[4.4.0.1$^{2,5}$.1$^{7,10}$]dodeca-3-ene, 8-ethyl-tetracyclo[4.4.0.1$^{2,5}$.1$^{7,10}$]dodeca-3-ene, 8-methylidene-tetracyclo[4.4.0.1$^{2,5}$.1$^{7,10}$]dodeca-3-ene, 8-ethylidene-tetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyl-tetracyclo[4.4.0.1$^{2,5}$.1$^{7,10}$]dodeca-3-ene, pentacyclo[6.5.1.1$^{3,6}$.0$^{2,7}$.0$^{9,13}$]pentadeca-3,10-diene, cyclopentene, cyclopentadiene, 1,4-methano-1,4,4a,5,10,10a-hexahydroanthracene, 8-phenyl-tetracyclo[4.4.0.1$^{2,5}$.1$^{7,10}$]dodeca-3-ene, tetracyclo[9.2.1.0$^{2,10}$.0$^{3,8}$]tetradeca-3,5,7,12-tetraene, pentacyclo[7.4.0.1$^{3,6}$.1$^{10,13}$.0$^{2,7}$]pentadeca-4,11-diene, and pentacyclo[9.2.1.14,7.0$^{2,10}$.0$^{3,8}$]pentadeca-5,12-diene. These monomers may be used singly, or two or more of them may be used in combination.

Specific examples of the monomer other than the cyclic olefins include α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene, and chain olefins such as non-conjugated dienes including 1,4-hexadiene, 4-methyl-1,4-hexadiene, 5-methyl-1,4-hexadiene, and 1,7-octadiene. These monomers may be used singly, or two or more of them may be used in combination.

As the method for polymerizing the cyclic olefin polymer using the above-mentioned monomer, any conventional method can be employed. Examples of the method include a ring opening polymerization method and an addition polymerization method.

The polymerization catalyst to be used in the polymerization is preferably a complex of a metal such as molybdenum, ruthenium or osmium. These polymerization catalysts may be used singly, or two or more of them may be used in combination.

The hydrogenation of the cyclic olefin polymer produced by the polymerization of the monomer is generally carried out using a hydrogenation catalyst. As the hydrogenation catalyst, one which is conventionally used in the hydrogenation of an olefin compound can be used. Specific examples of the hydrogenation catalyst to be used include a Ziegler-type homogeneous catalyst, a noble metal complex catalyst and a supported noble metal-based catalyst.

Among these hydrogenation catalysts, noble metal complex catalysts of rhodium, ruthenium and the like are preferred, and a ruthenium catalyst with which a nitrogenated heterocyclic carbene compound or phosphine, which is a compound having a high electron-donating property, coordinates is particularly preferred, from the viewpoint of avoiding the occurrence of a side reaction causing the deformation of a functional group or the like and enabling the selective hydrogenation of a carbon-carbon unsaturated bond in the polymer.

The resin composition according to the present invention may additionally contain a polysiloxane. An example of the polysiloxane that can be used in the present invention is a polysiloxane produced by the hydrolytic condensation of at least one organosilane.

Specific examples of the organosilane include tetra-functional silanes such as tetramethoxysilane, tetraethoxysilane, tetraacetoxysilane, and tetraphenoxysilane, tri-functional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl) ethyltrimethoxysilane, 4-hydroxy-5-(p-hydroxyphenylcarbonyloxy)pentyltrimethoxysil ane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl) ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl) methoxy] propyltriethoxysilane, 3-mercaptopropyltrimethoxysilane, 3-(trimethoxysilyl)propyl succinate, 1-naphthyltrimethoxysilane, 1-naphthyltriethoxysilane, 1-naphthyltri-n-propoxysilane, 2-naphthyltrimethoxysilane, 1-anthracenyltrimethoxysilne, 9-anthracenyltrimethoxysilne, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane, and 5-acenaphthenyltrimethoxysilane, di-functional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane, and di(1-naphthyl) diethoxysilane, and mono-functional silanes such as trimethylmethoxysilane, tri-n-butylethoxysilane, (3-glycidoxypropyl)dimethylmethoxysilane, and (3-glycidoxypropyl)dimethylethoxysilane. Two or more of these organosilanes may be used in combination.

Specific examples of the organosilane oligomer include: methyl silicate 51 (n: 4 on average) manufactured by Fuso Chemical Co., Ltd., M silicate 51 (n: 3 to 5 on average), silicate 40 (n: 4 to 6 on average) and silicate 45 (n: 6 to 8 on average) manufactured by Tama Chemicals Co., Ltd., and methyl silicate 51 (n: 4 on average), methyl silicate 53A (n: 7 on average) and ethyl silicate 40 (n: 5 on average) manufactured by Colcoat Co., Ltd. These products can be purchased from these companies. Two or more of them may be used in combination.

The content of an Si atom derived from the organosilane in the polysiloxane can be determined by determining the structure of a raw material organosilane by $^1$H-NMR, $^{13}$C-NMR, $^{29}$Si-NMR, IR, TOF-MS or the like and then calculating an integration ratio of a peak coming from an Si—C bond to a peak coming from an Si—O bond in IR spectra of the structure.

The weight average molecular weight (Mw) of the polysiloxane is not particularly limited, and is preferably 1,000 or more as determined in terms of polystyrene by GPC (gel permeation chromatography), from the viewpoint of improving the coating film formability. On the other hand, the weight average molecular weight (Mw) is preferably 100,000 or less, more preferably 50,000 or less, from the viewpoint of the solubility in a developing solution.

The polysiloxane to be used in the present invention can be synthesized by hydrolyzing and partially condensing a monomer, such as the above-mentioned organosilane, or an oligomer. The term "partial condensation" as used herein refers to a procedure by which several of Si—OH groups can remain in the polysiloxane, rather than condensing all of Si—OH groups in a hydrolysis product. The hydrolysis and the partial condensation can be carried out employing the conventional methods. For example, a method can be mentioned, in which a solvent, water and optionally a catalyst are added to an organosilane mixture and the resultant solution is stirring under heating at 50 to 150° C. for about 0.5 to 100 hours. If necessary, a hydrolysis by-product (an alcohol such as methanol) or a condensation by-product (water) may be distilled away by distillation during the stirring.

The catalyst is not particularly limited, and an acid catalyst and a basic catalyst are preferably used. Specific examples of the acid catalyst include hydrochloric acid, nitric acid, sulfuric acid, hydrofluoric acid, phosphoric acid, acetic acid, trifluoroacetic acid, formic acid, a polyhydric carboxylic acid, an anhydride of any one of these acids, and an ion exchange resin. Specific examples of the basic catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, an alkoxysilane having an amino group, and an ion exchange resin.

From the viewpoint of the storage stability of the photosensitive resin composition, it is preferred that the catalyst is not contained in a polysiloxane solution after the hydrolysis and the partial condensation, and the removal of the catalyst may be carried out as required. The method for the removal is not particularly limited, and is preferably washing with water and/or a treatment with an ion exchange resin from the viewpoint of the easiness of operation and the removability of the catalyst. Washing with water is a method in which the polysiloxane solution is diluted with a proper hydrophobic solvent and is then washed with water several times to produce an organic layer, and the organic layer is concentrated with an evaporator or the like. A treatment with an ion exchange resin is a method in which the polysiloxane solution is brought into contact with a proper ion exchange resin.

The resin composition according to the present invention contains (A3) a phenolic resin and/or a polyhydroxystyrene resin. It is preferred for an insulating layer or a planarization film in an organic EL display to absorb light having a wavelength of 350 to 460 nm, including ultraviolet light and visible light in a short wavelength range, which is believed to be greatly involved in the occurrence of deterioration or malfunctions of the device or the development of a leakage current in the device caused by the penetration of light into TFTs for driving the device. For the formation of an insulating layer or a planarization film having the effect, it is considered to use a resin composition containing a compound having the maximum absorption wavelength thereof at 350 to 460 nm, for example. When merely a resin composition containing a compound having the maximum absorption wavelength thereof at 350 to 460 nm is used, however, the absorption of the light by the resin composition overlaps the absorption of g line (436 nm), h line (405 nm) and i line (365 nm) which correspond to the exposing light wavelengths of a high-pressure mercury lamp. Therefore, it is difficult to penetrate the light to the bottom of the resin film during the exposure of the resin film to light to sensitize the resin film. In contrast, when (A3) the phenolic resin and/or the polyhydroxystyrene resin according to the present invention is used, it becomes possible to penetrate light having a wavelength of the exposing light in a photosensitive resin film that is not subjected to a heat treatment yet, and it becomes possible to cause a thermal oxidation reaction by the action of oxygen present in air during a heat treatment to develop a color and greatly absorb particularly light having a wavelength of 350 to 400 nm, including ultraviolet light and visible light in a short wavelength range, in a heat-resistant film that has been subjected to the heat treatment after the exposure to the light. By using the heat-resistant resin film as an insulating layer or a planarization film in a display device, it becomes possible to prevent the occurrence of deterioration or malfunctions of the device or the development of a leakage current in the device which is caused as the result of the penetration of light into TFTs for driving the device.

Specific examples of the phenolic resin that can be used in the present invention include a novolac resin and a resol resin. The phenolic resin can be produced by polycondensing a single type of phenol compound or a mixture of two or more types of phenol compounds with an aldehyde such as formalin.

Examples of the phenols constituting the novolak resin and the resole resin include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, and β-naphthol, and these phenols may be used singly, or a mixture of two or more of them may be used.

Specific examples of the aldehyde include formalin, paraformaldehyde, acetaldehyde, benzaldehyde, hydroxybenzaldehyde and chloroacetaldehyde. These aldehydes may be used singly, or a mixture of two or more of them may be used.

The phenolic resin to be used in the present invention may be one having a structure in which each of 1 to 4 of hydrogen atoms added to an aromatic ring is substituted by an alkyl group having 1 to 20 carbon atoms, a fluoroalkyl group, an alkoxyl group, an alkoxymethyl group, a methylol group, an ester group, a nitro group, a cyano group, a fluorine atom or a chlorine atom.

The preferred weight average molecular weight of the phenolic resin to be used in the present invention is 2,000 to 50,000, preferably 3,000 to 30,000, as determined in terms of polystyrene by employing gel permeation chromatography (GPC). When the molecular weight is 2,000 or more, the form of a pattern, resolution, developability and heat resistance become excellent. When the molecular weight is 50,000 or less, sufficient sensitivity can be secured.

Specific examples of the polyhydroxystyrene resin that can be used in the present invention include: a polymer or a copolymer which is produced by polymerizing an aromatic vinyl compound having a phenolic hydroxyl group, such as p-hydroxystyrene, m-hydroxystyrene, o-hydroxystyrene, p-isopropenylphenol, m-isopropenylphenol and o-isopropenylphenol, singly or polymerizing two or more of the aromatic vinyl compounds by a known method; and a polymer or copolymer which is produced by an addition reaction for adding an alkoxy group to a part of a polymer or copolymer, which is produced by polymerizing an aromatic vinyl compound, such as styrene, o-methylstyrene, m-methylstyrene and p-methylstyrene, singly or polymerizing two or more of the aromatic vinyl compounds by a conventional known method, by a conventional known method.

The aromatic vinyl compound having a phenolic hydroxyl group that can be used preferably is p-hydroxystyrene and/or m-hydroxystyrene, and styrene is used preferably as the aromatic vinyl compound.

The polyhydroxystyrene resin to be used in the present invention may have a structure in which each of 1 to 4 of hydrogen atoms added to the aromatic ring is substituted by an alkyl group having 1 to 20 carbon atoms, a fluoroalkyl group, an alkoxyl group, an alkoxymethyl group, a methylol group, an ester group, a nitro group, a cyano group, a fluorine atom or a chlorine atom.

The preferred weight average molecular weight of the polyhydroxystyrene resin to be used in the present invention is preferably 3,000 to 60,000, more preferably 3,000 to 25,000, as determined in terms of polystyrene by employing gel permeation chromatography (GPC). When the molecular weight is 3,000 or more, the form of a pattern, resolution, developability and heat resistance become excellent. When the molecular weight is 60,000 or less, sufficient sensitivity can be secured.

In the present invention, the content of the component (A3) is 5 to 50 parts by weight, particularly preferably 10 to 40 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (A3) is 5 parts by weight or more, it becomes possible to decrease a transmittance of a cured film to light having a wavelength within an ultraviolet to visible light wavelength range. When the content is 50 parts by weight or less, the heat resistance or strength of the cured film can be retained and the water absorption rate of the cured film and the formation of scums during development can be reduced.

In the present invention, the term "heat treatment" refers to a procedure of heating at a temperature within the range from 200 to 350° C., more preferably 230° C. or higher. When the heat treatment is carried out at 230° C. or higher, the heat resistance or strength of the cured film can be increased and a thermal oxidation reaction can proceed to decrease the transmittance.

The resin composition according to the present invention contains (B) a thermally color-developing compound. The thermally color-developing compound (B) can produce a color upon a heat treatment and has an absorption maximum at a wavelength of 350 to 700 nm inclusive. More preferably, the thermally color-developing compound (B) can produce a color upon a heat treatment and has an absorption maximum at a wavelength of 350 to 500 nm inclusive. When the component (A3) and the thermally color-developing compound (B) are used, it becomes possible to greatly decrease the transmittance to light having a wavelength of 350 to 460 nm after a heat treatment.

The component (B) to be used in the present invention is preferably a thermally color-developing compound which can produce a color at a temperature higher than 120° C., and is more preferably a thermally color-developing compound which can produce a color at a temperature higher than 180° C. The heat resistance under high-temperature conditions becomes superior with the increase in the color-developing temperature of the thermally color-developing compound, and the thermally color-developing compound rarely undergoes discoloration upon the irradiation with ultraviolet light or visible light for a long period and therefore has excellent light resistance.

The component (B) to be used in the present invention may be a common heat-sensitive dye or a common pressure-sensitive dye, or may be another compound. Examples of the thermally color-developing compound include: one which can produce a color as the result of the change in the chemical structure or the state of electric charge by the action of an acidic group co-existing in the system during the heat treatment; and one which can produce a color as the result of the occurrence of a thermal oxidation reaction by the action of oxygen present in air. Examples of the backbone structure of the thermally color-developing compound include a triarylmethane backbone, a diarylmethane backbone, a fluoran backbone, a bislactone backbone, a phthalide backbone, a xanthene backbone, a rhodamine lactam backbone, a fluorene backbone, a phenothiazine backbone, a phenoxazine backbone and a spiropyran backbone. Specific examples of the (B) component include 4,4',4"-tris(dimethylamino)triphenylmethane, 4,4',4"-tris(diethylamino)-2,2', 2"-trimethyltriphenylmeth ane, 2,4',4"-methylidenetrisphenol, 4,4',4"-methylidenetrisphenol, 4,4'-[(4-hydroxyphenyl) methylene]bis(benzenamine), 4,4'-[(4-aminophenyl) methylene]bisphenol, 4,4'-[(4-aminophenyl)methylene]bis [3,5-dimethylphenol], 4,4'-[(2-hydroxyphenyl)methylene] bis[2,3,6-trimethylphenol], 4-[bis(4-hydroxyphenyl) methyl]-2-methoxyphenol, 4,4'-[(2-hydroxyphenyl) methylene]bis[2-methylphenol], 4,4'-[(4-hydroxyphenyl) methylene]bis[2-methylphenol], 4-[bis(4-hydroxyphenyl) methyl]-2-ethoxyphenol, 4,4-[(3-hydroxyphenyl) methylene]bis[2,6-dimethylphenol], 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethyl phenol], 2,2'-[(2-hydroxyphenyl)methylene]bis[2,3,5-trimethylphenol], 4,4'-[(4-hydroxyphenyl)methylene]bis[2, 3,6-trimethylphenol], 4,4'-[(2-hydroxyphenyl)methylene bis[2-cyclohexyl-5-methylphenol], 4,4'-[(3-hydroxyphenyl) methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl) methylene]bis[2-cyclohexyl-5-methylphenol], 4,4'-[(3,4-dihydroxyphenyl)methylene]bis[2-methylphenol], 4,4'-[(3, 4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl) methyl]-1,2-benzenediol, 4,4',4",4"'-(1,2-ethanediylidene) tetrakisphenol, 4,4',4",4"'-(1,2-ethanediylidene)tetrakis[2-methylphenol], 4,4',4",4"'-(1,2-ethanediylidene)tetrakis[2,6-dimethylphenol], 4,4',4",4"'-(1,4-phenylenemethylidene) tetrakisphenol, 4,4',4",4"'-(1,4-phenylenemethylidene) tetrakis(2,6-dimethylphenol), 4,4'-[(2-hydroxyphenyl) methylene]bis[3-methylphenol], 2,2'-[(3-hydroxyphenyl) methylene]bis[3,5-dimethylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl) methylene]bis[3,5-dimethylphenol], 2,2'-[(3-hydroxy-4-methoxyphenyl)methylene]bis[3,5-dimethylphenol], 4,4'-[(2-hydroxyphenyl)methylene]bis[2-methylethylphenol], 4,4'-[(3-hydroxyphenyl)methylene]bis[2-methylethylphenol], 4,4'-[(4-hydroxyphenyl)methylene]bis[2-methylethylphenol], 2,2'-[(3-hydroxyphenyl)methylene]bis[3,5,6-trimethylphenol], 2,2'-[(4-hydroxyphenyl)methylene]bis[3, 5,6-trimethylphenol], 2,2'-[(4-hydroxy-3-ethoxyphenyl) methylene]bis[3,5-dimethylphenol], 4,4'-[(2-hydroxy-3-methoxyphenyl)methylene]bis[2-(methylethyl)phenol], 4,4'-[(3-hydroxy-4-methoxyphenyl)methylene]bis[2-(methylethyl)phenol], 4,4'-[(4-hydroxy-3-methoxyphenyl) methylene]bis[2-(methylethyl)phenol], 2,2'-[(2-hydroxy-3-methoxyphenyl)methylene]bis[3,5,6-trimethylphenol], 2,2'-[(3-hydroxy-4-methoxyphenyl)methylene]bis[3,5,6-trimethylphenol], 2,2'-[(4-hydroxy-3-methoxyphenyl) methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl) methylene]bis[2,3,6-trimethylphenol], 4,4'-[(4-hydroxy-3-methoxyphenyl)methylene]bis[2-(1,1-dimethylethyl-5-methylphenol], 4,4'-[(2-hydroxyphenyl)methylene]bis[2-cyclohexylphenol], 4,4'-[(3-hydroxyphenyl)methylene]bis [2-cyclohexylphenol], 4,4'-[(4-hydroxyphenyl)methylene] bis[2-cyclohexylphenol], 4,4'-[(2-hydroxy-3-methoxyphenyl)methylene]bis[2-cyclohexylphenol], 4,4'-[(3-hydroxy-4-methoxyphenyl)methylene]bis[2-cyclohexylphenol], 4,4'-[(4-hydroxy-3-ethoxyphenyl) methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis [3,5-dimethylphenol], 4,4'-[(3,4-dihydroxyphenyl) methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)] methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)methyl]phenol, 4,4'-methylenebis[2-[di(3-cyclohexyl-4-hydroxy-6-methylphenyl)]methyl]phenol, 4,4'-(3,5-dimethyl-4-hydroxyphenylmethylene)-bis(2,6-dimethylphenol), 3,3-bis (p-dimethylaminophenyl)-6-dimethylaminophthalide, 3,6-bis(dimethylamino)fluoran-γ-(4'-nitro)-aminolactam, 2-(2-chloroanilino)-6-diethylaminofluoran, 2-(2-chloroanilino)-6-dibutylaminofluoran, 2-N,N-dibenzylamino-6-diethylaminofluoran, 6-diethylamino-benzo[a]-fluoran, 2,2'-bis(2-chlorophenyl)-4,4',5,5'-tetraphenyl-1,2'-bi(imidazole), 1,3-dimethyl-6-diethylaminofluoran, 2-anilino-3-methyl-6-dibutylaminofluoran, 3,7-bis(dimethylamino)-10-benzoylphenothiazine, 3-diethylamino-6-chloro-7-(β-ethoxyethylamino)fluoran, 3-diethylamino-6-methyl-7-anilinofluoran, 3-triethylamino-6-methyl-7-anilinofluoran, and 3-cyclohexylamino-6-methyl-7-anilinofluoran.

Among these compounds, a hydroxy-group-containing compound having a triarylmethane backbone represented by general formula (2) or (3) is preferred.

color developing temperature and excellent high heat resistance: 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis

[Chemical formula 6]

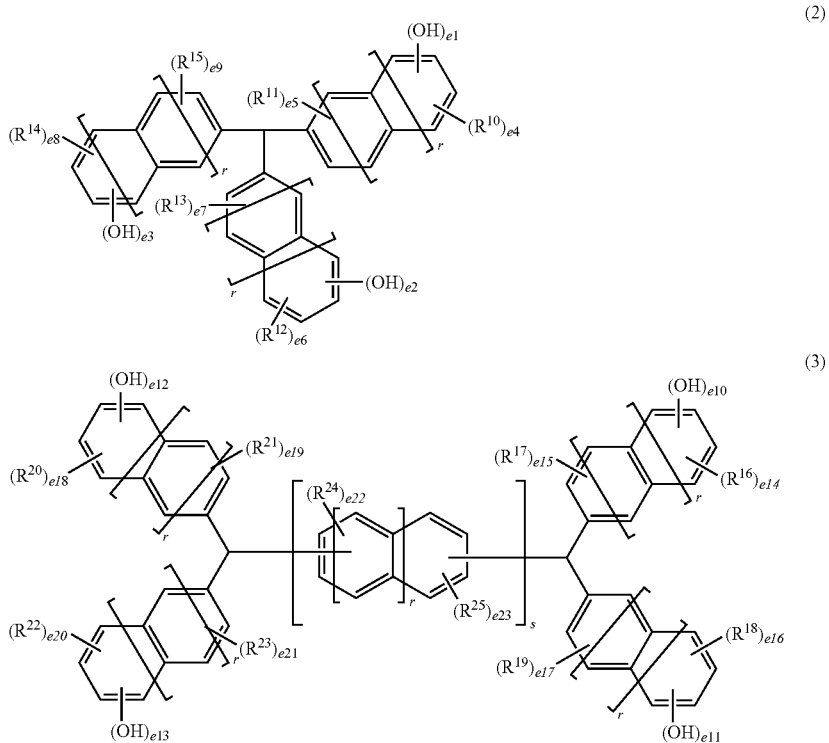

(2)

(3)

$R^{10}$ to $R^{25}$ may be the same as or different from one another, and independently represent a monovalent group selected from a hydrogen atom, a hydrocarbon group having 1 to 12 carbon atoms, a cyclic aliphatic group having 3 to 8 carbon atoms, a hydrocarbon group having 6 to 15 carbon atoms and having an aromatic ring and an alkoxy group having 1 to 4 carbon atoms. r represents 0 or 1, preferably 0. s represents an integer of 0 to 3, preferably 1. e1 to e23 independently represent an integer of 0 to 4, wherein $e1+e2+e3>0$ and $e10+e11+e12+e13>0$.

Specifically, hydroxyl group-containing compounds having a triarylmethane skeleton, such as the following compounds, are particularly preferred due to their high thermal

[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4"'-(1,2-ethanediylidene)tetrakisphenol, 4,4',4",4"'-(1,2-ethanediylidene)tetrakis[2-methylphenol], 4,4',4",4"'-(1,2-ethanediylidene)tetrakis[2,6-dimethylphenol], 4,4',4",4"'-(1,4-phenylenedimethylidene)tetrakisphenol, 4,4',4",4"'-(1,4-phenylenedimethylidene)tetrakis(2,6-dimethylphenol), 4,4'-[(2-hydroxyphenyl)methylene]bis[3-methylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3- methoxyphenyl)methylene]bis[3,5-dimethylphenol], 4,4'-[(2-hydroxyphenyl)methylene]bis[2-methylethylphenol], 4,4'-[(4-hydroxyphenyl)methylene]bis[2-methylethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'-[(2-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4''-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)methyl]phenol, 4,4'-methylenebis[2-[di(3-cyclohexyl-4-hydroxy-6-methylphenyl)]methyl]phenol, and 4,4'-(3,5-dimethyl-4-hydroxyphenylmethylene)-bis(2,6-dimethylphenol). These compounds may be used singly, or a mixture of two or more of them may be used. Alternatively, the hydroxy-group-containing compound having a triarylmethane backbone may be used in the form of a quinone diazide compound which is produced by bonding naphthoquinone diazide sulfonic acid to the hydroxy-group-containing compound having a triarylmethane backbone via an ester bond.

The amount of the thermally color-developing compound (B) to be used in the present invention is preferably 5 to 80 parts by weight, particularly preferably 10 to 60 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the amount of the component (B) to be used is 5 parts by weight or more, it becomes possible to decrease the transmittance of a cured film to light having a wavelength within an ultraviolet to visible light range. When the amount is 80 parts by weight or less, it becomes possible to maintain heat resistance or strength of the cured film and decrease the water absorption ratio of the cured film.

The resin composition according to the present invention contains (C) a photo-acid generator. Specific examples of the photo-acid generator (C) include a quinone diazide compound, a sulfonium salt, a phosphonium salt, a diazonium salt and an iodonium salt.

Examples of the quinone diazide compound include: a compound produced by bonding quinone diazide sulfonic acid to a polyhydroxyl compound or a polyamino compound via an ester bond; a compound produced by bonding quinone diazide sulfonic acid to a polyhydroxyl compound via a sulfoneamide bond; and a compound produced by bonding quinone diazide sulfonic acid to a polyhydroxyl polyamino compound via an ester bond and/or a sulfoneamide bond. In these compounds, it is preferred that 50 mol % or more of all of functional groups in the polyhydroxyl compound or the polyamino compound is substituted by quinone diazide. When a quinone diazide compound in which 50 mol % or more is substituted is used, the affinity of the quinone diazide compound for an aqueous alkaline solution is reduced, the solubility of an unexposed part of the resin composition in an aqueous alkaline solution is greatly reduced, and the quinone diazide sulfonyl group is converted to an indene carboxylic acid upon exposure to light to achieve a high dissolution rate of an exposed part of the resin composition in an aqueous alkaline solution, resulting in the increase in the ratio of the dissolution rate of the exposed part of the composition to the dissolution rate of the unexposed part of the composition. As a result, a pattern with a high degree of resolution can be obtained. By using the quinone diazide compound, it becomes possible to produce a positive-working photosensitivity resin composition which can be photosensitized with i line (365 nm), h line (405 nm) and g line (436 nm) of a conventional mercury lamp. These photo-acid generators may be used singly, or two or more of them may be used in combination. In either case, a high-sensitivity photosensitive resin composition can be produced.

In the present invention, either of a quinone diazide having a 5-naphthoquinone diazide sulfonyl group or a quinone diazide having a 4-naphthoquinone diazide sulfonyl group can be used preferably. The absorption of a naphthoquinone diazide sulfonyl ester compound extends to a g line range of a mercury lamp, and is therefore suitable for the exposure to g line and the exposure to light within the whole wavelength range. A 4-naphthoquinone diazide sulfonyl ester compound has an absorption in an i line range of a mercury lamp, and is therefore suitable for the exposure to i line. In the present invention, it is preferred to select a 4-naphthoquinone diazide sulfonyl ester compound or a 5-naphthoquinone diazide sulfonyl ester compound depending on the wavelength to be exposed. It is also possible to produce a naphthoquinone diazide sulfonyl ester compound having both a 4-naphthoquinone diazide sulfonyl group and a 5-naphthoquinone diazide sulfonyl group in the molecule thereof, or it is also possible to use both a 4-naphthoquinone diazide sulfonyl ester compound and a 5-naphthoquinone diazide sulfonyl ester compound in combination.

The molecular weight of the quinone diazide compound is preferably 300 or more, more preferably 350 or more, and is preferably 3000 or less, more preferably 1500 or less, from the viewpoint of the heat resistance, mechanical properties and bonding properties of a film produced by a heat treatment.

The content of the quinone diazide compound is preferably 1 part by weight or more, more preferably 3 parts by weight or more, and is preferably 100 parts by weight or less, more preferably 80 parts by weight or less, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content is 1 to 100 parts by weight, it becomes possible to impart photosensitiveness to a film produced after a heat treatment while maintaining the heat resistance, chemical resistance and mechanical properties of the film.

In the case where the quinone diazide compound is contained as the thermally color-developing compound (B), the compound can also act as the photo-acid generator (C). In this case, the content of the quinone diazide compound is preferably 5 parts by weight or more, more preferably 10 parts by weight or more, and is preferably 100 parts by weight or less, more preferably 80 parts by weight or less, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content is 5 to 100 parts by weight, it becomes possible to decrease the transmittance of a film produced after a heat treatment and impart photosensitiveness to the film while maintaining the heat resistance, chemical resistance and mechanical properties of the film.

Among these photo-acid generators, a sulfonium salt, a phosphonium salt and a diazonium salt are preferred, because an acid component generated upon the exposure to light can be stabilized appropriately. Particularly, a sulfonium salt is preferred.

The content of the sulfonium salt, the phosphonium salt or the diazonium salt is preferably 0.5 to 20 parts by weight relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, from the viewpoint of increasing sensitivity. In addition, a sensitizer or the like may be contained, if necessary.

The resin composition according to the present invention contains (D) a solvent. Specific examples of the solvent to be used in the present invention include: a polar aprotic solvent, such as N-methyl-2-pyrrolidone, gamma-butyrolactone, N,N-dimethylformamide, N,N-dimethylacetamide and dimethyl sulfoxide; an ether, such as tetrahydrofuran, dioxane and propylene glycol monomethyl ether; a ketone, such as acetone, methyl ethyl ketone, diisobutyl ketone and diacetone alcohol; an ester, such as ethyl acetate, propylene glycol monomethyl ether acetate and ethyl lactate; and an aromatic hydrocarbon, such as toluene and xylene. These solvents may be used singly, or two or more of them may be used in combination.

The content of the solvent to be used in the present invention is preferably 50 parts by weight or more, more preferably 100 parts by weight or more, and is preferably 2000 parts by weight or less, more preferably 1500 parts by weight or less, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom.

The resin composition according to the present invention preferably contains (E) a dye and/or a pigment. As this compound, a dye and/or an organic pigment can be used preferably. At least one type of the component (E) may be contained. For example, a method in which one type of dye or organic pigment is used, a method in which at least two types of dyes or organic pigments are used as a mixture, a method in which at least one type of dye and at least one type of organic pigment are used in combination, and the like can be mentioned. In the present invention, a dye and/or a pigment each having an absorption maximum at 400 to 750 nm is preferably selected.

The component (E) to be used in the resin composition according to the present invention preferably contains (E1) a dye and/or a pigment each having an absorption maximum at a wavelength of 400 nm or more and less than 490 nm.

The dye to be used as the component (E1) in the present invention is preferably: a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin; or a dye having high heat resistance and high light resistance, from the viewpoint of storage stability and discoloration upon curing or irradiation with light. The component (E1) has an absorption maximum at a wavelength of 400 nm or more and less than 490 nm, and specific examples thereof include a yellow dye and an orange dye. The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The pigment to be used as the component (E1) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the yellow pigment include pigment yellow 83, 117, 129, 138, 139, 150 and 180. Specific examples of the orange pigment include pigment orange 38, 43, 64, 71 and 72. A pigment other than the above-mentioned pigments may also be used.

The content of the component (E1) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (E1) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and also maintaining the heat resistance and mechanical properties of a film after a heat treatment.

In the present invention, the organic pigment to be used as the component (E1) may be subjected to a surface treatment, such as a rosin treatment, an acidic group treatment and a basic group treatment, if necessary. The organic pigment may also be used together with a dispersant optionally. Examples of the dispersant include a cationic surfactant, an anionic surfactant, a nonionic surfactant, an amphoteric surfactant, a silicone-type surfactant and a fluorine-containing surfactant.

The component (E) to be used in the resin composition according to the present invention preferably contains (E2) a dye and/or a pigment each having an absorption maximum at a wavelength of 490 nm or more and less than 580 nm.

The dye to be used as the component (E2) in the present invention is preferably: a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin; or a dye having high heat resistance and high light resistance, from the viewpoint of storage stability and discoloration upon curing or irradiation with light. The component (E2) has an absorption maximum at a wavelength of 490 nm or more and less than 580 nm, and examples thereof include a red dye and a violet dye.

The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The pigment to be used as the component (E2) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the red pigment include pigment red 48:1, 122, 168, 177, 202, 206, 207, 209, 224, 242 and 254. Specific examples of the violet pigment include pigment violet 19, 23, 29, 32, 33, 36, 37 and 38. A pigment other than the above-mentioned pigments may also be used.

The content of the component (E2) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (E2) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and the heat resistance and mechanical properties of a film after a heat treatment.

In the present invention, the organic pigment to be used as the component (E2) may be subjected to a surface treatment, such as a rosin treatment, an acidic group treatment and a basic group treatment, if necessary. The organic pigment may also be used together with a dispersant, if necessary. Examples of the dispersant include a cationic surfactant, an anionic surfactant, a nonionic surfactant, an amphoteric surfactant, a silicone-type surfactant and a fluorine-containing surfactant.

The component (E) to be used in the resin composition according to the present invention preferably contains (E3) a dye and/or a pigment having an absorption maximum at a wavelength of 580 nm or more and less than 800 nm.

The dye to be used as the component (E3) in the present invention is preferably a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin, or a dye having high heat resistance and high light resistance, from the viewpoint of storage stability and discoloration upon curing or irradiation with light. The component (E3) has an absorption maximum at a wavelength of 580 nm or more and less than 800 nm, and examples thereof include a blue dye and a green dye.

The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The pigment to be used as the component (E3) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the blue pigment include pigment blue 15 (e.g., 15:3, 15:4, 15:6), 21, 22, 60 and 64. Specific examples of the green pigment include pigment green 7, 10, 36, 47 and 58. A pigment other than the above-mentioned pigments may also be used.

The content of the component (E3) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (E3) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and the heat resistance and mechanical properties of a film after a heat treatment.

In the present invention, the organic pigment to be used as the component (E3) may be subjected to a surface treatment, such as a rosin treatment, an acidic group treatment and a basic group treatment, if necessary. The organic pigment may also be used together with a dispersant, if necessary. Examples of the dispersant include a cationic surfactant, an anionic surfactant, a nonionic surfactant, an amphoteric surfactant, a silicone-type surfactant and a fluorine-containing surfactant.

In the present invention, the film can be blackened by additionally using the components (E1), (E2) and (E3). The degree of blackening can be expressed by an optical density (an OD value), and the OD value is preferably 0.15 or more, more preferably 0.4 or more, still more preferably 1.0 or more.

The resin composition according to the present invention may additionally contain (F) a compound having 3 to 6 thermally crosslinkable groups per molecule. When the component (F) is contained, it becomes possible to impart positive-working photosensitivity and improve the chemical resistance of the heat-resistant resin film.

As the component (F), a compound represented by general formula (4) or a compound having a structure represented by general formula (5) is preferred.

[Chemical formula 7]

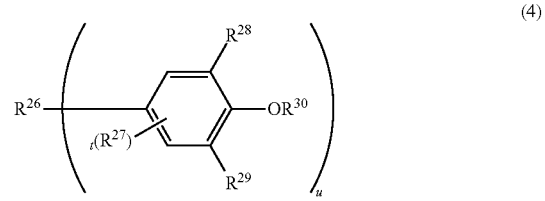

In general formula (4) above, $R^{26}$ represents a bivalent to tetravalent linking group. $R^{27}$ represents Cl, Br, I, F, a monovalent hydrocarbon group having 1 to 20 carbon atoms, a group having such a structure that —$CH_2$— in a monovalent hydrocarbon group having 1 to 20 carbon atoms is substituted by —CO—, —COO—, —NH—, —NHCO—, —O—, —S—, —$SO_2$—, —Si— or —$Si(CH_3)_2$—, or a group having such a structure that a hydrogen atom in a monovalent hydrocarbon group having 1 to 20 carbon atoms is substituted by a fluoroalkyl group, a hydroxyl group, an alkoxyl group, a nitro group, a cyano group, a fluorine atom, a chlorine atom or —$COOR^{31}$. $R^{31}$ represents a hydrogen atom or an alkyl group having 1 to 20 carbon atoms. $R^{28}$ and $R^{29}$ independently represent $CH_2OR^{32}$ that is a thermally crosslinkable group. $R^{32}$ represents a hydrogen atom or a monovalent hydrocarbon group having 1 to 6 carbon atoms. $R^{32}$ represents a hydrogen atom, a methyl group or an ethyl group. $R^{32}$ is preferably a monovalent hydrocarbon group having 1 to 4 carbon atoms, because proper reactivity can still remain and excellent storage stability can be achieved. In a photosensitive resin composition containing a photoacid generator and the like, $R^{32}$ is more preferably a methyl group or an ethyl group. t represents an integer of 0 to 2, and u represents an integer of 2 to 4. The multiple $R^{27}$'s, $R^{28}$'s, $R^{29}$'s and $R^{30}$'s may be the same as or different from one another. Specific examples of the linking group $R^{26}$ are as follows.

[Chemical Formula 8]

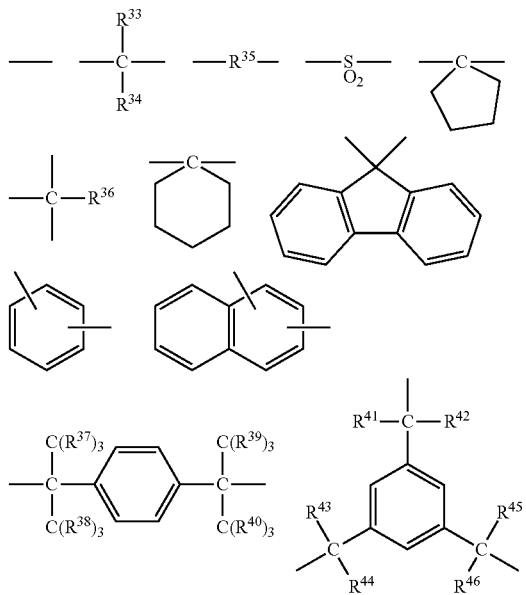

-continued

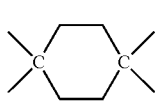 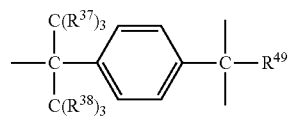

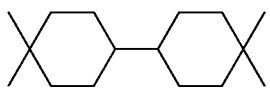 

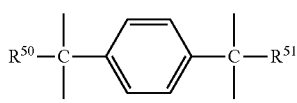

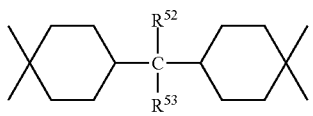

In the formula, $R^{33}$ to $R^{53}$ independently represent a hydrogen atom, Cl, Br, I, F, a monovalent hydrocarbon group having 1 to 20 carbon atoms, a group having such a structure that —$CH_2$— in a monovalent hydrocarbon group having 1 to 20 carbon atoms is substituted by —CO—, —COO—, —NH—, —NHCO—, —O—, —S—, —$SO_2$—, —Si— or —$Si(CH_3)_2$—, or a group having such a structure that a hydrogen atom in a monovalent hydrocarbon group having 1 to 20 carbon atoms is substituted by a fluoroalkyl group, a hydroxyl group, an alkoxyl group, a nitro group, a cyano group, a fluorine atom, a chlorine atom, or —$COOR^{54}$. $R^{54}$ represents a hydrogen atom or an alkyl group having 1 to 20 carbon atoms.

$$—N(CH_2OR^{55})_v(H)_w \quad (5)$$

In general formula (5), $R^{55}$ represents a hydrogen atom or a monovalent hydrocarbon group having 1 to 6 carbon atoms. v represents 1 or 2, and w represents 0 or 1, wherein v+w is 1 or 2.

The purity of the compound having a structure represented by general formula (4) is preferably 75% or more, more preferably 85% or more. When the purity is 85% or more, it becomes possible to achieve excellent storage stability, to perform the crosslinking reaction of the resin composition satisfactorily to achieve excellent coloring properties after curing, and to further decrease the transmittance of the heat-resistant resin film to light having a wavelength within a visible light range. In addition, it also becomes possible to reduce the number of unreacted groups that act as water-absorbable groups, resulting in the decrease in water absorbability of the resin composition. As the method for producing a high-purity thermal crosslinking agent, methods such as recrystallization and distillation can be mentioned. The purity of the thermal crosslinking agent can be determined by a liquid chromatography method.

Preferred examples of the compound having a structure represented by general formula (4) are as follows.

[Chemical formula 9]

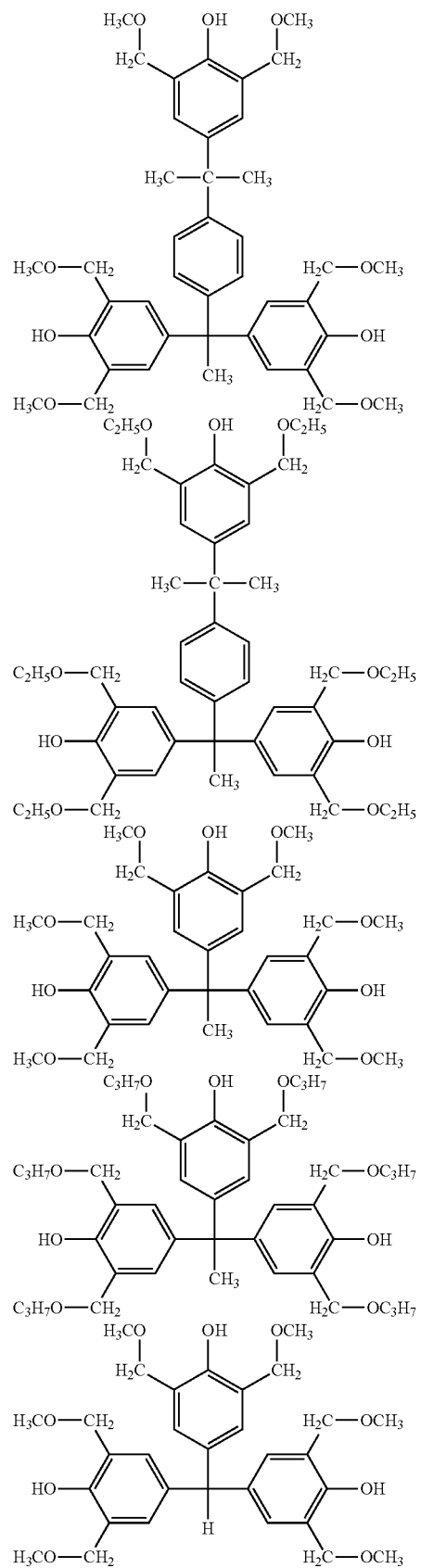

-continued

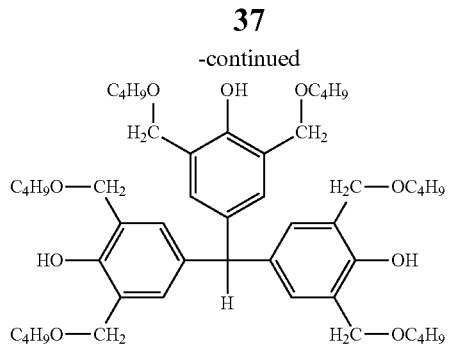

[Chemical formula 10]

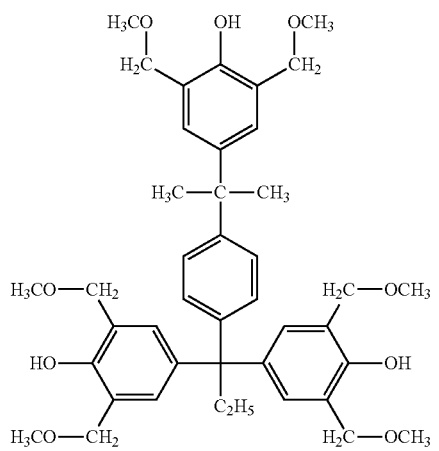

Preferred examples of the thermal crosslinking agent having a structure represented by general formula (5) are as follows.

[Chemical formula 11]

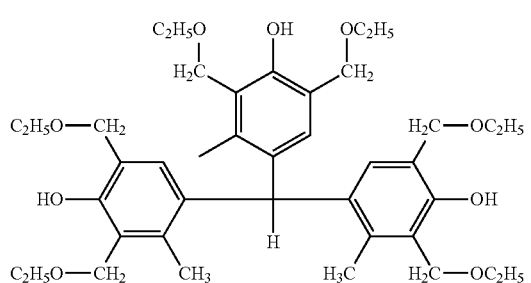

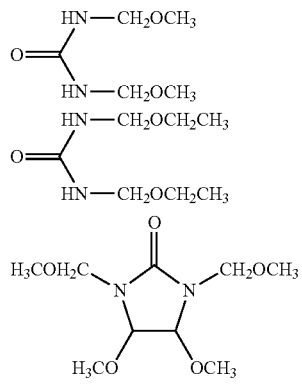

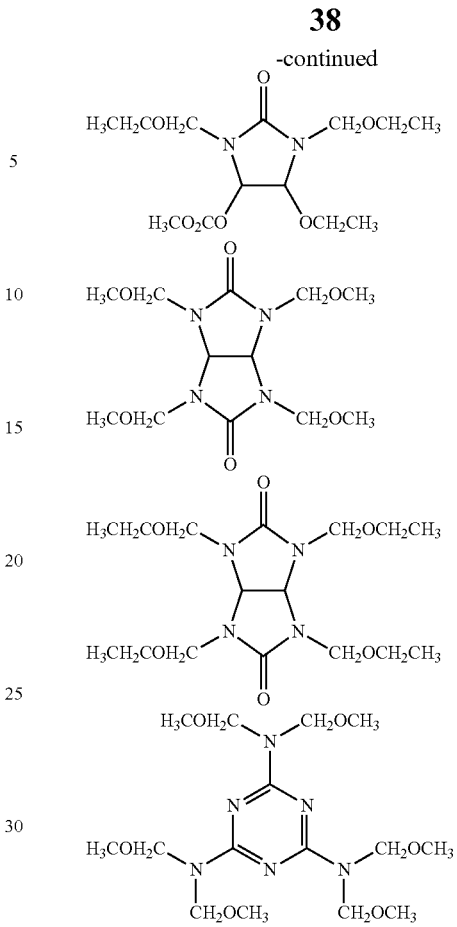

In the present invention, an epoxy compound is also preferred as the component (F). Examples of the epoxy compound include, but are not limited to, TEPIC (registered trademark) S, TEPIC (registered trademark) G, and TEPIC (registered trademark) P (trade names, manufactured by NISSAN CHEMICAL INDUSTRIES, LTD.), DENACOL (registered trademark) EX-321L (trade name, manufactured by Nagase ChemteX Corporation), VG3101L (trade name, manufactured by Printec Co.), EPPN 502H and NC3000 (trade names, manufactured by Nippon Kayaku Co., Ltd.), and EPICLON (registered trademark) N695 and HP-7200 (trade names, manufactured by DIC CORPORATION).

In the present invention, these components (F) may be used singly, or two or more of them may be used in combination.

The content of the component (F) is preferably 5 parts by weight or more, more preferably 10 parts by weight or more, and is preferably 120 parts by weight or less, more preferably 100 parts by weight or less, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content is 5 to 120 parts by weight inclusive, the strength of the heat-resistant resin film is increased and the storage stability of the resin composition becomes excellent.

The resin composition according to the present invention may additionally contain (G) a compound having a phenolic hydroxyl group. Because the compound can compensate alkali developability, it becomes possible to impart positive-working photosensitivity.

Examples of the compound having a phenolic hydroxyl group include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DMLPFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (trade names, manufactured by ASAHI YUKIZAI CORPORATION), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, and BisP-AP (trade name, manufactured by Honshu Chemical Industry Co., Ltd.).

In the present invention, the content of the component (G) is preferably 3 to 50 parts by weight inclusive relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom.

The resin composition according to the present invention may additionally contain (H) a thermal acid generator. The thermal acid generator can generate an acid upon a heat treatment after development as mentioned below to accelerate the crosslinking reaction between (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom and the component (F) (i.e., the thermal crosslinking agent), and also accelerate the cyclization of an imide ring or an oxazole ring in (A1) the polyimide precursor or the polybenzoxazole precursor. As a result, the chemical resistance of the heat-resistant resin film can be improved and the thinning of the film can be prevented. The acid generated from the thermal acid generator is preferably a strong acid, and is preferably, for example, an arylsulfonic acid such as p-toluenesulfonic acid and benzene sulfonic acid, and an alkylsulfonic acid such as methanesulfonic acid, ethanesulfonic acid and butanesulfonic acid. In the present invention, the thermal acid generator is preferably any one of aliphatic sulfonic acid compounds each represented by general formula (6) or (7). Two or more of these compounds may be contained.

[Chemical formula 12]

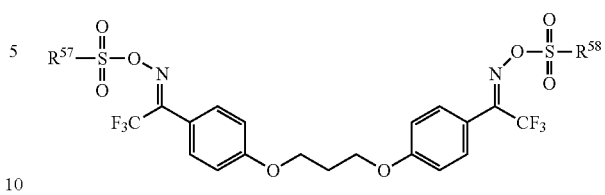

(6)

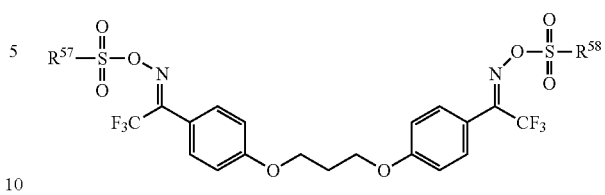

(7)

In general formulae (6) and (7), $R^{56}$ to $R^{58}$ independently represent an alkyl group having 1 to 10 carbon atoms or a monovalent aromatic group having 7 to 12 carbon atoms. In the alkyl group and the aromatic group, at least one hydrogen atom may be substituted. Specific examples of the substituent include an alkyl group and a carbonyl group.

Specific examples of the compound represented by general formula (6) are as follows.

[Chemical formula 13]

Specific examples of the compound represented by general formula (7) are as follows.

[Chemical formula 14]

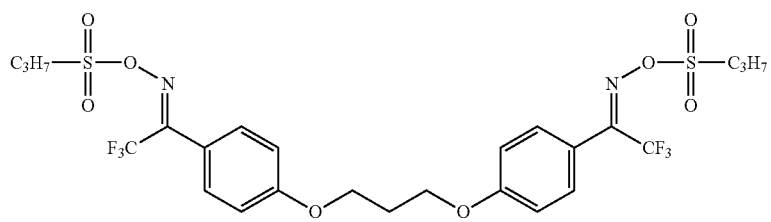

The content of the thermal acid generator (H) is preferably 0.1 part by weight or more, more preferably 0.3 part by weight or more, still more preferably 0.5 part by weight or more, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, from the viewpoint of further accelerating the crosslinking reaction. On the other hand, the content is preferably 20 parts by weight or less, more preferably 15 parts by weight or less, still more preferably 10 parts by weight or less, from the viewpoint of the electrical insulation properties of the heat-resistant resin film.

The resin composition according to the present invention may also contain an adhesion-improving agent. Examples of the adhesion-improving agent include silane coupling agents such as vinyl trimethoxysilane, vinyl triethoxysilane, epoxy cyclohexyl ethyl trimethoxysilane, 3-glycidoxy propyl trimethoxysilane, 3-glycidoxy propyl triethoxysilane, p-styryl trimethoxysilane, 3-aminopropyl trimethoxysilane, 3-aminopropyl triethoxysilane, and N-phenyl-3-aminopropyl trimethoxysilane, titanium chelate agents, aluminum chelate agents, and compounds obtained by reacting a aromatic amine compound with an alkoxy group-containing silicon compound. Two or more of these adhesion-improving agents may be contained. When the adhesion-improving agent is contained, it becomes possible to enhance the close adhesion to an underlying base material, e.g., a silicon wafer, ITO, $SiO_2$ and nitride silicon, during the development of a photosensitive resin film. It becomes also possible to enhance the resistance to oxygen plasma, which is used for washing purposes or the like, or an UV ozone treatment. The content of the adhesion-improving agent is preferably 0.1 to 10 parts by weight relative to 100 parts by weight of (a1) the polyimide, the polybenzoxazole, the polyimide precursor or the polybenzoxazole precursor or (A2) the resin having such a backbone structure that two cyclic structures are bonded to a cyclic-structure-constituting quaternary carbon atom.

The resin composition according to the present invention may also contain a bonding-improving agent. Specific examples of the bonding-improving agent include an alkoxysilane-containing aromatic amine compound, an aromatic amide compound, and a silane compound containing no aromatic moiety. Two or more of these bonding-improving agents may be contained. When the compound is contained, it becomes possible to improve the bonding to a base material after burning or curing. Specific examples of the alkoxysilane-containing aromatic amine compound and the aromatic amide compound are shown below. In addition to these compounds, a compound produced by reacting an aromatic amine compound with an alkoxy-group-containing silicon compound may also be used. A specific example of the compound is a compound produced by reacting an aromatic amine compound with an alkoxysilane compound having a group capable of reacting with an amino group such as an epoxy group or a chloromethyl group.

[Chemical Formula 15]

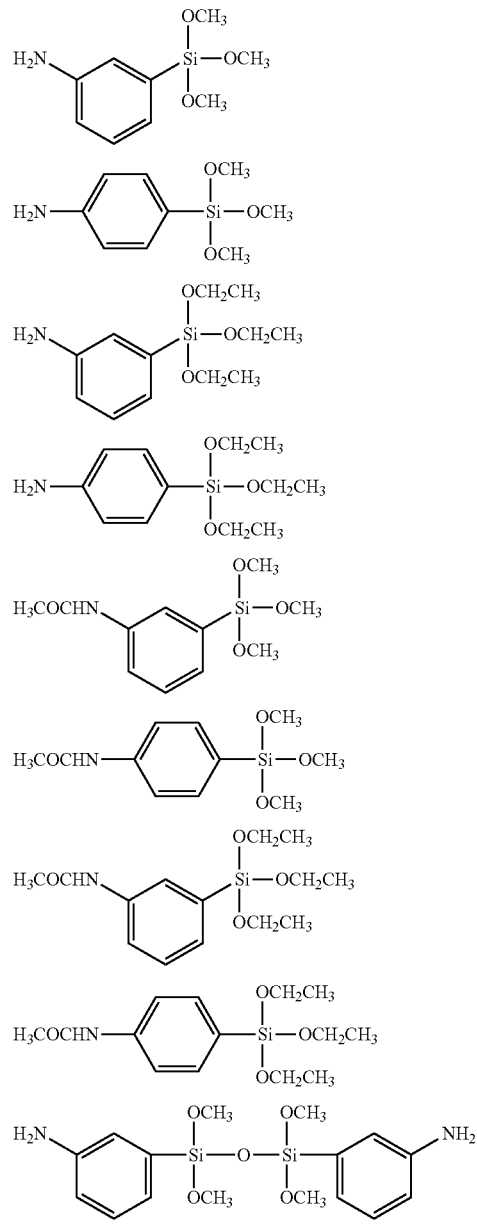

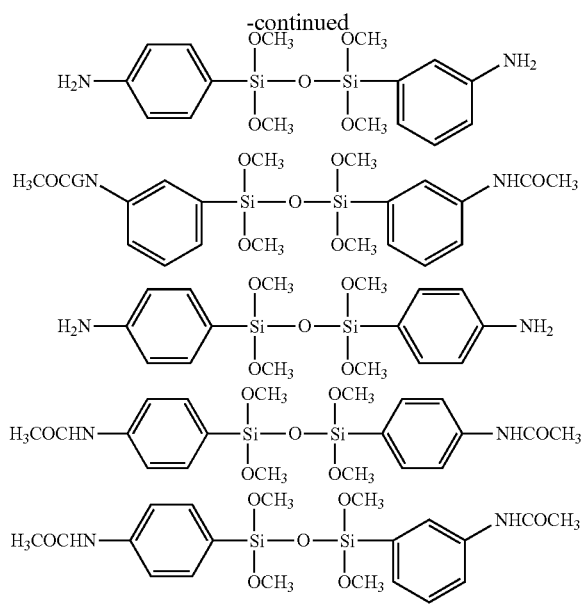

Examples of the silane compound containing no aromatic moiety include vinyl silane compounds such as vinyl trimethoxysilane, vinyl triethoxysilane, vinyl trichlorosilane, and vinyl tris(β-methoxyethoxy)silane, and carbon-carbon unsaturated bond-containing silane compounds such as 3-methacryloxy propyl trimethoxysilane, 3-acryloxy propyl trimethoxysilane, p-styryl trimethoxysilane, 3-methacryloxy propyl methyl dimethoxysilane, and 3-methacryloxy propyl methyl diethoxysilane. Among these compounds, vinyltrimethoxysilane and vinyltriethoxysilane are preferred.

The content of the bonding-improving agent is preferably 0.01 to 15 parts by weight relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom.

A compound which can act as both of an adhesion-improving agent and a bonding-improving agent, such as vinyltrimethoxysilane and vinyltriethoxysilane, may also be contained.

The resin composition according to the present invention may contain a surfactant to improve the wettability with a substrate.

Specific examples of the surfactant include: a fluorine-containing surfactant, such as Florad (a product name, manufactured by Sumitomo 3M Inc.), Megaface (a product name, manufactured by DIC Corporation) and Surflon (a product name, manufactured by Asahi Glass Co., Ltd.); an organic siloxane surfactant, such as KP341 (a product name, manufactured by Shin-Etsu Chemical Co., Ltd.), DBE (a product name, manufactured by Chisso Corporation), Glanol (a product name, manufactured by Kyoeisha Chemical Co., Ltd.) and BYK (manufactured by BYK-Chemie); and an acrylic polymer surfactant, such as Polyflow (a product name, manufactured by Kyoeisha Chemical Co., Ltd.).

Next, the method for producing the resin composition according to the present invention will be described. The resin composition can be produced by, for example, dissolving the components (A), (B) and (D), the component (C), and optionally the components (E) to (H), the adhesion-improving agent, the bonding-improving agent, the surfactant and the like. Examples of the method for the dissolution include stirring and heating. When heating is employed, it is preferred to adjust the heating temperature to a temperature falling within a range at which the performance of the resin composition cannot be deteriorated, and the heating temperature is generally room temperature to 80° C. The order of dissolution of the components is not particularly limited. For example, a method can be mentioned, in which the compounds are dissolved in order of increasing solubility. With respect to a component that is likely to generate bubbles during stirring or dissolution, such as surfactants and some types of adhesion-improving agents, the component can be added finally after all of the other components are dissolved, thereby preventing the insufficient dissolution of the other components due to the generation of the bubbles.

It is preferred that the resin composition thus produced is filtered through a filtration filter to remove foreign matters and particles. The filter pore size is, for example, 0.5 μm, 0.2 μm, 0.1 μm, 0.05 μm or 0.02 μm, but is not limited thereto. Specific examples of the material for the filtration filter include polypropylene (PP), polyethylene (PE), nylon (NY) and polytetrafluoroethylene (PTFE), and polyethylene and nylon are preferred. In the case where an organic pigment is contained in the resin composition, it is preferred to use a filtration filter having a larger pore size than the particle diameters of the organic pigment.

Next, the method for producing the heat-resistant resin film using the resin composition according to the present invention will be described. The resin composition according to the present invention is applied by a spin coating method, a slit coating method, a dip coating method, a spray coating method, a printing method or the like to produce a coating film of the resin composition. From the viewpoint of the application onto a large-size substrate, the improvement in productivity and the like, the application of the resin composition is preferably carried out by slit coating. Prior to the application, a base material onto which the resin composition is to be applied may be pre-treated with the above-mentioned adhesion-improving agent. For example, a method can be mentioned, in which the surface of the base material is treated by, for example, spin coating, slit die coating, bar coating, dip coating, spray coating or a treatment with steam using a solution prepared by dissolving the adhesion-improving agent in a solvent, such as isopropanol, ethanol, methanol, water, tetrahydrofuran, propylene glycol monomethyl ether acetate, propylene glycol monomethyl ether, ethyl lactate and diethyl adipate, at a concentration of 0.5 to 20% by weight. If necessary, it is possible to carryout a drying treatment under reduced pressure and then carry out a heat treatment at 50 to 300° C. to allow the reaction of the base material with the adhesion-improving agent to proceed the reaction between the base material and the adhesion-improving agent.

Subsequently, the coating film of the resin composition is dried to produce a photosensitive resin film. It is preferred to carry out the drying at 50 to 150° C. for 1 minute to several hours with an oven, a hot plate, infrared ray or the like.

Subsequently, an actinic ray is emitted over the photosensitive resin film through a mask having a desired pattern. Examples of the actinic ray to be used for the exposure include ultraviolet ray, visible ray, electron beam and X-ray. In the present invention, it is preferred to use i line (365 nm), h line (405 nm) or g line (436 nm) of a mercury lamp.

Subsequently, the photosensitive resin film exposed to light is developed to remove the exposed range. The developer is preferably an aqueous solution of an alkaline compound such as tetramethyl ammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In some cases, one or more of polar solvents such as N-methyl-2-pyrrolidone, N,N-dimethylformamide, N,N-dimethylacetamide, dimethylsulfoxide, γ-butyrolactone, and dimethylacrylamide, alcohols such as methanol, ethanol, and isopropanol, esters such as ethyl lactate and propylene glycol monomethyl ether acetate, and ketones such as cyclopentanone, cyclohexanone, isobutyl ketone and methyl isobutyl ketone may be added to these aqueous alkali solutions. After the development, a rinsing treatment with water is generally carried out. The rinsing treatment may be carried out using a solution prepared by adding an alcohol, e.g., ethanol and isopropyl alcohol, or an ester, e.g., ethyl lactate and propylene glycol monomethyl ether acetate, to water.

The photosensitive resin film thus produced is subjected to a heat treatment to produce a heat-resistant resin film. The term "heat treatment" as used herein refers to a treatment of heating at a temperature falling within the range from 200 to 350° C. For example, a method in which the heat treatment is carried out at 250° C. for 60 minutes can be mentioned.

The heat-resistant resin film produced from the resin composition according to the present invention can be used suitably as an insulating film or a protective film for wiring lines. For example, the heat-resistant resin film can be used as an insulating film or a protective film for wiring lines made from copper, aluminum or the like in a printed substrate produced by forming the wiring lines on a film or substrate made from polyimide, ceramic or the like, or as a protective film for use in partial soldering of the wiring lines. In the case where the resin composition contains an electrically conductive filler, the heat-resistant resin film can also be used as a wiring material.

The heat-resistant resin film produced from the resin composition according to the present invention can also be used suitably as a planarization film in a display device equipped with a substrate having TFTs formed thereon, the planarization film and display elements in this order. Examples of the display device having this configuration include a liquid crystal display device and an organic EL display device. An active-matrix-type display device has such a configuration that: TFTs and wiring lines which are respectively positioned on the side of the TFTs and which are connected to the TFTs are arranged on a glass- or plastic-made substrate; a planarization film is arranged on the wiring lines and the TFTs in such a manner as to cover projections and depressions on the wiring lines and the TFTs; and display elements are arranged on the planarization film. The display elements and the wiring lines are connected to each other through contact holes formed in the planarization film. In The FIGURE, the cross-sectional view of a TFT substrate is illustrated. Bottom-gate-type or top-gate-type TFTs 1 are provided in a matrix shape on a substrate 6, an insulating film 3 is formed in such a manner as to cover the TFTs 1. Wiring lines 2, which are respectively connected to the TFTs 1, are provided on the insulating film 3. A planarization film 4 is also provided on the insulating film 3 in such a manner that the wiring lines 2 are embedded in the planarization film 4. Contact holes 7, which reach the wiring lines 2, are formed in the planarization film 4. ITOs (transparent electrodes) 5 are formed on the planarization film 4 in such a manner that the ITOs 5 are connected to the wiring lines 2 respectively through the contact holes 7. The ITOs 5 serve as electrodes for display elements (e.g., organic EL elements). The organic EL elements may be of a top-emission-type which can emit luminescent light from a side opposed to the substrate 6 or a bottom-emission-type from which light can be extracted from the substrate 6 side, and is preferably of a top-emission-type. In this manner, an active-matrix-type organic EL display device, in which TFTs 1 for driving organic EL elements are connected to the organic EL elements, is produced.

In the case of an organic EL display device using TFTs in each of which a semiconductor layer is made from amorphous silicon, microcrystal silicon, a metal oxide (e.g., IGZO) or the like, there may be cases where an undesirable phenomenon, such as the deterioration or malfunctions of the device, the development of a leakage current in the device or the like, is caused as the result of the penetration of light having a relatively high energy, e.g., ultraviolet light or visible light in a short wavelength range. The heat-resistant resin film produced from the resin composition according to the present invention has an absorption at a wavelength of 300 to 460 nm. Therefore, in the organic EL display device equipped with the heat-resistant resin film, the deterioration or malfunctions of the device, the development of a leakage current in the device or the like can be prevented and stable driving/luminous properties can be achieved in the device.

An organic EL display device using TFTs in each of which a semiconductor layer is made from a metal oxide is particularly preferably a high-resolution device. The degree of resolution is preferably 100 ppi or more, more preferably 200 ppi or more. When the heat-resistant resin film produced from the resin composition according to the present invention is used in the high-resolution organic EL device, it becomes possible to more efficiently prevent the occurrence of an undesirable phenomenon, such as the deterioration or malfunctions of the device or the development of a leakage current in the device which can be caused by the penetration of light.

In addition, the heat-resistant resin film produced from the resin composition according to the present invention can be used suitably as: a surface protective film or an interlayer insulating film for semiconductor devices including LSIs; a bonding agent or an underfilling agent to be used in the packaging of devices; a capping agent for preventing the migration of copper; a planarization film for on-chip microlenses for solid-state imaging elements and various types of displays and solid-state imaging elements; and others.

Next, the second aspect of the present invention will be described in detail.

The present invention provides a resin composition which is configured such that, when the resin composition is formed into a resin composition film that has a thickness of 3.0 μm after a heat treatment at a temperature within the range from 200 to 350° C., the resin composition film forms a heat-resistant resin film having a light transmittance of 50% or more at a wavelength of 365 to 436 nm before a heat treatment and having a light transmittance of 10% or less at a wavelength of 365 to 436 nm after the heat treatment. The term "resin composition which enables the formation of a heat-resistant resin film that has a light transmittance of 10% or less at a wavelength of 365 to 436 nm after the heat treatment" refers to a resin composition which enables the formation of a heat-resistant resin film that has a light transmittance of 10% or less at a wavelength of 365 to 436 nm when the heat-resistant resin film is subjected to a heat treatment at a temperature of 200 to 350° C. An organic EL display or the like equipped with the heat-resistant resin film does not undergo deterioration or malfunctions, the development of a leakage current therein or the like which can be caused by the penetration of light into TFTs for driving the device. Therefore, the resin composition has an effect of improving the reliability of an organic EL display. When the heat-resistant resin film does not have a thickness of 3.0 μm after a heat treatment, the light transmittance of the heat-resistant resin film can be determined by converting the thickness of the heat-resistant resin film to 3.0 μm in accordance with the Lambert's law.

The resin composition according to the present invention contains a compound which does not have an absorption maximum at a wavelength of 340 nm or more and less than 436 nm and has an absorption maximum at a wavelength of 436 to 750 nm inclusive. This is preferred, because the resin composition can absorb visible light in the whole wavelength range and therefore a contrast-improving effect can also be imparted to the resin composition.

It is also preferred that the resin composition according to the present invention contains a photo-acid generator and therefore has positive-working photosensitivity.

The resin composition according to present invention is a resin composition which contains (A) an alkali-soluble resin, (I) a compound whose maximum absorption wavelength shifts by a heat treatment, (C) a photo-acid generator, and (D) a solvent, and has positive-working photosensitivity.

The resin composition according to the present invention contains (A) an alkali-soluble resin. The term "alkali-soluble" as used herein refers to a state that, when a solution prepared by dissolving the resin in γ-butyrolactone is applied onto a silicon wafer and is then pre-baked at 120° C. for 4 minutes to form a prebaked film having a film thickness of 10 μm±0.5 μm, then the prebaked film is immersed in a 2.38-wt % aqueous tetramethylammonium hydroxide solution at 23±1° C. for 1 minute, and then the resultant film is rinsed with purified water, the dissolution rate that is determined from the amount of decrease in the film thickness is 50 nm/min. or more.

Examples of the alkali-soluble resin (A) include, but not limited to, a polyimide, a polyimide precursor, a polybenzoxazole, a polybenzoxazole precursor, a polyaminoamide, a polyamide, a polymer produced from a radically polymerizable monomer having an alkali-soluble group, a resin having such a backbone structure that two cyclic structures are bonded to a cyclic-structure-constituting quaternary carbon atom, a phenolic resin and/or a polyhydroxystyrene resin, a cyclic olefin polymer, and a polysiloxane. Two or more of these resins may be contained. Among these alkali-soluble resins, those resins which have excellent heat resistance and generate an outgas in a reduced volume under high-temperature conditions are preferred. Specifically, at least one alkali-soluble resin selected from a polyimide, a polyimide precursor and a polybenzoxazole precursor or a copolymer of the at least one alkali-soluble resin is preferred.

The resin composition according to the present invention contains (A1) a polyimide, a polybenzoxazole, a polyimide precursor or a polybenzoxazole precursor.

These resins produce a small degassing amount under a high temperature of 200° C. or higher after a heat treatment, have excellent heat resistance, and can exhibit excellent properties for use as a planarization film or an insulating layer used in organic light emitting devices and display elements or for the formation of a partition wall in the devices.

With respect to the component (A1) to be used in the present invention, the polyimide is not particularly limited as long as it has an imide ring, and the polybenzoxazole is not particularly limited as long as it has a benzoxazole ring. The polyimide precursor is not particularly limited as long as it has a structure that can be dehydrated and ring-closed to produce a polyimide having an imide ring. The polybenzoxazole precursor is not particularly limited as long as it has a structure that can be dehydrated and ring-closed to produce a polybenzoxazole having a benzoxazole ring. In the present invention, the component (A1) is more preferably a polyimide precursor or a polybenzoxazole precursor, and more preferably contains a structural unit represented by general formula (1) as the main component.

[Chemical formula 1]

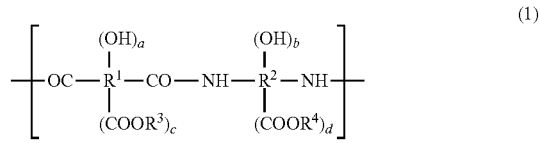

In general formula (1), $R^1$ and $R^2$ may be the same as or different from each other, and independently represent a bivalent to octavalent organic group having 2 or more carbon atoms. The bivalent to octavalent organic group having 2 or more carbon atoms may be a group in which —$CH_2$— is substituted by —CO—, —COO—, —NH—, —NHCO—, —O—, —S—, —$SO_2$—, —Si— or —Si$(CH_3)_2$—, or may be a group in which a hydrogen atom contained therein is substituted by a fluoroalkyl group, a hydroxyl group, an alkoxyl group, a nitro group, a cyano group, a fluorine atom, a chlorine atom or —$COOR^{1'}$. $R^{1'}$ represents a hydrogen atom or an alkyl group having 1 to 20 carbon atoms. $R^3$ and $R^4$ may be the same as or different from each other, and independently represent a hydrogen atom or an alkyl group having 1 to 20 carbon atoms. a and b independently represent an integer of 0 to 4, and c and d independently represent an integer of 0 to 2. Provided that a+b>0.

The above-shown general formula (1) represents a polyimide precursor or a polybenzoxazole precursor each having a hydroxyl group, which has superior solubility in an aqueous alkaline solution due to the presence of the hydroxyl group, compared with a polyimide precursor or a polybenzoxazole precursor each having no hydroxyl group.

Each of the polyimide precursor and the polybenzoxazole precursor is a resin having an amide bond in the main chain thereof, and is generally composed of an amine component and an acid component. Each of the polyimide precursor and the polybenzoxazole precursor can be dehydrated and ring-closed by a heat treatment or a chemical treatment to produce the above-mentioned polyimide or polybenzoxazole. The number of repeats of the structural unit in the present invention is preferably 10 to 100000. Specific examples of the polyimide precursor include a polyamic acid ester and a polyisoimide, and a polyamic acid ester is preferred. Specific examples of the polybenzoxazole precursor include a polyhydroxyamide, a polyaminoamide, a polyamide and a polyamideimide, and a polyhydroxyamide is preferred. In each of the polyimide precursor and the polybenzoxazole precursor, it is preferred that an acid residue or an amine residue has an acidic group or an acidic group derivative such as $OR^5$, $SO_3R^5$, $CONR^5R^6$, $COOR^5$ and $SO_2NR^5R^6$, more preferably a hydroxyl group, from the viewpoint of the solubility in an aqueous alkaline solution. $R^5$ and $R^6$ independently represent a hydrogen atom, a hydrocarbon group having 1 to 20 carbon atoms or a group having such a structure that a hydrogen atom in a hydrocarbon group having 1 to 20 carbon atoms is substituted by another type of atom. The term "acidic group" refers to a case where all of $R^5$'s or $R^6$'s are hydrogen atoms, and the term "acidic group derivative" refers to a case where a hydrocarbon group having 1 to 20 carbon atoms or a group having such a structure that a hydrogen atom in a hydrocarbon group having 1 to 20 carbon atoms is substituted by another type of atom is contained in $R^5$ or $R^6$.

In the present invention, preferred examples of the structure of an acid component to be used in the production of the polyimide precursor and the polybenzoxazole precursor are shown below. Structures in each of which 1 to 4 hydrogen atoms is substituted by an alkyl group having 1 to 20 carbon atoms, a fluoroalkyl group, an alkoxyl group, an ester group, a nitro group, a cyano group, a fluorine atom or a chlorine atom can also be included in the preferred examples.

[Chemical formula 2]

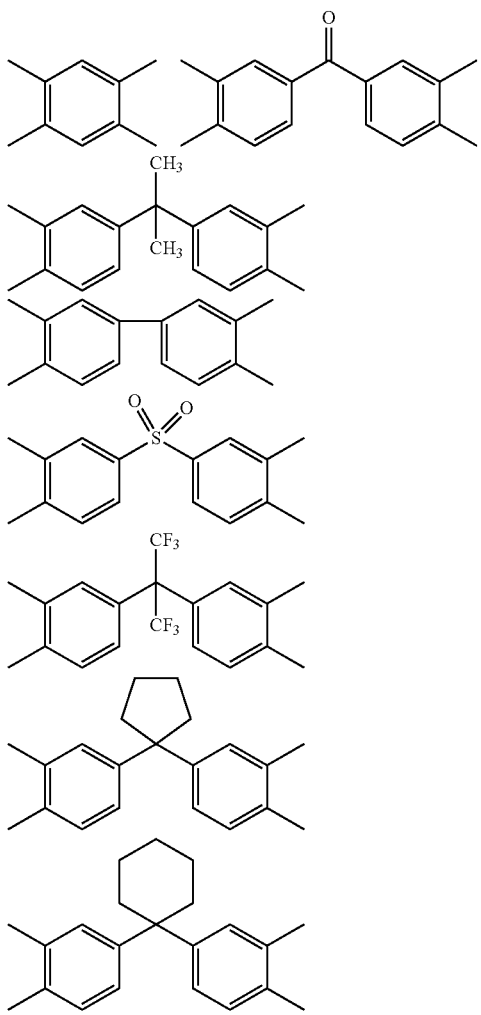

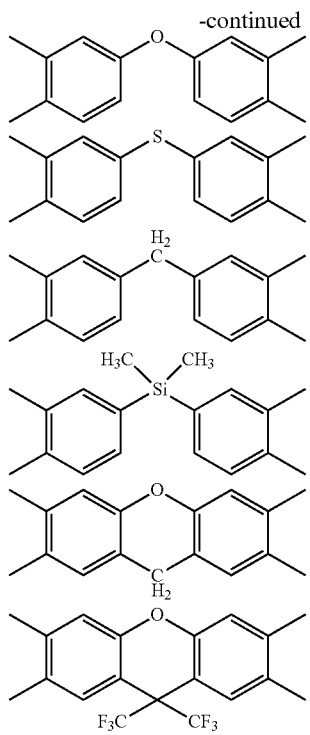

[Chemical formula 3]

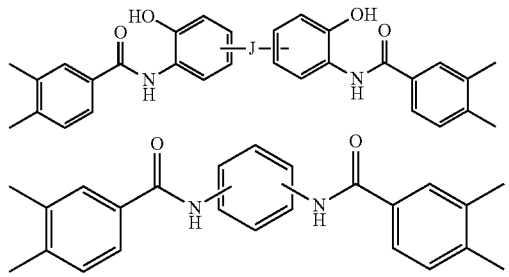

In the formulas, J represents a direct bond, —COO—, —CONH—, —CH$_2$—, —C$_2$H$_4$—, —O—, —C$_3$H$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—.

Examples of the acid component to be used in the production of the polyimide precursor and the polybenzoxazole precursor include a dicarboxylic acid, a tricarboxylic acid and a tetracarboxylic acid.

Preferred examples of the dicarboxylic acid include terephthalic acid, isophthalic acid, diphenyl ether dicarboxylic acid, bis(carboxyphenyl)hexafluoropropane, biphenyldicarboxylic acid, benzophenone dicarboxylic acid and triphenyldicarboxylic acid.

Specific examples of the tricarboxylic acid include trimellitic acid, trimesic acid, diphenyl ether tricarboxylic acid and biphenyltricarboxylic acid.

Examples of the tetracarboxylic acid may include aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)

ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, and aliphatic tetracarboxylic acids such as butanetetracarboxylic acid and 1,2,3,4-cyclopentanetetracarboxylic acid.

It is more preferred to use an acid produced by substituting each of the above-exemplified dicarboxylic acids, tricarboxylic acids and tetracarboxylic acids by 1 to 4 acidic groups or acidic group derivatives (e.g., $OR^5$ groups, $SO_3R^5$ groups, $CONR^5R^6$ groups, $COOR^5$ groups and $SO_2NR^5R^6$ groups), preferably 1 to 4 hydroxyl groups or sulfonic acid groups, sulfonic acid amide groups, sulfonic acid ester groups or the like. $R^5$ and $R^6$ independently represent a hydrogen atom or a monovalent hydrocarbon group having 1 to 20 carbon atoms.

Each of these acids may be used without any modification or with modification into an acid anhydride or an active ester. These acids may be used singly, or two or more of them may be used in combination.

A silicon-atom-containing tetracarboxylic acid, such as dimethylsilanediphthalic acid and 1,3-bis(phthalic acid)tetramethyldisiloxane, can also be used to improve the bonding to a substrate and the resistance to oxygen plasma to be used in washing or the like or a UV ozone treatment. It is preferred that the silicon-atom-containing tetracarboxylic acid is used in an amount of 0 to 30 mol % relative to the total amount of the acid components.

In the present invention, examples of the preferred structure of the amine component to be used in the production of the polyimide precursor or the polybenzoxazole precursor are shown below. In addition, variants of the structures, in each of which 1 to 4 hydrogen atoms are independently substituted by an alkyl group having 1 to 20 carbon atoms, a fluoroalkyl group, an alkoxyl group, an ester group, a nitro group, a cyano group, a fluorine atom or a chlorine atom are also preferred.

[Chemical formula 4]

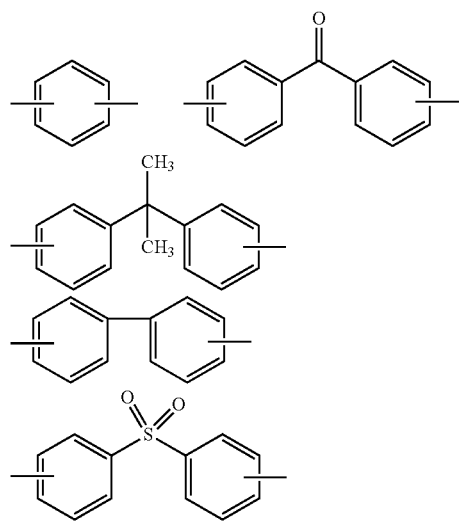

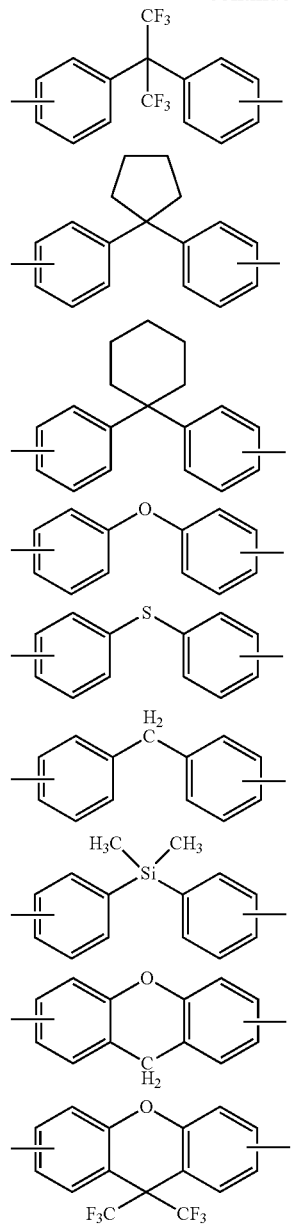

[Chemical formula 5]

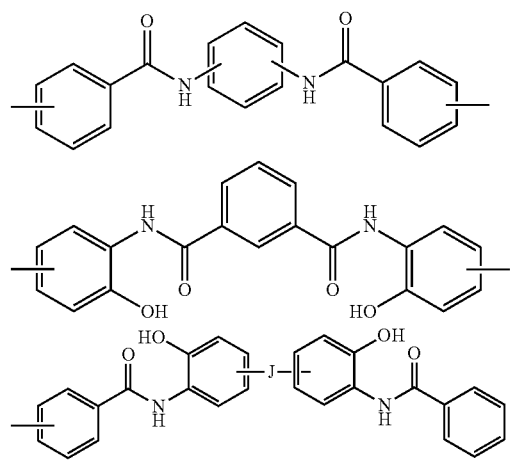

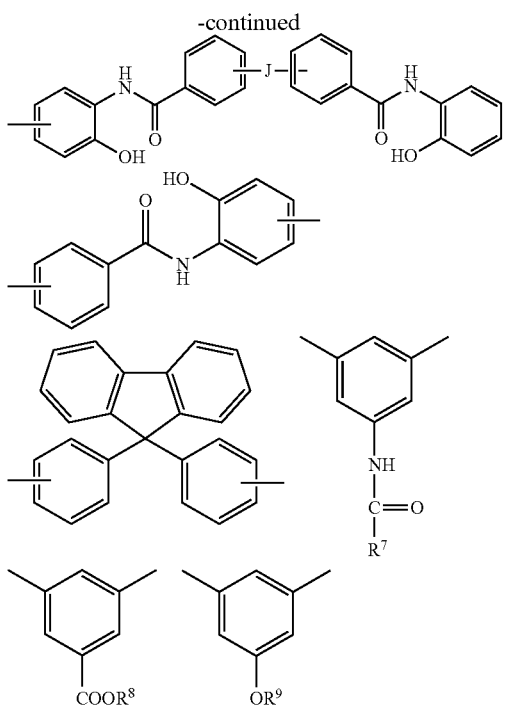

In the formulas, J represents a direct bond, —CO—, —COO—, —CONH—, —CH$_2$—, —C$_2$H$_4$—, —O—, —C$_3$H$_6$—, —C$_3$F$_6$—, —C$_{13}$H$_8$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—. R$^7$ to R$^9$ independently represent a hydrogen atom or a monovalent hydrocarbon group having 1 to 20 carbon atoms, and are preferably monovalent alkyl groups each having 1 to 20 carbon atoms.

As the amine component to be used in the production of the polyimide precursor and the polybenzoxazole precursor, a diamine can be used.

Preferred examples of the diamine may include hydroxyl group-containing diamines such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene, carboxyl group-containing diamines such as 3,5-diaminobenzoic acid and 3-carboxy-4,4'-diaminodiphenyl ether, sulfonic acid-containing diamines such as 3-sulfonic acid-4,4-diaminodiphenyl ether, dithiohydroxyphenylenediamine, 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or compounds each resulting from replacing some hydrogen atoms of the aromatic ring of each of the foregoing by an alkyl group or a halogen atom, and aliphatic diamines such as cyclohexyldiamine and methylenebiscyclohexylamine. Each of these diamines may be substituted by an alkyl group having 1 to 10 carbon atoms (e.g., a methyl group, an ethyl group), a fluoroalkyl group having 1 to 10 carbon atoms (e.g., a trifluoromethyl group), or a group such as F, Cl, Br and I. Each of the above-exemplified diamines preferably has an acidic group or an acidic group derivative (e.g., OR$^5$, SO$_3$R$^5$, CONR$^5$R$^6$, COOR$^5$, SO$_2$NR$^5$R$^6$), and more preferably has a hydroxyl group. R$^5$ and R$^6$ independently represent a hydrogen atom or a monovalent hydrocarbon group having 1 to 20 carbon atoms.

These diamines may be used without any modification, or diisocyanate compounds and trimethylsilylated diamines corresponding to the diamines may be used, and two or more of them may be used in combination. In applications in which heat resistance is required, it is preferred to use an aromatic diamine in an amount of 50 mol % or more relative to the total amount of the diamine components.

As the diamine component, a silicon-atom-containing diamine, such as 1,3-bis(3-aminopropyl)tetramethyldisiloxane and 1,3-bis(4-anilino)tetramethyldisiloxane, can also be used to improve the bonding to a substrate and the resistance to oxygen plasma to be used in washing or the like or a UV ozone treatment. It is preferred that the silicon-atom-containing diamine is used in an amount of 1 to 30 mol % relative to the total amount of the diamine components.

In the present invention, it is preferred to cap a terminal of the polyimide precursor or the polybenzoxazole precursor by a monoamine, an acid anhydride, an acid chloride or a monocarboxylic acid each having a hydroxyl group, a carboxyl group, a sulfonic acid group or a thiol group. Two or more of these capping substances may be used in combination. When the resin has the above-mentioned group at a terminal thereof, it becomes possible to easily adjust the dissolution rate of the resin in an aqueous alkaline solution to a value within a desirable range.

Examples of the monoamine include aniline, naphthylamine, and aminopyridine, compounds having a phenolic hydroxyl group, such as 3-amino-4,6-dihydroxypyrimidine, 2-aminophenol, 3-aminophenol, 4-aminophenol, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, and 1-amino-2-hydroxynaphthalene, compounds having a carboxyl group, such as 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-O-toluic acid, ammelide, 2-aminobenzoic acid, 3-aminobenzoic acid, 4-aminobenzoic acid, 2-aminobenzenesulfonic acid, 3-aminobenzenesulfonic acid, and 4-aminobenzenesulfonic acid, and compounds having a thiol group, such as 5-amino-8-mercaptoquinoline, 4-amino-8-mercaptoquinoline, 1-mercapto-8-aminonaphthalene, 1-mercapto-7-aminonaphthalene, 1-mercapto-6-amino-naphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, and 4-aminothiophenol.

Among them, preferred examples of the monoamine may include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. These monoamines may be used singly, or two or more of them may be used in combination.

Examples of the acid anhydride, the acid chloride, and the monocarboxylic acid include acid anhydrides such as phthalic anhydride, maleic anhydride, nadic anhydride, cyclohexanedicarboxylic anhydride, and 3-hydroxyphthalic anhydride, monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, and 4-carboxybenzenesulfonic acid, and monoacid chloride compounds with the carboxyl group of the monocarboxylic acid formed into an acid chloride, monoacid chloride compounds with only one carboxy group of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene formed into an acid chloride, and active ester compounds obtained by reaction of a monoacid chloride compound with N-hydroxybenzotriazole and N-hydroxy-5-norbornene-2,3-dicarboxyimide.

Among them, preferred examples of the acid anhydride, the acid chloride, and the monocarboxylic acid may include acid anhydrides such as phthalic anhydride, maleic anhydride, nadic acid, cyclohexanedicarboxylic anhydride, and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, monoacid chloride compounds with the carboxyl group of the monocarboxylic acid formed into an acid chloride, monoacid chloride compounds with only one carboxy group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene formed into an acid chloride, and active ester compounds obtained by reaction of a monoacid chloride compound with N-hydroxybenzotriazole and N-hydroxy-5-norbornene-2,3-dicarboxyimide. These monoamines may be used singly, or two or more of them may be used in combination.

The content of the terminal-capping agent (e.g., a monoamine, an acid anhydride, an acid chloride, a monocarboxylic acid) is preferably 0.1 to 70 mol %, more preferably 5 to 50 mol %, relative to the number of moles of the acid component monomer or the diamine component monomer to be charged. When the content is adjusted to the above-mentioned value, it becomes possible to produce a resin composition which has a proper solution viscosity during the application of the resin composition and can exert excellent film properties.

The resin may also have a polymerizable functional group at a terminal thereof. Examples of the polymerizable functional group include an ethylenically unsaturated bond group, an acetylene group, a methylol group and an alkoxymethyl group.

The terminal-capping agent introduced into the resin can be detected easily by the following methods. For example, the resin having the terminal-capping agent introduced thereinto is dissolved in an acidic solution to decompose the resin into an amine component and an acid component which are constituent units of the resin, and these components are subjected to a measurement by gas chromatography (GC) or NMR to detect the terminal-capping agent easily. Alternatively, the resin having the terminal-capping agent introduced thereinto may be directly subjected to a measurement by thermal decomposition gas chromatography (PGC) or infrared or $^{13}$C-NMR spectroscopy to detect the terminal-capping agent.

The reaction solvent which can be used preferably in the synthesis of the polyimide, the polybenzoxazole, the polyimide precursor or the polybenzoxazole precursor in the present invention is not particularly limited, as long as the polymer can be synthesized. Specific examples of the reaction solvent include: a polar aprotic solvent, such as N-methyl-2-pyrrolidone, γ-butyrolactone, N,N-dimethylformamide, N,N-dimethylacetamide and dimethyl sulfoxide; a glycol ether, such as tetrahydrofuran, dioxane, propylene glycol monomethyl ether, propylene glycol monoethyl ether, diethylene glycol dimethyl ether, diethylene glycol diethyl ether and diethylene glycol ethyl methyl ether; a ketone, such as acetone, methyl ethyl ketone, diisobutyl ketone and diacetone alcohol; an ester, such as ethyl acetate, butyl acetate, isobutyl acetate, propyl acetate, propylene glycol monomethyl ether acetate, glycol ether acetate and 3-methyl-3-methoxy butyl acetate; an alcohol, such as ethyl lactate, methyl lactate, diacetone alcohol and 3-methyl-3-methoxybutanol; and an aromatic hydrocarbon, such as toluene and xylene. Two or more of these solvents may be contained. The content of the solvent is preferably 100 to 2000 parts by weight relative to the total amount, i.e., 100 parts by weight, of the compound having an amino group and the compound having an acid anhydride group.

The resin composition according to the present invention contains (A2) a resin having such a backbone structure that two cyclic structures are bonded to a cyclic-structure-constituting quaternary carbon atom. The resin having such a backbone structure that two cyclic structures are bonded to a cyclic-structure-constituting quaternary carbon atom is a resin having such a backbone structure that two cyclic structures are bonded to a cyclic-structure-constituting quaternary carbon atom, i.e., a cardo structure. A common cardo structure is a structure in which a benzene ring is bonded to a fluorene ring.

Specific examples of the backbone structure in which two cyclic structures are bonded to a cyclic-structure-constituting quaternary carbon atom include a fluorene backbone, a bisphenolfluorene backbone, a bisaminophenylfluorene backbone, a fluorene backbone having an epoxy group, and a fluorene backbone having an acryl group.

The resin having such a backbone structure that two cyclic structures are bonded to a cyclic-structure-constituting quaternary carbon atom can be produced by polymerizing a backbone having the cardo structure through a reaction between functional groups bonding to the backbones or the like. The resin having such a backbone structure that two cyclic structures are bonded to a cyclic-structure-constituting quaternary carbon atom has a structure in which the main chain is linked to a highly bulky side chain through one element (i.e., a cardo structure), and has a cyclic structure in the direction substantially perpendicular to the main chain.

Specific example of the monomer having a cardo structure include: a cardo-structure-containing bisphenol, such as a bis(glycidyloxyphenyl) fluorene-type epoxy resin, 9,9-bis(4-hydroxyphenyl)fluorene and 9,9-bis(4-hydroxy-3-methylphenyl)fluorene; a 9,9-bis(cyanoalkyl)fluorene, such as 9,9-bis(cyanomethyl)fluorene; and a 9,9-bis(aminoalkyl)fluorene, such as 9,9-bis(3-aminopropyl)fluorene.

The resin having such a backbone structure that two cyclic structures are bonded to a cyclic-structure-constituting quaternary carbon atom is a polymer produced by polymerizing a monomer having a cardo structure, and may also be a copolymer of the monomer with another copolymerizable monomer.

As the method for polymerizing the monomer, any conventional method can be employed. Examples of the method include a ring opening polymerization method and an addition polymerization method.

The resin composition according to the present invention contains (A3) a phenolic resin and/or a polyhydroxystyrene resin.

Specific examples of the phenolic resin that can be used in the present invention include a novolac resin and a resol resin. The phenolic resin can be produced by polycondensing a single type of phenol compound or a mixture of two or more types of phenol compounds with an aldehyde such as formalin.

Examples of the phenols constituting the novolak resin and the resole resin include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, and β-naphthol, and these phenols may be used singly, or a mixture of two or more of them may be used.

Specific examples of the aldehyde include formalin, paraformaldehyde, acetaldehyde, benzaldehyde, hydroxybenzaldehyde and chloroacetaldehyde. These aldehydes may be used singly, or a mixture of two or more of them may be used.

The phenolic resin to be used in the present invention may be one having a structure in which each of 1 to 4 of hydrogen atoms added to an aromatic ring is substituted by an alkyl group having 1 to 20 carbon atoms, a fluoroalkyl group, an alkoxyl group, an alkoxymethyl group, a methylol group, an ester group, a nitro group, a cyano group, a fluorine atom or a chlorine atom. The preferred weight average molecular weight of the phenolic resin to be used in the present invention is 2,000 to 50,000, preferably 3,000 to 30,000, as determined in terms of polystyrene by employing gel permeation chromatography (GPC). When the molecular weight is 2,000 or more, the form of a pattern, resolution, developability and heat resistance become excellent. When the molecular weight is 50,000 or less, sufficient sensitivity can be secured.

Specific examples of the polyhydroxystyrene resin that can be used in the present invention include: a polymer or a copolymer which is produced by polymerizing an aromatic vinyl compound having a phenolic hydroxyl group, such as p-hydroxystyrene, m-hydroxystyrene, o-hydroxystyrene, p-isopropenylphenol, m-isopropenylphenol and o-isopropenylphenol, singly or polymerizing two or more of the aromatic vinyl compounds by a known method; and a polymer or copolymer which is produced by an addition reaction for adding an alkoxy group to a part of a polymer or copolymer, which is produced by polymerizing an aromatic vinyl compound, such as styrene, o-methylstyrene, m-methylstyrene and p-methylstyrene, singly or polymerizing two or more of the aromatic vinyl compounds by a conventional known method, by a conventional known method.

The aromatic vinyl compound having a phenolic hydroxyl group that can be used preferably is p-hydroxystyrene and/or m-hydroxystyrene, and styrene is used preferably as the aromatic vinyl compound.

The polyhydroxystyrene resin to be used in the present invention may have a structure in which each of 1 to 4 of hydrogen atoms added to the aromatic ring is substituted by an alkyl group having 1 to 20 carbon atoms, a fluoroalkyl group, an alkoxyl group, an alkoxymethyl group, a methylol group, an ester group, a nitro group, a cyano group, a fluorine atom or a chlorine atom.

The preferred weight average molecular weight of the polyhydroxystyrene resin to be used in the present invention is preferably 3,000 to 60,000, more preferably 3,000 to 25,000, as determined in terms of polystyrene by employing gel permeation chromatography (GPC). When the molecular weight is 3,000 or more, the form of a pattern, resolution, developability and heat resistance become excellent. When the molecular weight is 60,000 or less, sufficient sensitivity can be secured.

The resin composition according to the present invention contains a cyclic olefin polymer. Examples of the cyclic olefin polymer that can be used in the present invention include a homopolymer and a copolymer of a cyclic olefin monomer having a cyclic structure (an alicyclic or aromatic structure) and a carbon-carbon double bond. The cyclic olefin polymer may also have a monomer other than the cyclic olefin monomer.

Examples of the monomer constituting the cyclic olefin polymer include a cyclic olefin monomer having a protic polar group, a cyclic olefin monomer having an aprotic polar group, a cyclic olefin monomer having no polar group, and a monomer other than a cyclic olefin. The monomer other than a cyclic olefin may have a protic polar group or another polar group, or may have no polar group.

Specific examples of the cyclic olefin monomer having a protonic polar group include carboxyl group-containing cyclic olefins such as 5-hydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 5-exo-6-end-dihydroxycarbonylbicyclo[2.2.1]hept-2-ene, 8-hydroxycarbonyltetracyclo[4.4.0.1$^{2,5}$.1$^{7,10}$]dodeca-3-ene, 8-methyl-8-hydroxycarbonyltetracyclo[4.4.0.1$^{2,5}$.1$^{7,10}$]dodeca-3-ene, and 8-exo-9-end-dihydroxycarbonyltetracyclo[4.4. 0.1$^{2,5}$.1$^{7,10}$]dodeca-3-ene, and hydroxyl group-containing cyclic olefins such as 5-(4-hydroxyphenyl)bicyclo[2.2.1]hept-2-ene, 5-methyl-5-(4-hydroxyphenyl)bicyclo[2.2.1]hept-2-ene, 8-(4-hydroxyphenyl)tetracyclo[4.4.0.1$^{2,5}$.1$^{7,10}$]dodeca-3-ene, and 8-methyl-8-(4-hydroxyphenyl)tetracyclo[4.4.0.1$^{2,5}$.1$^{7,10}$]dodeca-3-ene. These monomers may be used singly, or two or more of them may be used in combination.

Specific examples of the cyclic olefin monomer having a polar group other than a protonic polar group include cyclic olefins having an ester group such as 5-acetoxybicyclo[2.2.1]hept-2-ene, 5-methoxycarbonylbicyclo[2.2.1]hept-2-ene, 5-methyl-5-methoxycarbonylbicyclo[2.2.1]hept-2-ene, 8-acetoxytetracyclo[4.4.0.1$^{2,5}$.1$^{7,10}$]dodeca-3-ene, 8-methoxycarbonyltetracyclo[4.4.0.1$^{2,5}$.1$^{7,10}$]dodeca-3-ene, 8-ethoxycarbonyltetracyclo[4.4.0.1$^{2,5}$.1$^{7,10}$]dodeca-3-ene, 8-n-propoxycarbonyltetracyclo[4.4.0.11$^{2,5}$.1$^{7,10}$]dodeca-3-ene, 8-isopropoxycarbonyltetracyclo[4.4.0.1$^{2,5}$.1$^{7,10}$]dodeca-3-ene, 8-n-butoxycarbonyltetracyclo[4.4.0.1$^{2,5}$.1$^{7,10}$]dodeca-3-ene, 8-methyl-8-methoxycarbonyltetracyclo[4.4.0.1$^{2,5}$.1$^{7,10}$]dodeca-3-ene, 8-methyl-8-ethoxycarbonyltetracyclo[4.4.0.1$^{2,5}$.1$^{7,10}$]dodeca-3-ene, 8-methyl-8-n-propoxycarbonyltetracyclo[4.4.0.1$^{2,5}$.1$^{7,10}$]dodeca-3-ene, 8-methyl-8-isopropoxycarbonyltetracyclo[4.4.0.1$^{2,5}$.1$^{7,10}$]dodeca-3-ene, 8-methyl-8-n-butoxycarbonyltetracyclo[4.4.0.1$^{2,5}$.1$^{7,10}$]dodeca-3-ene, 8-(2,2,2-trifluoroethoxycarbonyl)tetracyclo[4.4.0.1$^{2,5}$.1$^{7,10}$]dodeca-3-ene, and 8-methyl-8-(2,2,2-trifluoroethoxycarbonyl)tetracyclo[4.4.0.1$^{2,5}$0.1$^{7,10}$]dodeca-3-ene, cyclic olefins having an N-substituted imide group such as N-phenyl-(5-norbornene-2,3-dicarboximide), cyclic olefins having a cyano group such as 8-cyanotetracyclo[4.4.0.1$^{2,5}$.1$^{7,10}$]dodeca-3-ene, 8-methyl-8-cyanotetracyclo[4.4.0.1$^{2,5}$.1$^{7,10}$]dodeca-3-ene, and 5-cyanobicyclo[2.2.1]hept-2-ene, and cyclic olefins having a halogen atom such as 8-chlorotetracyclo[4.4.0.1$^{2,5}$.1$^{7,10}$]dodeca-3-ene and 8-methyl-8-chlorotetracyclo[4.4.0.1$^{2,5}$.1$^{7,10}$]dodeca-3-ene. These monomers may be used singly, or two or more of them may be used in combination.

Specific examples of the cyclic olefin monomer having no polar group include bicyclo[2.2.1]hept-2-ene, 5-ethyl-bicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[4.3.0.1$^{2,5}$]deca-3,7-diene, tetracyclo[8.4.0.1$^{11,14}$.0$^{3,7}$]pentadeca-3,5,7,12,11-pentaene, tetracyclo[4.4.0.1$^{2,5}$.1$^{7,10}$]deca-3-ene, 8-methyl-tetracyclo[4.4.0.1$^{2,5}$.1$^{7,10}$]dodeca-3-ene, 8-ethyl-tetracyclo[4.4.0.1$^{2,5}$.1$^{7,10}$]dodeca-3-ene, 8-methylidene-tetracyclo[4.4.0.1$^{2,5}$.1$^{7,10}$]dodeca-3-ene, 8-ethylidene-tetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyl-tetracyclo[4.4.0.1$^{2,5}$.1$^{7,10}$]dodeca-3-ene, pentacyclo[6.5.1.1$^{3,6}$.0$^{2,7}$.0$^{9,13}$]pentadeca-3,10-diene, cyclopentene, cyclopentadiene, 1,4-methano-1,4,4a,5,10,10a-hexahydroanthracene, 8-phenyl-tetracyclo[4.4.0.1$^{2,5}$.1$^{7,10}$]dodeca-3-ene, tetracyclo[9.2.1.0$^{2,10}$.0$^{3,8}$]tetradeca-3,5,7,12-tetraene, pentacyclo[7.4.0.1$^{3,6}$.1$^{10,13}$.0$^{2,7}$]pentadeca-4,11-diene, and pentacyclo[9.2.1.14,7.0$^{2,10}$.0$^{3,8}$]pentadeca-5,12-diene. These monomers may be used singly, or two or more of them may be used in combination.

Specific examples of the monomer other than the cyclic olefins include α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene, and chain olefins such as non-conjugated dienes including 1,4-hexadiene, 4-methyl-1,4-hexadiene, 5-methyl-1,4-hexadiene, and 1,7-octadiene. These monomers may be used singly, or two or more of them may be used in combination.

As the method for polymerizing the cyclic olefin polymer using the above-mentioned monomer, any conventional method can be employed. Examples of the method include a ring opening polymerization method and an addition polymerization method.

The polymerization catalyst to be used in the polymerization is preferably a complex of a metal such as molybdenum, ruthenium or osmium. These polymerization catalysts may be used singly, or two or more of them may be used in combination.

The hydrogenation of the cyclic olefin polymer produced by the polymerization of the monomer is generally carried out using a hydrogenation catalyst. As the hydrogenation catalyst, one which is conventionally used in the hydrogenation of an olefin compound can be used. Specific examples of the hydrogenation catalyst to be used include a Ziegler-type homogeneous catalyst, a noble metal complex catalyst and a supported noble metal-based catalyst.

Among these hydrogenation catalysts, noble metal complex catalysts of rhodium, ruthenium and the like are preferred, and a ruthenium catalyst with which a nitrogenated heterocyclic carbene compound or phosphine, which is a compound having a high electron-donating property, coordinates is particularly preferred, from the viewpoint of avoiding the occurrence of a side reaction causing the deformation of a functional group or the like and enabling the selective hydrogenation of a carbon-carbon unsaturated bond in the polymer.

The resin composition according to the present invention contains a polysiloxane. An example of the polysiloxane that can be used in the present invention is a polysiloxane produced by the hydrolytic condensation of at least one organosilane.

Specific examples of the organosilane include tetra-functional silanes such as tetramethoxysilane, tetraethoxysilane, tetraacetoxysilane, and tetraphenoxysilane, tri-functional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-(trimethoxysilyl)propyl succinate, 1-naphthyltrimethoxysilane, 1-naphthyltriethoxysilane, 1-naphthyltri-n-propoxysilane, 2-naphthyltrimethoxysilane, 1-anthracenyltrimethoxysilne, 9-anthracenyltrimethoxysilne, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane, and 5-acenaphthenyltrimethoxysilane, di-functional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane, and di(1-naphthyl)diethoxysilane, and mono-functional silanes such as trimethylmethoxysilane, tri-n-butylethoxysilane, (3-glycidoxypropyl)dimethylmethoxysilane, and (3-glycidoxypropyl)dimethylethoxysilane. Two or more of these organosilanes may be used in combination.

Specific examples of the organosilane oligomer include: methyl silicate 51 (n: 4 on average) manufactured by Fuso Chemical Co., Ltd., M silicate 51 (n: 3 to 5 on average), silicate 40 (n: 4 to 6 on average) and silicate 45 (n: 6 to 8 on average) manufactured by Tama Chemicals Co., Ltd., and methyl silicate 51 (n: 4 on average), methyl silicate 53A (n: 7 on average) and ethyl silicate 40 (n: 5 on average) manufactured by Colcoat Co., Ltd. These products can be purchased from these companies. Two or more of them may be used in combination.

The content of an Si atom derived from the organosilane in the polysiloxane can be determined by determining the structure of a raw material organosilane by $^1$H-NMR, $^{13}$C-NMR, $^{29}$Si-NMR, IR, TOF-MS or the like and then calculating an integration ratio of a peak coming from an Si—C bond to a peak coming from an Si—O bond in IR spectra of the structure.

The weight average molecular weight (Mw) of the polysiloxane is not particularly limited, and is preferably 1,000 or more as determined in terms of polystyrene by GPC (gel permeation chromatography), from the viewpoint of improving the coating film formability. On the other hand, the weight average molecular weight (Mw) is preferably 100,000 or less, more preferably 50,000 or less, from the viewpoint of the solubility in a developing solution.

The polysiloxane to be used in the present invention can be synthesized by hydrolyzing and partially condensing a monomer, such as the above-mentioned organosilane, or an oligomer. The term "partial condensation" as used herein refers to a procedure by which several of Si—OH groups can remain in the polysiloxane, rather than condensing all of Si—OH groups in a hydrolysis product. The hydrolysis and the partial condensation can be carried out employing the conventional methods. For example, a method can be mentioned, in which a solvent, water and optionally a catalyst are added to an organosilane mixture and the resultant solution is stirring under heating at 50 to 150° C. for about 0.5 to 100 hours. If necessary, a hydrolysis by-product (an alcohol such as methanol) or a condensation by-product (water) may be distilled away by distillation during the stirring.

The catalyst is not particularly limited, and an acid catalyst and a basic catalyst are preferably used. Specific examples of the acid catalyst include hydrochloric acid, nitric acid, sulfuric acid, hydrofluoric acid, phosphoric acid, acetic acid, trifluoroacetic acid, formic acid, a polyhydric carboxylic acid, an anhydride of any one of these acids, and an ion exchange resin. Specific examples of the basic catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, an alkoxysilane having an amino group, and an ion exchange resin.

From the viewpoint of the storage stability of the photosensitive resin composition, it is preferred that the catalyst is not contained in a polysiloxane solution after the hydrolysis and the partial condensation, and the removal of the catalyst may be carried out as required. The method for the removal is not particularly limited, and is preferably washing with water and/or a treatment with an ion exchange resin from the viewpoint of the easiness of operation and the removability of the catalyst. Washing with water is a method in which the polysiloxane solution is diluted with a proper hydrophobic solvent and is then washed with water several times to produce an organic layer, and the organic layer is concentrated with an evaporator or the like. A treatment with an ion exchange resin is a method in which the polysiloxane solution is brought into contact with a proper ion exchange resin.

The resin composition according to the present invention contains (I) a compound whose maximum absorption wavelength shifts by a heat treatment. The component (I) to be used in the present invention is preferably a compound having a maximum absorption wavelength of 340 nm or more and less than 450 nm after a heat treatment.

It is considered that it is preferred for an insulating layer or a planarization film in an organic EL display to absorb light having a wavelength of 340 to 450 nm, including ultraviolet light and visible light in a short wavelength range, which is believed to be greatly involved in the occurrence of deterioration or malfunctions of the device or the development of a leakage current in the device caused by the penetration of light into TFTs for driving the device. For the formation of an insulating layer or a planarization film having the effect, it is considered to use a resin composition containing a compound having the maximum absorption wavelength thereof at 340 to 450 nm, for example. When merely a resin composition containing a compound having the maximum absorption wavelength thereof at 340 to 450 nm is used, however, the absorption of the light by the resin composition overlaps the absorption of g line (436 nm), h line (405 nm) and i line (365 nm) which correspond to the main exposing light wavelengths of a high-pressure mercury lamp. Therefore, it is difficult to penetrate the light to the bottom of the resin film during the exposure of the resin film to light to sensitize the resin film. In contrast, when (I) the compound whose maximum absorption wavelength shifts by a heat treatment according to the present invention is used, it becomes possible to penetrate light having a wavelength of the exposing light in a photosensitive resin film that is not subjected to a heat treatment yet, and it becomes possible to absorb light having a wavelength of 340 to 450 nm, including ultraviolet light and visible light in a short wavelength range, in a heat-resistant resin film that has been subjected to the heat treatment after the exposure to the light. By using the heat-resistant resin film as an insulating layer or a planarization film in a display device, it becomes possible to prevent the occurrence of deterioration or malfunctions of the device or the development of a leakage current in the device which is caused as the result of the penetration of light into TFTs for driving the device. It is preferred that the component (I) has one or more phenolic hydroxyl groups, wherein one, several or all of the phenolic hydroxyl groups are respectively protected by protecting groups. It is also preferred that each of the protecting groups is a heat-labile group that can be removed with heat or an acid-labile group that can be removed with an acid. An electronic/steric effect of the protecting group causes a change in the levels of the HOMO (highest occupied molecular orbital) or an occupied molecular orbital close to the HOMO and the LUMO (lowest unoccupied molecular orbital) or an unoccupied molecular orbital close to the LUMO of a compound, leading to the shift of the maximum absorption wavelength inherent in the compound. As a result, ultraviolet light and visible light in a short wavelength range, which are light having a wavelength of light emitted by a high-pressure mercury lamp, can reach the bottom of the photosensitive resin film, resulting in the achievement of high sensitivity. Furthermore, because the protecting group can be deprotected in the heat treatment step or a step prior to the heat treatment step, the absorption of the compound is recovered to an original position thereof and, therefore, a heat-resistant resin film having a function of absorbing light having a wavelength of 340 to 450 nm can be produced finally.

The protecting group that can be removed with heat or an acid is preferably any one of groups represented by general formula (8) to (11).

[Chemical formula 16]

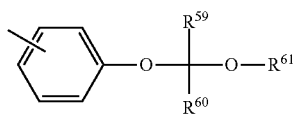
(8)

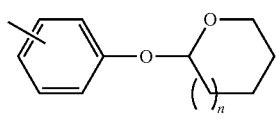
(9)

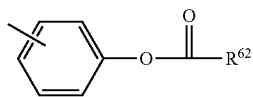
(10)

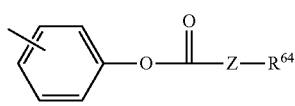
(11)

In general formula (8), $R^{59}$ to $R^{61}$ may be the same as one another or one or some of $R^{59}$ to $R^{61}$ may be different from the others, and independently represent a hydrogen atom or a monovalent hydrocarbon group having 1 or more carbon atoms; in general formula (9), n represents 0 or 1; in general formula (10), $R^{62}$ represents a monovalent hydrocarbon group having 1 to 20 carbon atoms; and in general formula (11), Z represents an oxygen atom, a sulfur atom or —N($R^{63}$)—, $R^{64}$ represents a monovalent hydrocarbon group having 1 to 20 carbon atoms, and $R^{63}$ represents a hydrogen atom or a monovalent hydrocarbon group having 1 to 20 carbon atoms.

Among these groups, an acetyl group, a tetrahydropyranyl group, a tert-butoxycarbonyl group, an alkylamide group, an arylamide group, and the like are preferred. These protecting groups can be introduced by a conventional known method (see, for example, "Courses in Experimental Chemistry", edited by Chemical Society of Japan (2005)). For example, in the case where a phenolic hydroxyl group is protected by an acetyl group, the protection can be achieved by reacting the compound having a phenolic hydroxyl group with acetic anhydride in pyridine.

In the component (I), the ratio of protection of a phenolic hydroxyl group by the protecting group is preferably 50 mol % or more, more preferably 70 mol % or more. The ratio of protection can be determined by measuring NMR of the protected compound and then calculating the integration ratio of a peak coming from a phenolic hydroxyl group to a peak coming from another structure. When 50 mol % or more of phenolic hydroxyl groups contained in the component (I) are protected, the width of shift of the maximum absorption wavelength which is caused by the protecting group increases, and therefore light having the same wavelength as that of exposing light can penetrate more easily, resulting in the further increase in sensitivity.

It is preferred that (I) the compound whose maximum absorption wavelength shifts by a heat treatment to be used in the present invention is a non-condensed polycyclic compound or a condensed polycyclic compound each having at least one phenolic hydroxyl group. It is also preferred that (I) the compound whose maximum absorption wavelength shifts by a heat treatment to be used in the present invention is a non-condensed polycyclic compound or a condensed polycyclic compound each having at least one phenolic hydroxyl group and also having 2 to 8 inclusive of aromatic rings. Examples of the non-condensed polycyclic compound or the condensed polycyclic compound each having at least one phenolic hydroxyl group include, but not limited to, a benzophenone-type compound, a benzotriazole-type compound, a triazine-type compound, a benzoxazinone-type compound and an anthraquinone-type compound.

Examples of the benzophenone-type compounds include, but are not limited to, 2,4-dihydroxybenzophenone, 2-hydroxy-4-methoxybenzophenone, 2-hydroxy-4-octyloxybenzophenone, 2-hydroxy-4-dodecyloxybenzophenone, 2-hydroxy-4-benzyloxybenzophenone, 2-hydroxy-4-methoxy-5-sulfobenzophenone, 2-hydroxy-4-methoxy-5-sulfobenzophenone trihydrate, 2-hydroxy-4-methoxy-2'-carboxybenzophenone, 2-hydroxy-4-octadesiloxybenzophenone, 2-hydroxy-4-diethylamino-2'-hexyloxycarbonylbenzophenone, 2,2'-dihydroxy-4-methoxybenzophenone, 2,2',4,4'-tetrahydroxybenzophenone, 2,3,4,4'-tetrahydroxybenzophenone, 2,2'-dihydroxy-4,4'-dimethoxybenzophenone, 1,4-bis(4-benzyloxy-3-hydroxyphenoxy)butane, and 2,2',3,4,4'-pentahydroxybenzophenone.

Examples of the benzotriazole-type compounds include, but are not limited to, 2-(2'-hydroxy-5'-methylphenyl)benzotriazole, 2-(2'-hydroxy-5'-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3'-t-butyl-5'-(2-(octyloxycarbonyl)ethyl)phenyl)-5-chlorobenzotriazole, 2-(2'-hydroxy-3'-dodecyl-5'-methylphenyl)-5-chlorobenzotria zole, 2-(2'-hydroxy-3',5'-di-t-amylphenyl)benzotriazole, 2-(2'-hydroxy-5'-t-octylphenyl)benzotriazole, 2-(2'-hydroxy-3',5'-di-(dimethylbenzyl)phenyl)benzotriazole, 2-(2'-hydroxy-4'-octyloxyphenyl)benzotriazole, 2,2'-methylene-bis(2-(2'-hydroxy-5'-t-octylphenyl)benzotriazole), and 2-(2'-hydroxy-3'-(3,4,5,6-tetrahydrophthalimidylmethyl)-5'-methylbenzylphenyl)benzotriazole.

Examples of the triazine-type compounds include, but are not limited to, 2-(4-hexyloxy-2-hydroxyphenyl)-4,6-diphenyl-1,3,5-triazine, 2-(4-octyloxy-2-hydroxyphenyl)-4,6-di(2,5-dimethylphenyl)-1,3,5-triazine, 2-(4-butoxy-2-hydroxyphenyl)-4,6-di(4-butoxyphenyl)-1,3,5-triazine, 2-(4-butoxy-2-hydroxyphenyl)-4,6-di(2,4-dibutoxyphenyl)-1,3,5-triazine, 2-(4-(3-(2-ethylhexyloxy)-2-hydroxypropoxy)-2-hydroxyphenyl)-4,6-di(2,4-dimethylphenyl)-1,3,5-triazine, 2-(4-(3-dodecyloxy-2-hydroxypropoxy)-2-hydroxyphenyl)-4,6-di(2,4-dimethylphenyl)-1,3,5-triazine, 2,4-di(4-butoxy-2-hydroxyphenyl)-6-(4-butoxyphenyl)-1,3,5-triazine, and 2,4-di(4-butoxy-2-hydroxyphenyl)-6-(2,4-dibutoxyphenyl)-1,3,5-triazine.

A specific example of the benzoxazinone-type compound includes, but is not limited to, 2,2'-p-phenylenebis(6-hydroxy-4H-3,1-benzoxazine(oxazin)-4-one).

Examples of the anthraquinone-type compounds include, but are not limited to, 1-hydroxyanthraquinone, 2-hydroxyanthraquinone, 3-hydroxyanthraquinone, 1-hydroxy-2-methoxyanthraquinone, 1,2-dihydroxyanthraquinone, 1,3-dihydroxyanthraquinone, 1,4-dihydroxyanthraquinone, 1,5-dihydroxyanthraquinone, 1,8-dihydroxyanthraquinone, 1,3-dihydroxy-3-methylanthraquinone, 1,5-dihydroxy-3-methylanthraquinone, 1,6-dihydroxy-3-methylanthraquinone, 1,7-dihydroxy-3-methylanthraquinone, 1,8-dihydroxy-3-methylanthraquinone, 1,8-dihydroxy-2-methylanthraquinone, 1,3-dihydroxy-2-methoxyanthraquinone, 2,4-dihydroxy-1-methoxyanthraquinone, 2,5-dihydroxy-1-methoxyanthraquinone, 2,8-dihydroxy-1-methoxyanthraquinone, 1,8-dihydroxy-3-methoxy-6-methylanthraquinone, 1,2,3-hydroxyanthraquinone, and 1,3,5-trihydroxyanthraquinone.

These compounds may be used singly, or two or more of them may be used in combination.

The component (I) to be used in the present invention is preferably soluble in an organic solvent. The term "soluble in an organic solvent" as used herein refers to a case where a substance is dissolved in at least one solvent selected from N-methyl-2-pyrrolidone, gamma-butyrolactone, N,N-dimethylformamide, N,N-dimethylacetamide, dimethyl sulfoxide, tetrahydrofuran, dioxane, propylene glycol monomethyl ether, acetone, methyl ethyl ketone, diisobutyl ketone, diacetone alcohol, 3-methyl-3-methoxybutanol, ethyl acetate, propylene glycol monomethyl ether acetate, ethyl lactate, toluene and xylene at a concentration of 10% by weight or more at 23° C. When the component (I) is soluble in an organic solvent, a bonding property can be further improved during development and the breakdown voltage of the film after a heat treatment can also be improved without causing the aggregation of the component (I) in the photosensitive resin composition.

In the present invention, the content of the component (I) is preferably 5 to 300 parts by weight, particularly preferably 10 to 200 parts by weight, relative to 100 parts by weight of the alkali-soluble resin (A). When the amount of the component (I) used is 5 parts by weight or more, the light transmittance of the cured film to light having a wavelength within an ultraviolet to visible light wavelength range can be decreased. When the amount is 300 parts by weight or less, the water absorption ratio can be reduced while maintaining the strength of the cured film.

The term "heating treatment" as used herein refers to a procedure of heating at a temperature falling within the range from 200 to 350° C., more preferably 230° C. or higher. When the heat treatment is carried out at 230° C. or higher, the protecting group is removed efficiently, thereby causing the shift of the maximum absorption wavelength of the heat-resistant resin film after the heat treatment. The heat treatment may be carried out under a nitrogen atmosphere or in air.

The resin composition according to the present invention contains (C) a photo-acid generator. Specific examples of the photo-acid generator (C) include a quinone diazide compound, a sulfonium salt, a phosphonium salt, a diazonium salt and an iodonium salt.

Examples of the quinone diazide compound include: a compound produced by bonding quinone diazide sulfonic acid to a polyhydroxyl compound or a polyamino compound via an ester bond; a compound produced by bonding quinone diazide sulfonic acid to a polyhydroxyl compound via a sulfoneamide bond; and a compound produced by bonding quinone diazide sulfonic acid to a polyhydroxyl polyamino compound via an ester bond and/or a sulfoneamide bond. In these compounds, it is preferred that 50 mol % or more of all of functional groups in the polyhydroxyl compound or the polyamino compound is substituted by quinone diazide. When a quinone diazide compound in which 50 mol % or more is substituted is used, the affinity of the quinone diazide compound for an aqueous alkaline solution is reduced, the solubility of an unexposed part of the resin composition in an aqueous alkaline solution is greatly reduced, and the quinone diazide sulfonyl group is converted to an indene carboxylic acid upon exposure to light to achieve a high dissolution rate of an exposed part of the resin composition in an aqueous alkaline solution, resulting in the increase in the ratio of the dissolution rate of the exposed part of the composition to the dissolution rate of the unexposed part of the composition. As a result, a pattern with a high degree of resolution can be obtained. By using the quinone diazide compound, it becomes possible to produce a positive-working photosensitivity resin composition which can be photosensitized with i line (365 nm), h line (405 nm) and g line (436 nm) of a conventional mercury lamp. These photo-acid generators may be used singly, or two or more of them may be used in combination. In either case, a high-sensitivity photosensitive resin composition can be produced.

In the present invention, as the quinone diazide, a quinone diazide having a 5-naphthoquinone diazide sulfonyl group is preferably used. The absorption of a naphthoquinone diazide sulfonyl ester compound extends to a g line range of a mercury lamp, and is therefore suitable for the exposure to g line and the exposure to light within the whole wavelength range.

The molecular weight of the quinone diazide compound is preferably 300 or more, more preferably 350 or more, and is preferably 3000 or less, more preferably 1500 or less, from the viewpoint of the heat resistance, mechanical properties and bonding properties of a film produced by a heat treatment. The content of the quinone diazide compound is preferably 1 part by weight or more, more preferably 3 parts by weight or more, and is preferably 50 parts by weight or less, more preferably 40 parts by weight or less, relative to 100 parts by weight of (A) the alkali-soluble resin. When the content is 1 to 50 parts by weight, it becomes possible to impart photosensitiveness to a film produced after a heat treatment while maintaining the heat resistance, chemical resistance and mechanical properties of the film.

Among these photo-acid generators, a sulfonium salt, a phosphonium salt and a diazonium salt are preferred, because an acid component generated upon the exposure to light can be stabilized appropriately. Particularly, a sulfonium salt is preferred.

The content of the sulfonium salt, the phosphonium salt or the diazonium salt is preferably 0.5 to 20 parts by weight relative to 100 parts by weight of (A) the alkali-soluble resin, from the viewpoint of increasing sensitivity. In addition, a sensitizer or the like may be contained, if necessary.

The resin composition according to the present invention contains (D) a solvent. Specific examples of the solvent to be used in the present invention include: a polar aprotic solvent, such as N-methyl-2-pyrrolidone, gamma-butyrolactone, N,N-dimethylformamide, N,N-dimethylacetamide and dimethyl sulfoxide; an ether, such as tetrahydrofuran, dioxane and propylene glycol monomethyl ether; a ketone, such as acetone, methyl ethyl ketone, diisobutyl ketone and diacetone alcohol; an ester, such as ethyl acetate, propylene glycol monomethyl ether acetate and ethyl lactate; and an aromatic hydrocarbon, such as toluene and xylene. These solvents may be used singly, or two or more of them may be used in combination.

The content of the solvent to be used in the present invention is preferably 50 parts by weight or more, more preferably 100 parts by weight or more, and is preferably 2000 parts by weight or less, more preferably 1500 parts by weight or less, relative to 100 parts by weight of (A) the alkali-soluble resin.

It is preferred that the resin composition according to the present invention contains (J) a compound which does not have an absorption maximum at a wavelength of 340 nm or more and less than 436 nm and has an absorption maximum at a wavelength of 436 to 750 nm inclusive. As the compound, a thermally color-developing compound, or a dye and/or an organic pigment can be used preferably. At least one type of the component (J) may be contained. For example, a method in which one type of thermally color-developing compound or one type of dye or organic pigment is used, a method in which a mixture of at least two thermally color-developing compound or dye or organic pigment is used, and a method in which at least one type of thermally color-developing compound, at least one type of dye and at least one type of organic pigment are used in combination can be mentioned. In the present invention, a method in which a compound having an absorption maximum at a wavelength of 436 to 750 nm is used is preferably selected.

The thermally color-developing compound which can be used as the component (J) in the present invention preferably has a color-developing temperature of 120° C. or higher, preferably 150° C. or higher. The heat resistance under high-temperature conditions becomes superior with the increase in the color-developing temperature of the thermally color-developing compound, and the thermally color-developing compound rarely undergoes discoloration upon the irradiation with ultraviolet light or visible light for a long period and therefore has excellent light resistance.

The organic pigment to be used as the component (J) in the present invention is preferably a pigment having high heat resistance and light resistance. The dye to be used as the compound for the component (J) is preferably a dye which is soluble in an organic solvent that can dissolve (A) the alkali-soluble resin and is compatible with the resin. The dye may also be a dye having high heat resistance and high light resistance.

The component (J) to be used in the resin composition according to the present invention preferably contains (J1) a dye and/or an organic pigment each having an absorption maximum at a wavelength of 436 nm or more and less than 490 nm.

The dye to be used as the component (J1) in the present invention is preferably: a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin; or a dye having high heat resistance and high light resistance, from the viewpoint of storage stability and discoloration upon curing or irradiation with light. The component (J1) has an absorption maximum at a wavelength of 436 nm or more and less than 490 nm, and specific examples thereof include a yellow dye and an orange dye. The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The organic pigment to be used as the component (J1) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the yellow pigment include pigment yellow 83, 117, 129, 138, 139, 150 and 180. Specific examples of the orange pigment include pigment orange 38, 43, 64, 71 and 72. A pigment other than the above-mentioned pigments may also be used.

The content of the component (J1) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (J1) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and also maintaining the heat resistance and mechanical properties of a film after a heat treatment.

In the present invention, the organic pigment to be used as the component (J1) may be subjected to a surface treatment, such as a rosin treatment, an acidic group treatment and a basic group treatment, if necessary. The organic pigment may also be used together with a dispersant optionally. Examples of the dispersant include a cationic surfactant, an anionic surfactant, a nonionic surfactant, an amphoteric surfactant, a silicone-type surfactant and a fluorine-containing surfactant.

The component (J) to be used in the resin composition according to the present invention preferably contains (J2) a dye and/or an organic pigment each having an absorption maximum at a wavelength of 490 nm or more and less than 580 nm.

The dye to be used as the component (J2) in the present invention is preferably: a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin; or a dye having high heat resistance and high light resistance, from the viewpoint of storage stability and discoloration upon curing or irradiation with light. The component (J2) has an absorption maximum at a wavelength of 490 nm or more and less than 580 nm, and examples thereof include a red dye and a violet dye.

The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The organic pigment to be used as the component (J2) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the red pigment include pigment red 48:1, 122, 168, 177, 202, 206, 207, 209, 224, 242 and 254. Specific examples of the violet pigment include pigment violet 19, 23, 29, 32, 33, 36, 37 and 38. A pigment other than the above-mentioned pigments may also be used.

The content of the component (J2) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (J2) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and the heat resistance and mechanical properties of a film after a heat treatment.

In the present invention, the organic pigment to be used as the component (J2) may be subjected to a surface treatment, such as a rosin treatment, an acidic group treatment and a basic group treatment, if necessary. The organic pigment may also be used together with a dispersant, if necessary. Examples of the dispersant include a cationic surfactant, an anionic surfactant, a nonionic surfactant, an amphoteric surfactant, a silicone-type surfactant and a fluorine-containing surfactant.

The component (J) to be used in the resin composition according to the present invention preferably contains (J3) a dye and/or a pigment having an absorption maximum at a wavelength of 580 nm or more and less than 750 nm.

The dye to be used as the component (J3) in the present invention is preferably a dye which is soluble in an organic solvent that can dissolve (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom, and which is compatible with the resin, or a dye having high heat resistance and high light resistance, from the viewpoint of storage stability and discoloration upon curing or irradiation with light. The component (J3) has an absorption maximum at a wavelength of 580 nm or more and less than 750 nm, and examples thereof include a blue dye and a green dye.

The type of the dye includes an oil-soluble dye, a dispersible dye, a reactive dye, an acidic dye, a direct dye and the like.

Examples of the backbone structure of the dye include, but not limited to, those of an anthraquinone-type, an azo-type, a phthalocyanine-type, a methine-type, an oxazine-type, a quinoline-type, a triarylmethane-type, and a xanthene-type. Among these backbone structures, backbone structures of an anthraquinone-type, an azo-type, a methine-type, a triarylmethane-type and a xanthene-type are preferred, from the viewpoint of the solubility in an organic solvent and heat resistance. These dyes may be used singly or may be used in the form of a metal-containing complex salt. Specific examples thereof include, but are not limited to, Sumilan and Lanyl dyes (manufactured by Sumitomo Chemical Co., Ltd.); Orasol, Oracet, Filamid, and Irgasperse dyes (manufactured by Ciba Specialty Chemicals Inc.); Zapon, Neozapon, Neptune, and Acidol dyes (manufactured by BASF Corporation); Kayaset and Kayakalan dyes (manufactured by Nippon Kayaku Co., Ltd.); Valifast colors dye (manufactured by Orient Chemical Industries, Ltd.); Savinyl, Sandoplast, Polysynthren, and Lanasyn dyes (manufactured by Clariant Japan Co., Ltd.); Aizen Spilon dye (manufactured by Hodogaya Chemical Co., Ltd.); functional dye (manufactured by Yamada Chemical Co., Ltd.); and Plast Color dye, and Oil Color dye (manufactured by Arimoto Chemical Co., Ltd.). These dyes may be used singly, or a mixture of two or more of them may be used.

The organic pigment to be used as the component (J3) in the present invention is preferably a pigment having high heat resistance and light resistance, from the viewpoint of discoloration during curing or irradiation with light.

Specific examples of the organic pigment to be used are mentioned in terms of color index (CI) numbers as follows. Specific examples of the blue pigment include pigment blue 15 (e.g., 15:3, 15:4, 15:6), 21, 22, 60 and 64. Specific examples of the green pigment include pigment green 7, 10, 36, 47 and 58. A pigment other than the above-mentioned pigments may also be used.

The content of the component (J3) to be used in the present invention is preferably 0.1 to 300 parts by weight, more preferably 0.2 to 200 parts by weight, particularly preferably 1 to 200 parts by weight, relative to 100 parts by weight of (A1) the polyimide, the polybenzoxazole, the polyimide precursor or the polybenzoxazole precursor or (A2) the resin having such a backbone structure that two cyclic structures are bonded to a cyclic-structure-constituting quaternary carbon atom. When the content of the component (J3) is 0.1 part by weight or more, it becomes possible to absorb light having a wavelength corresponding to the pigment. When the content is 300 parts by weight or less, it becomes possible to absorb light having a wavelength corresponding to the pigment while maintaining the adhesion strength between a photosensitive color resin film and a substrate and the heat resistance and mechanical properties of a film after a heat treatment.

In the present invention, the organic pigment to be used as the component (J3) may be subjected to a surface treatment, such as a rosin treatment, an acidic group treatment and a basic group treatment, if necessary. The organic pigment may also be used together with a dispersant, if necessary. Examples of the dispersant include a cationic surfactant, an anionic surfactant, a nonionic surfactant, an amphoteric surfactant, a silicone-type surfactant and a fluorine-containing surfactant.

In the present invention, the film can be blackened by additionally using the components (J1), (J2) and (J3). The degree of blackening can be expressed by an optical density (an OD value), and the OD value is preferably 0.15 or more, more preferably 0.4 or more, still more preferably 1.0 or more.

The resin composition according to the present invention may additionally contain (F) a compound having 3 to 6 thermally crosslinkable groups per molecule. When the component (F) is contained, it becomes possible to impart positive-working photosensitivity and improve the chemical resistance of the heat-resistant resin film.

As the component (F), a compound represented by general formula (4) or a compound having a structure represented by general formula (5) is preferred.

[Chemical formula 7]

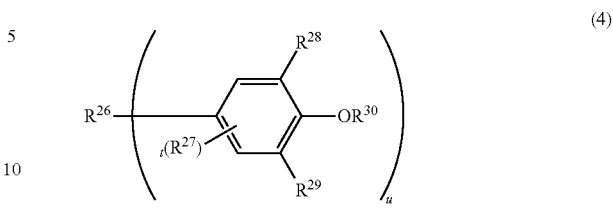

(4)

In general formula (4) above, $R^{26}$ represents a bivalent to tetravalent linking group. $R^{27}$ represents Cl, Br, I, F, a monovalent hydrocarbon group having 1 to 20 carbon atoms, a group having such a structure that —$CH_2$— in a monovalent hydrocarbon group having 1 to 20 carbon atoms is substituted by —CO—, —COO—, —NH—, —NHCO—, —O—, —S—, —$SO_2$—, —Si— or —$Si(CH_3)_2$—, or a group having such a structure that a hydrogen atom in a monovalent hydrocarbon group having 1 to 20 carbon atoms is substituted by a fluoroalkyl group, a hydroxyl group, an alkoxyl group, a nitro group, a cyano group, a fluorine atom, a chlorine atom or —$COOR^{31}$. $R^{31}$ represents a hydrogen atom or an alkyl group having 1 to 20 carbon atoms. $R^{28}$ and $R^{29}$ independently represent $CH_2OR^{32}$ that is a thermally crosslinkable group. $R^{32}$ represents a hydrogen atom or a monovalent hydrocarbon group having 1 to 6 carbon atoms. $R^{30}$ represents a hydrogen atom, a methyl group or an ethyl group. $R^{32}$ is preferably a monovalent hydrocarbon group having 1 to 4 carbon atoms, because proper reactivity can still remain and excellent storage stability can be achieved. In a photosensitive resin composition containing a photo-acid generator and the like, $R^{32}$ is more preferably a methyl group or an ethyl group. t represents an integer of 0 to 2, and u represents an integer of 2 to 4. The multiple $R^{27}$'s, $R^{28}$'s, $R^{29}$'s and $R^{30}$'s may be the same as or different from one another. Specific examples of the linking group $R^{26}$ are as follows.

[Chemical formula 8]

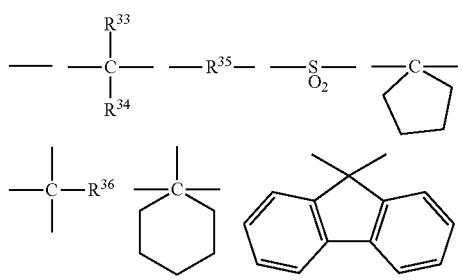

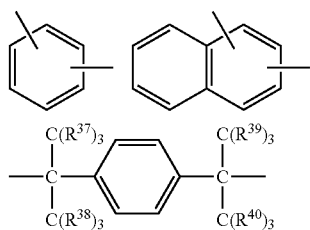

-continued

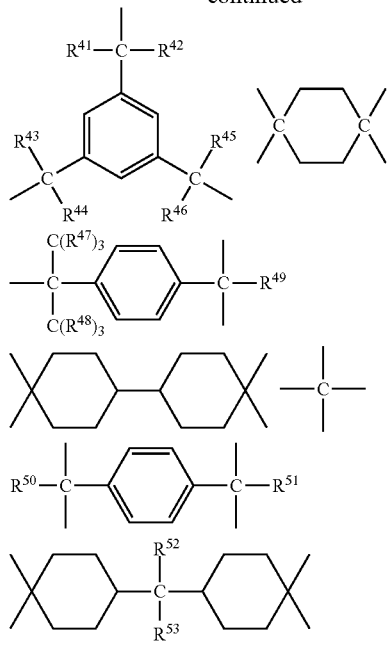

In the formula, $R^{33}$ to $R^{53}$ independently represent a hydrogen atom, Cl, Br, I, F, a monovalent hydrocarbon group having 1 to 20 carbon atoms, a group having such a structure that —$CH_2$— in a monovalent hydrocarbon group having 1 to 20 carbon atoms is substituted by —CO—, —COO—, —NH—, —NHCO—, —O—, —S—, —$SO_2$—, —Si— or —Si($CH_3$)$_2$—, or a group having such a structure that a hydrogen atom in a monovalent hydrocarbon group having 1 to 20 carbon atoms is substituted by a fluoroalkyl group, a hydroxyl group, an alkoxyl group, a nitro group, a cyano group, a fluorine atom, a chlorine atom, or —COOR$^{54}$. $R^{54}$ represents a hydrogen atom or an alkyl group having 1 to 20 carbon atoms.

   (5)

In general formula (5), $R^{55}$ represents a hydrogen atom or a monovalent hydrocarbon group having 1 to 6 carbon atoms. v represents 1 or 2, and w represents 0 or 1, wherein v+w is 1 or 2.

The purity of the compound having a structure represented by general formula (4) is preferably 75% or more, more preferably 85% or more. When the purity is 85% or more, it becomes possible to achieve excellent storage stability, to perform the crosslinking reaction of the resin composition satisfactorily to achieve excellent coloring properties after curing, and to further decrease the transmittance of the heat-resistant resin film to light having a wavelength within a visible light range. In addition, it also becomes possible to reduce the number of unreacted groups that act as water-absorbable groups, resulting in the decrease in water absorbability of the resin composition. As the method for producing a high-purity thermal crosslinking agent, methods such as recrystallization and distillation can be mentioned. The purity of the thermal crosslinking agent can be determined by a liquid chromatography method.

Preferred examples of the compound having a structure represented by general formula (4) are as follows.

[Chemical formula 9]

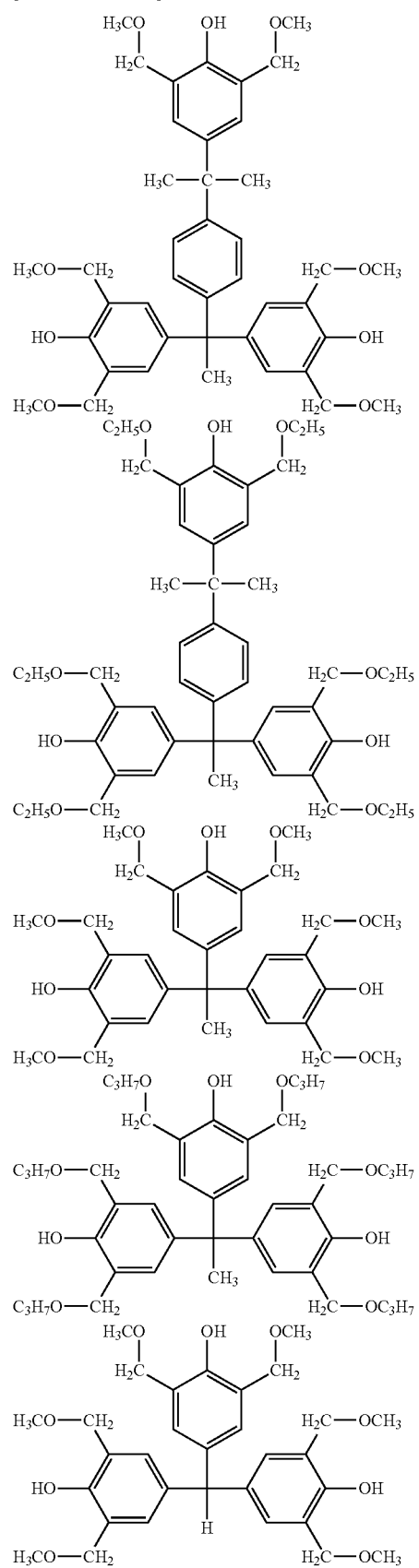

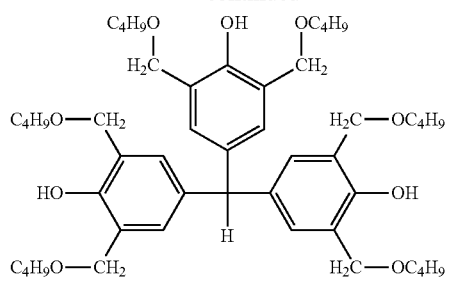

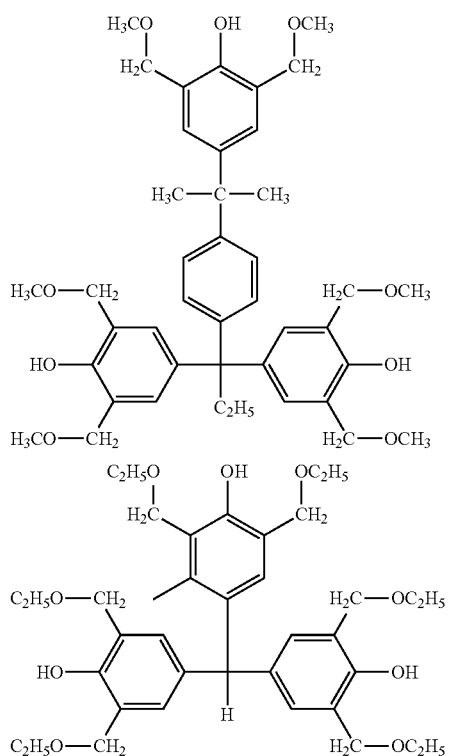

Preferred examples of the crosslinking agent having a structure represented by general formula (5) are as follows.

[Chemical formula 11]

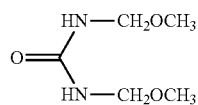

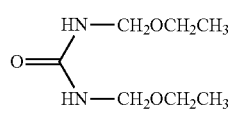

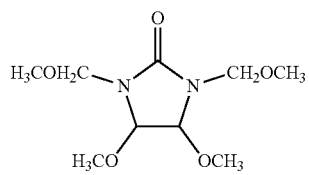

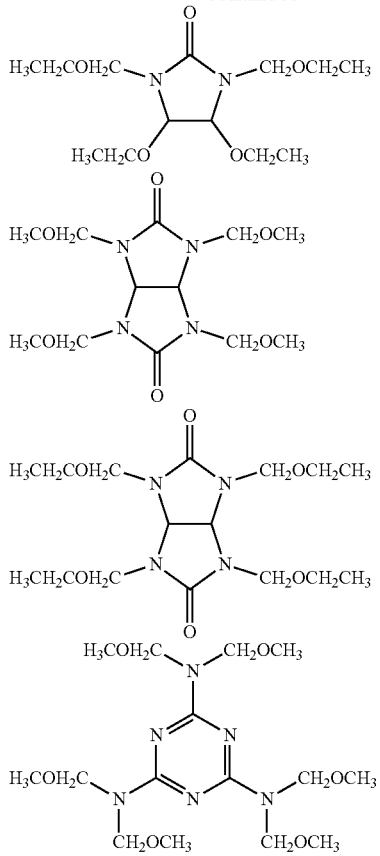

In the present invention, an epoxy compound is also preferred as the component (F). Examples of the epoxy compound include, but are not limited to, TEPIC (registered trademark) S, TEPIC (registered trademark) G, and TEPIC (registered trademark) P (trade names, manufactured by NISSAN CHEMICAL INDUSTRIES, LTD.), DENACOL (registered trademark) EX-321L (trade name, manufactured by Nagase ChemteX Corporation), VG3101L (trade name, manufactured by Printec Co.), EPPN 502H and NC3000 (trade names, manufactured by Nippon Kayaku Co., Ltd.), and EPICLON (registered trademark) N695 and HP-7200 (trade names, manufactured by DIC CORPORATION).

In the present invention, these components (F) may be used singly, or two or more of them may be used in combination.

The content of the component (F) is preferably 5 parts by weight or more, more preferably 10 parts by weight or more, and is preferably 120 parts by weight or less, more preferably 100 parts by weight or less, relative to 100 parts by weight of (A) the alkali-soluble resin. When the content is 5 to 120 parts by weight inclusive, the strength of the heat-resistant resin film is increased and the storage stability of the resin composition becomes excellent.

The resin composition according to the present invention may additionally contain (G) a compound having a phenolic hydroxyl group. Because the compound can compensate alkali developability, it becomes possible to impart positive-working photosensitivity.

Examples of the compound having a phenolic hydroxyl group include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP- IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DMLPFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (trade names, manufactured by ASAHI YUKIZAI CORPORATION), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, and BisP-AP (trade name, manufactured by Honshu Chemical Industry Co., Ltd.).

In the present invention, the content of the component (G) is preferably 3 to 50 parts by weight inclusive relative to 100 parts by weight of (A) the alkali-soluble resin.

The resin composition according to the present invention may additionally contain (H) a thermal acid generator. The thermal acid generator can generate an acid upon a heat treatment after development as mentioned below to accelerate the crosslinking reaction between (A) the alkali-soluble resin and the component (F) (i.e., the thermal crosslinking agent), and also accelerate the cyclization of an imide ring or an oxazole ring in (A) the alkali-soluble resin such as a polyimide precursor or a polybenzoxazole precursor. As a result, the chemical resistance of the heat-resistant resin film can be improved and the thinning of the film can be prevented. The acid generated from the thermal acid generator is preferably a strong acid, and is preferably, for example, an arylsulfonic acid such as p-toluenesulfonic acid and benzene sulfonic acid, and an alkylsulfonic acid such as methanesulfonic acid, ethanesulfonic acid and butanesulfonic acid. In the present invention, the thermal acid generator is preferably any one of aliphatic sulfonic acid compounds each represented by general formula (6) or (7). Two or more of these compounds may be contained.

[Chemical formula 12]

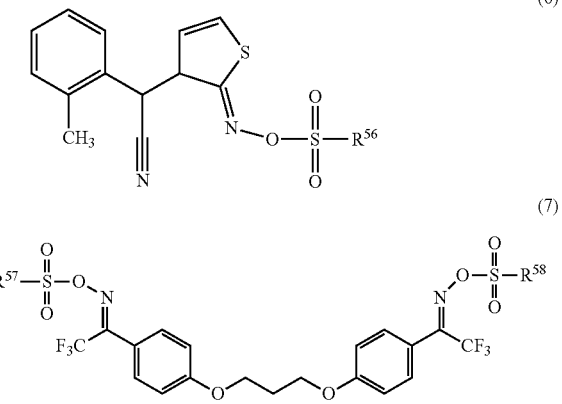

(6)

(7)

In general formulae (6) and (7), $R^{56}$ to $R^{58}$ independently represent an alkyl group having 1 to 10 carbon atoms or a monovalent aromatic group having 7 to 12 carbon atoms. In the alkyl group and the aromatic group, at least one hydrogen atom may be substituted. Specific examples of the substituent include an alkyl group and a carbonyl group.

Specific examples of the compound represented by general formula (6) are as follows.

[Chemical formula 13]

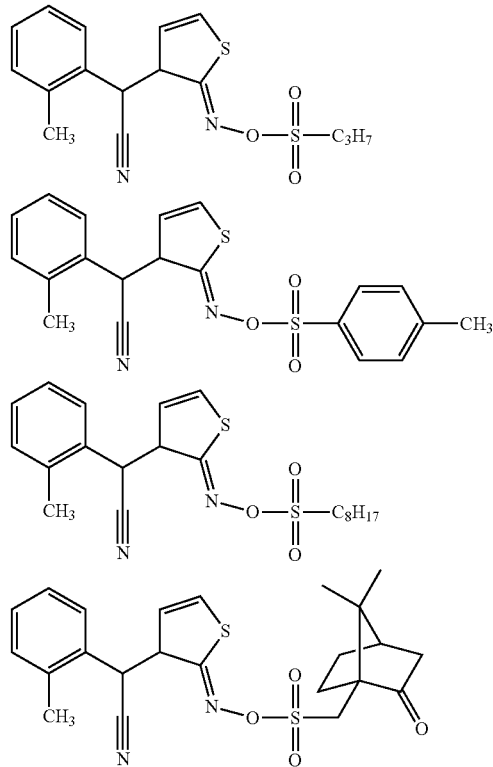

Specific examples of the compound represented by general formula (7) are as follows.

[Chemical formula 14]

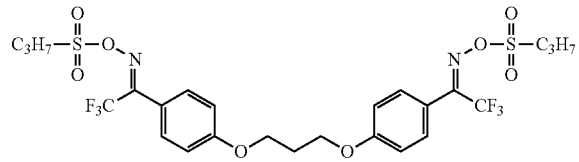

The content of the thermal acid generator (H) is preferably 0.1 part by weight or more, more preferably 0.3 part by weight or more, still more preferably 0.5 part by weight or more, relative to 100 parts by weight of (A) the alkali-soluble resin, from the viewpoint of further accelerating the crosslinking reaction. On the other hand, the content is preferably 20 parts by weight or less, more preferably 15 parts by weight or less, still more preferably 10 parts by weight or less, from the viewpoint of the electrical insulation properties of the heat-resistant resin film.

The resin composition according to the present invention may also contain an adhesion-improving agent. Examples of the adhesion-improving agent include silane coupling agents such as vinyl trimethoxysilane, vinyl triethoxysilane, epoxy cyclohexyl ethyl trimethoxysilane, 3-glycidoxy propyl trimethoxysilane, 3-glycidoxy propyl triethoxysilane, p-styryl trimethoxysilane, 3-aminopropyl trimethoxysilane, 3-aminopropyl triethoxysilane, and N-phenyl-3-aminopropyl trimethoxysilane, titanium chelate agents, aluminum chelate agents, and compounds obtained by reacting a aromatic amine compound with an alkoxy group-containing silicon compound. Two or more of these adhesion-improving agents may be contained. When the adhesion-improving agent is contained, it becomes possible to enhance the close adhesion to an underlying base material, e.g., a silicon wafer, ITO, $SiO_2$ and nitride silicon, during the development of a photosensitive resin film. It becomes also possible to enhance the resistance to oxygen plasma, which is used for washing purposes or the like, or an UV ozone treatment. The content of the adhesion-improving agent is preferably 0.1 to 10 parts by weight relative to 100 parts by weight of (A) the alkali-soluble resin.

The resin composition according to the present invention may also contain a bonding-improving agent. Specific examples of the bonding-improving agent include an alkoxysilane-containing aromatic amine compound, an aromatic amide compound, and a silane compound containing no aromatic moiety. Two or more of these bonding-improving agents may be contained. When the compound is contained, it becomes possible to improve the bonding to a base material after burning or curing. Specific examples of the alkoxysilane-containing aromatic amine compound and the aromatic amide compound are shown below. In addition to these compounds, a compound produced by reacting an aromatic amine compound with an alkoxy-group-containing silicon compound may also be used. A specific example of the compound is a compound produced by reacting an aromatic amine compound with an alkoxysilane compound having a group capable of reacting with an amino group such as an epoxy group or a chloromethyl group.

[Chemical formula 15]

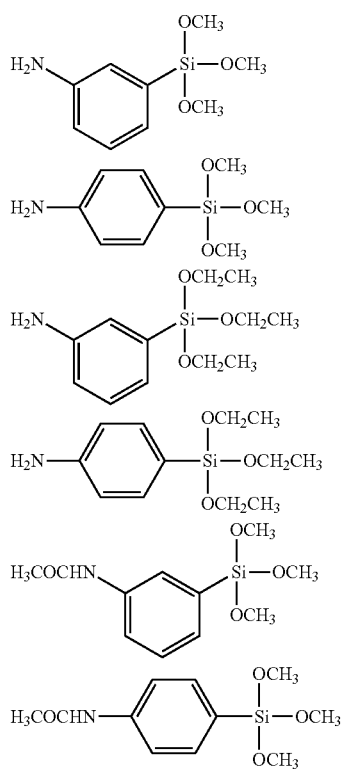
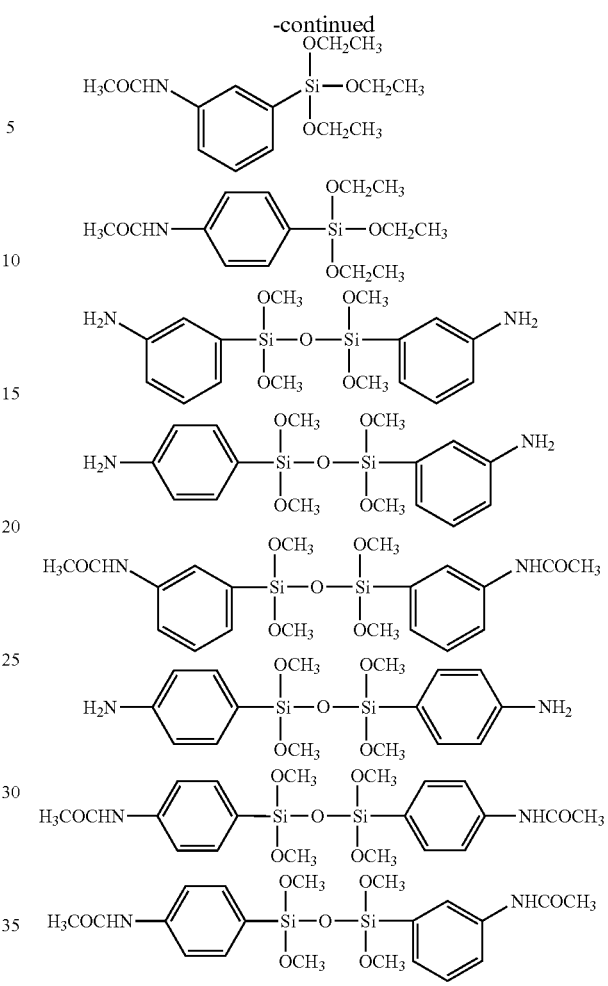

Examples of the silane compound containing no aromatic moiety include vinyl silane compounds such as vinyl trimethoxysilane, vinyl triethoxysilane, vinyl trichlorosilane, and vinyl tris(β-methoxyethoxy)silane, and carbon-carbon unsaturated bond-containing silane compounds such as 3-methacryloxy propyl trimethoxysilane, 3-acryloxy propyl trimethoxysilane, p-styryl trimethoxysilane, 3-methacryloxy propyl methyl dimethoxysilane, and 3-methacryloxy propyl methyl diethoxysilane. Among these compounds, vinyltrimethoxysilane and vinyltriethoxysilane are preferred.

The content of the bonding-improving agent is preferably 0.01 to 15 parts by weight relative to 100 parts by weight of (A) the alkali-soluble resin.

A compound which can act as both of an adhesion-improving agent and a bonding-improving agent, such as vinyltrimethoxysilane and vinyltriethoxysilane, may also be contained.

The resin composition according to the present invention may contain a surfactant to improve the wettability with a substrate.

Specific examples of the surfactant include: a fluorine-containing surfactant, such as Florad (a product name, manufactured by Sumitomo 3M Inc.), Megaface (a product name, manufactured by DIC Corporation) and Surflon (a product name, manufactured by Asahi Glass Co., Ltd.); an organic siloxane surfactant, such as KP341 (a product name, manufactured by Shin-Etsu Chemical Co., Ltd.), DBE (a product name, manufactured by Chisso Corporation), Glanol (a product name, manufactured by Kyoeisha Chemical Co., Ltd.) and BYK (manufactured by BYK-Chemie); and an acrylic polymer surfactant, such as Polyflow (a product name, manufactured by Kyoeisha Chemical Co., Ltd.).

Next, the method for producing the resin composition according to the present invention will be described. The positive-working photosensitive resin composition can be produced by, for example, dissolving the components (A), (D) and (I), the component (C), and optionally the components (E), (H), the adhesion-improving agent, the bonding-improving agent, the surfactant and the like. Examples of the method for the dissolution include stirring and heating. When heating is employed, it is preferred to adjust the heating temperature to a temperature falling within a range at which the performance of the positive-working photosensitive resin composition cannot be deteriorated, and the heating temperature is generally room temperature to 80° C. The order of dissolution of the components is not particularly limited. For example, a method can be mentioned, in which the compounds are dissolved in order of increasing solubility. With respect to a component that is likely to generate bubbles during stirring or dissolution, such as surfactants and some types of adhesion-improving agents, the component can be added finally after all of the other components are dissolved, thereby preventing the insufficient dissolution of the other components due to the generation of the bubbles.

It is preferred that the resin composition thus produced is filtered through a filtration filter to remove foreign matters and particles. The filter pore size is, for example, 0.5 µm, 0.2 µm, 0.1 µm, 0.05 µm or 0.02 µm, but is not limited thereto. Specific examples of the material for the filtration filter include polypropylene (PP), polyethylene (PE), nylon (NY) and polytetrafluoroethylene (PTFE), and polyethylene and nylon are preferred. In the case where an organic pigment is contained in the resin composition, it is preferred to use a filtration filter having a larger pore size than the particle diameters of the organic pigment.

Next, the method for producing the heat-resistant resin film using the resin composition according to the present invention will be described. The resin composition according to the present invention is applied by a spin coating method, a slit coating method, a dip coating method, a spray coating method, a printing method or the like to produce a coating film of the resin composition. Prior to the application, a base material onto which the resin composition is to be applied may be pre-treated with the above-mentioned adhesion-improving agent. For example, a method can be mentioned, in which the surface of the base material is treated by, for example, spin coating, slit die coating, bar coating, dip coating, spray coating or a treatment with steam using a solution prepared by dissolving the adhesion-improving agent in a solvent, such as isopropanol, ethanol, methanol, water, tetrahydrofuran, propylene glycol monomethyl ether acetate, propylene glycol monomethyl ether, ethyl lactate and diethyl adipate, at a concentration of 0.5 to 20% by weight. If necessary, it is possible to carry out a drying treatment under reduced pressure and then carry out a heat treatment at 50 to 300° C. to allow the reaction of the base material with the adhesion-improving agent to proceed the reaction between the base material and the adhesion-improving agent.

Subsequently, the coating film of the resin composition is dried to produce a photosensitive resin film. It is preferred to carry out the drying at 50 to 150° C. for 1 minute to several hours with an oven, a hot plate, infrared ray or the like.

Subsequently, an actinic ray is emitted over the photosensitive resin film through a mask having a desired pattern. Examples of the actinic ray to be used for the light exposure include ultraviolet ray, visible ray, electron beam and X-ray. In the present invention, it is preferred to use i line (365 nm), h line (405 nm) or g line (436 nm) of a mercury lamp.

Subsequently, the photosensitive resin film that has been exposed to light is developed to remove an exposed region. A developing solution is preferably an aqueous solution of a compound having alkalinity, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine. If necessary, at least one component selected from a polar solvent such as N-methyl-2-pyrrolidone, N,N-dimethylformamide, N,N-dimethylacetamide, dimethyl sulfoxide, γ-butyrolactone and dimethylacrylamide, an alcohol such as methanol, ethanol and isopropanol, an ester such as ethyl lactate and propylene glycol monomethyl ether acetate and a ketone such as cyclopentanone, cyclohexanone, isobutyl ketone, and methyl isobutyl ketone may be added to the aqueous alkaline solution. After the development, a rinsing treatment with water is generally carried out. The rinsing treatment may be carried out using a solution prepared by adding an alcohol, e.g., ethanol and isopropyl alcohol, or an ester, e.g., ethyl lactate and propylene glycol monomethyl ether acetate, to water.

The photosensitive resin film thus produced is subjected to a heat treatment to produce a heat-resistant resin film. The term "heat treatment" as used herein refers to a treatment by heating at a temperature falling within the range from 200 to 350° C. For example, a method in which the heat treatment is carried out at 250° C. for 60 minutes can be mentioned. The heating treatment may be carried out under a nitrogen atmosphere or in air.

The heat-resistant resin film produced from the resin composition according to the present invention can be used suitably as an insulating film or a protective film for wiring lines. For example, the heat-resistant resin film can be used as an insulating film or a protective film for wiring lines made from copper, aluminum or the like in a printed substrate produced by forming the wiring lines on a film or substrate made from polyimide, ceramic or the like, or as a protective film for use in partial soldering of the wiring lines. In the case where the resin composition contains an electrically conductive filler, the heat-resistant resin film can also be used as a wiring material.

The heat-resistant resin film produced from the resin composition according to the present invention can also be used suitably as a planarization film in a display device equipped with a substrate having TFTs formed thereon, the planarization film and display elements in this order. Examples of the display device having this configuration include a liquid crystal display device and an organic EL display device. An active-matrix-type display device has such a configuration that: TFTs and wiring lines which are respectively positioned on the side of the TFTs and which are connected to the TFTs are arranged on a glass- or plastic-made substrate; a planarization film is arranged on the wiring lines and the TFTs in such a manner as to cover projections and depressions on the wiring lines and the TFTs; and display elements are arranged on the planarization film. The display elements and the wiring lines are connected to each other through contact holes formed in the planarization film. In The FIGURE, the cross-sectional view of a TFT substrate is illustrated. Bottom-gate-type or top-gate-type TFTs 1 are provided in a matrix shape on a substrate 6, an insulating film 3 is formed in such a manner as to cover the TFTs 1. Wiring lines 2, which are respectively connected to the TFTs 1, are provided on the insulating film 3. A planarization film 4 is also provided on the insulating film 3 in such a manner that the wiring lines 2 are embedded in the planarization film 4. Contact holes 7, which reach the wiring lines 2, are formed in the planarization film 4. ITOs (transparent electrodes) 5 are formed on the planarization film 4 in such a manner that the ITOs 5 are connected to the wiring lines 2 respectively through the contact holes 7. The ITOs 5 serve as electrodes for display elements (e.g., organic EL elements). The organic EL elements may be of a top-emission-type which can emit luminescent light from a side opposed to the substrate 6 or a bottom-emission-type from which light can be extracted from the substrate 6 side, and is preferably of a top-emission-type. In this manner, an active-matrix-type organic EL display device, in which TFTs 1 for driving organic EL elements are connected to the organic EL elements, is produced.

In the case of an organic EL display device using TFTs in each of which a semiconductor layer is made from amorphous silicon, microcrystal silicon, a metal oxide (e.g., IGZO) or the like, there may be cases where an undesirable phenomenon, such as the deterioration or malfunctions of the device, the development of a leakage current in the device or the like, is caused as the result of the penetration of light having a relatively high energy, e.g., ultraviolet light or visible light in a short wavelength range. The heat-resistant resin film produced from the resin composition according to the present invention has an absorption at a wavelength of 340 to 450 nm. Therefore, in the organic EL display device equipped with the heat-resistant resin film, the deterioration or malfunctions of the device, the development of a leakage current in the device or the like can be prevented and stable driving/luminous properties can be achieved in the device.

An organic EL display device using TFTs, in each of which a semiconductor layer is made from a metal oxide, is particularly preferably a high-resolution device. The degree of resolution is preferably 100 ppi or more, more preferably 200 ppi or more. When the heat-resistant resin film produced from the positive-working photosensitive resin composition according to the present invention is used in the high-resolution organic EL device, it becomes possible to more efficiently prevent the occurrence of an undesirable phenomenon, such as the deterioration or malfunctions of the device or the development of a leakage current in the device which can be caused by the penetration of light.

In addition, the heat-resistant resin film produced from the resin composition according to the present invention can be used suitably as: a surface protective film or an interlayer insulating film for semiconductor devices including LSIs; a bonding agent or an underfilling agent to be used in the packaging of devices; a capping agent for preventing the migration of copper; a planarization film for on-chip microlenses for solid-state imaging elements and various types of displays and solid-state imaging elements; and others.

EXAMPLES

First, the invention according to the first aspect will be described by way of examples. However, the present invention is not limited by these examples. The evaluations of the resin compositions in the examples were carried out by the methods mentioned below.

(1) Evaluation of Light Transmittance of Resin Composition

A resin composition (referred to as a "varnish", hereinafter) was spin-coated on a 5-cm-square glass substrate in such a manner that the film thickness of the resultant film after a heat treatment became 2.0 μm, and the film was prebaked at 120° C. for 2 minutes. Subsequently, the film was cured under an air atmosphere at 250° C. for 60 minutes using a high-temperature clean oven CLH-21CD(V)-S (manufactured by Koyo Thermo Systems Co., Ltd.) to produce a heat-resistant resin film. The film thickness of the heat-resistant resin film was measured using SURFCOM 1400D (manufactured by Tokyo Seimitsu Co., Ltd.) under the assumption that the refractive index was 1.629. The prebaked film and the cured film thus produced were measured with respect to transmission spectra in a wavelength range of 300 to 800 nm using an ultraviolet and visible spectrophotometer "MultiSpec-1500" (manufactured by Shimadzu Corporation). A prebaked film having such a result that a light transmittance at a wavelength of 365 to 436 nm was less than 50% was rated as "insufficient (C)", and a prebaked film having such a result that a light transmittance at a wavelength of 365 to 436 nm was 50% or more was rated as "good (A)". A cured film having such a result that a light transmittance at a wavelength of 350 to 460 nm was more than 5% was rated as "insufficient (C)", a cured film having such a result that a light transmittance at a wavelength of 350 to 460 nm was 5% or less was rated as "good (A)", and a cured film having such a result that a light transmittance at a wavelength of 350 to 460 nm was 4% or less was rated as "extremely good (S)". When the heat-resistant resin film does not have a thickness of 2.0 μm after a heat treatment, the light transmittance of the heat-resistant resin film can be determined by converting the thickness of the measured heat-resistant resin film to 2.0 μm in accordance with the Lambert's law, and the transmission spectra were determined with respect to the heat-resistant resin film having a thickness of 2.0 μm.

(2) Evaluation of Sensitivity

A varnish produced in each of Examples and Comparative Examples was spin-coated on an 8-inch-square silicon wafer, and then the varnish was subjected to a heat treatment (prebaking) at 120° C. for 2 minutes using a hot plate (a coater/developer "Act-8", manufactured by Tokyo Electron Limited) to produce a prebaked film. The prebaked film was exposed to light at a light exposure amount of 0 to 1000 mJ/cm$^2$ at steps of 20 mJ/cm$^2$ using an i line stepper (NSR-2005i9C, manufactured by Nikon Corporation) or a mask aligner (PEM-6M, manufactured by Union Optical Co., LTD.). Line & space (L&S) patterns were as follows: 1, 2, 3, 4, 5, 6, 7, 8, 9, 10, 15, 20, 30, 50 and 100 μm. After the exposure to light, the resultant film was developed with a 2.38-wt % aqueous tetramethylammonium (TMAH) solution (manufactured by Tama Chemicals Co., Ltd.) for 30 to 100 seconds, and was then rinsed with purified water to form a relief pattern. The film thicknesses after the prebaking and the development were measured using an interferometer type film thickness measurement system. Lambda Ace STM-602 (manufactured by Dainippon Screen Manufacturing Co. Ltd.) under the assumption that the refractive index was 1.629.

After the exposure to light and the development, the smallest light exposure amount at which a line & space (L & S) pattern of 50 μm was formed at a ratio of 1:1 was employed as a value of the sensitivity.

(3) Evaluation of Surface Roughing of Film After Development

A pattern was formed in the section (2) above, and then the occurrence of roughing on the surface in a 5-μm hole after the development was confirmed using a field emission-type scanning X-ray analyzer (S-4800, manufactured by Hitachi Ltd.). A film in which the roughing of the surface was observed was rated as "insufficient (C)", and a film in which the roughing of the surface was not observed was rated as "good (A)".

(Synthesis Example 1) Synthesis of Hydroxyl-Group-Containing Diamine Compound)

2,2-Bis(3-amino-4-hydroxyphenyl) hexafluoropropane (manufactured by Central Glass Co., Ltd., abbreviated as "BAHF", hereinafter) (18.3 g) (0.05 mole) was dissolved in acetone (100 mL) and propylene oxide (manufactured by Tokyo Chemical Industry Co., Ltd.) (17.4 g) (0.3 mole), and the resultant mixture was cooled to −15° C. To the resultant solution was dropwisely added a solution prepared by dissolving 3-nitrobenzoyl chloride (manufactured by Tokyo Chemical Industry Co., Ltd.) (20.4 g) (0.11 mole) in acetone (100 mL). After the completion of the dropwise addition, the resultant solution was stirred at −15° C. for 4 hours and then warmed to room temperature. A precipitated white solid material was filtered off and then dried in vacuo at 50° C.

The white solid material thus produced (30 g) was introduced into a 300-mL stainless autoclave and was then dispersed in methyl cellosolve (250 mL), and then 5% palladium-carbon (manufactured by Wako Pure Chemical Industries, Ltd.) (2 g) was added thereto. Hydrogen was introduced into the reaction solution with a balloon to perform a reduction reaction at room temperature. After about 2 hours, it was confirmed that the balloon could not shrink any more, and the reaction was terminated. After the completion of the reaction, the reaction solution was filtered to remove the palladium compound that was a catalyst, and then the filtrate was concentrated with a rotary evaporator to produce a hydroxyl-group-containing diamine compound represented by the following formula.

[Chemical formula 17]

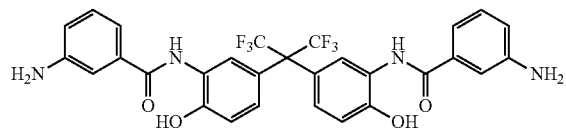

(Synthesis Example 2) Synthesis of Polyamic Acid Ester (A1-1)

Under a dry nitrogen stream, the hydroxyl-group-containing diamine (57.4 g) (0.095 mole) produced in Synthesis Example 1 and 1,3-bis(3-aminopropyl)tetramethyldisiloxane (abbreviated as "SiDA", hereinafter) (1.24 g) (0.005 mole) were dissolved in NMP (200 g). 4,4'-Oxydiphthalic anhydride (abbreviated as "ODPA", hereinafter) (31.0 g) (0.1 mole) was added to the solution, and the resultant solution was stirred at 40° C. for 2 hours. Subsequently, a solution prepared by diluting dimethylformamide dimethyl acetal (manufactured by Mitsubishi Rayon Co., Ltd., abbreviated as "DFA", hereinafter) (7.14 g) (0.06 mole) with NMP (5 g) was dropwisely added to the solution over 10 minutes. After the dropwise addition, the stirring of the resultant solution was continued 40° C. for 2 hours. After the completion of the stirring, the solution was introduced into water (2 L), and then precipitates of a polymer solid material were collected by filtration. The precipitates were further washed with water (2 L) three times, and then the collected polymer solid material was dried with a vacuum drier at 50° C. for 72 hours to produce a polyamic acid ester (A1-1).

(Synthesis Example 3) Synthesis of Resin Having Such Backbone Structure that Two Cyclic Structures are Bonded to Cyclic-Structure-Constituting Quaternary Carbon Atom (A2-1

Under a dry nitrogen stream, into a four-necked flask equipped with a reflux condenser were charged a 50% PGMEA solution of an equal equivalent reaction product of a bisphenol fluorene-type epoxy resin with acrylic acid (manufactured by Nippon Steel Chemical Co., Ltd., product name "ASF-400" solution) (198.53 g), benzophenonetetracarboxylic dianhydride (39.54 g) (0.12 mole), succinic anhydride (8.13 g) (0.08 mole), PGMEA (48.12 g) and triphenylphosphine (0.45 g). The resultant mixture was stirred under heating at 120 to 125° C. for 1 hour and then further stirred under heating at 75 to 80° C. for 6 hours. Subsequently, glycidylmethacrylate (8.6 g) was introduced into the reaction solution, and the resultant solution was further stirred at 80° C. for 8 hours to produce a resin having such a backbone structure that two cyclic structures are bonded to a cyclic-structure-constituting quaternary carbon atom (A2-1).

(Synthesis Example 4) Synthesis of Phenolic Resin (A3-1)

Under a dry nitrogen stream, m-cresol (70.2 g) (0.65 mole), p-cresol (37.8 g) (0.35 mole), a 37 wt % aqueous formaldehyde solution (75.5 g) (formaldehyde 0.93 mole), oxalic acid dihydrate (0.63 g) (0.005 mole) and methyl isobutyl ketone (264 g) were charged into a flask, and then a polycondensation reaction was carried out for 4 hours while immersing the flask in an oil bath and while refluxing the reaction solution. Subsequently, the temperature of the oil bath was raised over 3 hours, then the inner pressure of the flask was reduced to 40 to 67 hPa to remove a volatile component, and then the reaction solution was cooled to room temperature to produce a polymer solid material of a phenolic resin (A3-1). The weight average molecular weight of the polymer solid material as measured by GPC was 3500.

(Synthesis Example 5) Synthesis of Phenolic Resin (A3-2)

Under a dry nitrogen stream, phenol (94 g) (1 mole), a 37% aqueous formaldehyde solution (243.3 g) (3 moles) and a 10% sodium hydroxide aqueous solution (80 g) (0.2 mole) were charged into a flask and the resultant solution was reacted at 40° C. for 8 hours. Subsequently, the reaction solution was heated to 80° C. and was then further reacted at 80° C. for 10 hours. After the completion of the reaction, the reaction solution was cooled, and then a 15% aqueous sulfuric acid solution was added slowly thereto to adjust the pH to 3.0.

At this point of time, the reaction product was separated into a lower layer, i.e., a resol-type phenolic resin intermediate, and an upper layer, i.e., an aqueous layer portion containing a neutralization salt, a phenol monomer and a mononucleic methylolated phenol. The upper layer solution was removed, then water (300 g) was added to and mixed with the lower layer solution, then the resultant solution was allowed to stand to cause separation, and then the upper layer solution was removed. To a content solution produced by carrying out a dehydration treatment in the system were added 1-butanol (296 g) (4 moles) and 75% phosphoric acid (13 g) (0.2 mole). The inner temperature was raised under ambient pressure until reflux was initiated, and then an alkoxylation reaction was carried at 115 to 123° C. for 3 hours. During this reaction, for the purpose of completing the reaction, the reaction was continued while continuously removing water generated during the reaction. After the completion of this 3-hour reaction, toluene (552 g) (6 moles) was added to the reaction solution, then ion-exchanged water (300 g) was added thereto, and then the solution was agitated and was then allowed to stand.

The reaction product was separated into an upper layer resin solution, which contained a resol-type phenolic resin in which a terminal methylol group was butyletherated, and a lower layer aqueous solution, which contained phosphoric acid that was used as a catalyst in the alkoxylation reaction. The lower layer solution was removed, then water (300 g) was added to and mixed with the upper layer solution, then the resultant solution was allowed to stand to cause separation, and then the lower layer solution was removed in the same manner as mentioned above. This procedure was repeated until the metal content in the system was reduced to 1 ppm or less, and the solvent was removed under a reduced pressure, GBL was added thereto to adjust the non-volatile component to 50% in the solution. The solution was a phenolic resin (A3-2). The phenolic resin (A3-2) had a weight average molecular weight of 5800 and a degree of alkoxylation of 80%.

(Synthesis Example 6) Synthesis of Polyhydroxystyrene Resin (A3-3)

Under a dry nitrogen stream, p-t-butoxystyrene and styrene were added at a molar ratio of 3:1 in a total amount of 20 g to a mixed solution of tetrahydrofuran (500 ml) and sec-butyllithium (0.01 mole) that served as an initiator, and then the resultant solution was polymerized for 3 hours while stirring. A polymerization termination reaction was carried out by adding methanol (0.1 mole) to the reaction solution. Subsequently, for the purpose of purifying a polymer, the reaction mixture was poured into methanol to precipitate a polymer. The precipitated polymer was dried to produce a white polymer. The white polymer was dissolved in acetone (400 ml), then a small volume of concentrated hydrochloric acid was added thereto at 60° C., and the resultant solution was stirred for 7 hours and then poured into water to precipitate a polymer. p-t-Butoxystyrene in the polymer was deprotected to convert it to hydroxystyrene, and then the product was washed and then dried to produce a purified polyhydroxystyrene resin (A3-3). The weight average molecular weight as measured by GPC was 3500.

(Synthesis Example 7) Synthesis of Polyhydroxystyrene Resin (A3-4)

To a solution prepared by dissolving sodium hydroxide (80 g) (2.0 moles) in purified water (800 g) was dissolved the polyhydroxystyrene resin (A-5) produced in Synthesis Example 6. After being dissolved completely, a 36 to 38 wt % aqueous formalin solution (686 g) was dropwisely added to the solution at 20 to 25° C. over 2 hours. Subsequently, the resultant solution was stirred at 20 to 25° C. for 17 hours. Sulfuric acid (98 g) and water (552 g) were added to the solution to neutralize the solution, and the neutralized solution was allowed to stand for 2 days. A white solid material formed in the solution after the allowing to stand was washed with water (100 mL). The white solid material was dried in vacuo at 50° C. for 48 hours.

Subsequently, the compound thus produced was dissolved in methanol (300 mL), then sulfuric acid (2 g) was added to the solution, and the resultant solution was stirred at room temperature for 24 hours. An anion-type ion exchange resin (AMBERLYST IRA96SB, manufactured by Rohmand Haas Company) (15 g) was added to the solution, the resultant solution was stirred for 1 hour, and then the ion exchange resin was removed by filtration. Subsequently, gamma-butyrolactone (500 mL) was added to the solution, and methanol was removed from the solution with a rotary evaporator to produce a gamma-butyrolactone solution. The resin was analyzed by NMR (GX-270, manufactured by JOEL Ltd.), and it was found that a partly alkoxylated polyhydroxystyrene resin (A3-4) was produced. The product (A3-4) was analyzed by GPC, and it was found that the product had a weight average molecular weight (Mw) of 8000 (in terms of GPC polystyrene) and contained an alkoxylated hydroxystyrene moiety at an introduction rate of 35 mol % per 1 mole of hydroxystyrene.

(Synthesis Example 8) Synthesis of Quinone Diazide Compound (C-1)

Under a dry nitrogen stream, 4,4'-[1-[4-[1-(4-hydroxyphenyl-1)-1-methylethyl]phenyl]ethylidene]bisphenol (manufactured by Honshu Chemical Industry Co., Ltd., abbreviated as "TrisP-PA", hereinafter) (21.22 g) (0.05 mole) and 5-naphthoquinonediazidesulfonic acid chloride (NAC-5, manufactured by Toyo Gosei Co., Ltd) (26.8 g) (0.1 mole) were dissolved in 1,4-dioxane (450 g) and the temperature of the solution was adjusted to room temperature. Triethylamine (12.65 g) that was mixed with 1,4-dioxane (50 g) was dropwisely added to the solution in such a manner that the temperature in the system did not become 35° C. or higher. After the dropwise addition, the solution was stirred at 40° C. for 2 hours. A triethylamine salt was filtered off, and a filtrate was introduced into water. Subsequently, precipitates were collected by filtration and then washed with 1% aqueous hydrochloric acid (1 L). Subsequently, the washed product was further washed with water (2 L) two times. The precipitates were dried with a vacuum drier to produce a quinone diazide compound (C-1) represented by the following formula.

[Chemical formula 18]

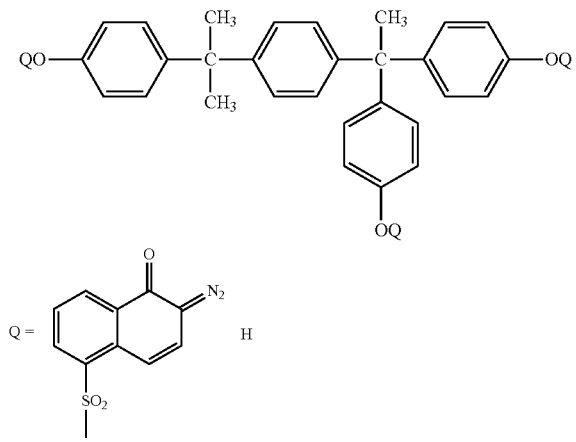

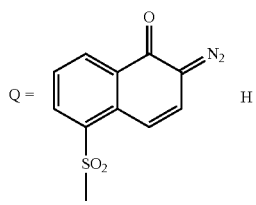

Example 1

The polyamic acid ester (A1-1) (10 g) produced in Synthesis Example 2, the phenolic resin (A3-1) (3 g) produced in Synthesis Example 4 and 4,4',4'',4'''-(1,4-phenylenedimethylidene) tetrakisphenol (maximum absorption wavelength: 440 nm) (3.5 g) that was a thermally color-developing compound were weighed and then dissolved in γ-butyrolactone (abbreviated as "GBL", hereinafter) (50 g) to produce a varnish of a polyimide precursor composition. The transmittance was measured using the varnish, and the transmittance at a wavelength within 365 to 436 nm before a heat treatment was 50% or more. The transmittance at a wavelength within 350 to 460 nm after the heat treatment was 4.2% or less.

Examples 2 to 6, Comparative Examples 1 to 7

Varnishes were produced in the same procedure as in Example 1, except that the types and amounts of the compounds were as shown in Tables 1 and 3. Each of the varnishes was used to measure transmittances before and after a heat treatment. The evaluation results are shown in Tables 2 and 4.

TABLE 1

| | Components of resin composition | | | | |
|---|---|---|---|---|---|
| | Component (A1, A2) (content) | Component (A3) (content) | Component (B) (content) | Component (C) (content) | Solvent (D) (content) |
| Example 1 | Polyamic acid ester (A1-1) (10 g) | Phenolic resin (A3-1) (3 g) | 4, 4', 4", 4'"-(1, 4-phenylenedimethylidene) tetrakisphenol (absorption maximum wavelength: 440 nm) (3.5 g) | — | GBL (50 g) |
| Example 2 | Polyamic acid ester (A1-1) (10 g) | Phenolic resin (A3-1) (3 g) | 4, 4', 4"-methylidenetrisphenol (absorption maximum wavelength: 460 nm) (3.5 g) | — | GBL (50 g) |
| Example 3 | Polyamic acid ester (A1-1) (10 g) | Polyhydroxystyrene resin (A3-3) (3 g) | 4, 4', 4"-methylidenetrisphenol (absorption maximum wavelength: 460 nm) (3.5 g) | — | GBL (50 g) |
| Example 4 | Cardo resin (A2-1) (10 g) | Phenolic resin (A3-1) (3 g) | 4, 4', 4"-methylidenetrisphenol (absorption maximum wavelength: 460 nm) (3.5 g) | — | GBL (50 g) |
| Example 5 | Polyamic acid ester (A1-1) (10 g) | Phenolic resin (A3-2) (3 g) | 4, 4', 4"-methylidenetrisphenol (absorption maximum wavelength: 460 nm) (3.5 g) | — | GBL (50 g) |
| Example 6 | Polyamic acid ester (A1-1) (10 g) | Polyhydroxystyrene resin (A3-4) (3 g) | 4, 4', 4"-methylidenetrisphenol (absorption maximum wavelength: 460 nm) (3.5 g) | — | GBL (50 g) |

TABLE 2

| | Light transmittance properties | |
|---|---|---|
| | Light transmittance (%) at wavelength within 365-436 nm before heat treatment | Light transmittance (%) at wavelength within 350-460 nm after heat treatment |
| Example 1 | A (≥50%) | A (≤4.2%) |
| Example 2 | A (≥50%) | A (≤4.3%) |
| Example 3 | A (≥50%) | A (≤4.5%) |
| Example 4 | A (≥50%) | A (≤4.3%) |
| Example 5 | A (≥50%) | A (≤4.9%) |
| Example 6 | A (≥50%) | A (≤4.9%) |

TABLE 3

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Comparative Example 1 | Polyamic acid ester (A1-1) (10 g) | — | 4, 4', 4"-methylidenetrisphenol (absorption maximum wavelength: 460 nm) (3.5 g) | — | GBL (50 g) | — |
| Comparative Example 2 | — | Phenolic resin (A3-1) (10 g) | — | — | GBL (50 g) | — |
| Comparative Example 3 | — | Polyhydroxystyrene resin (A3-3) (10 g) | — | — | GBL (50 g) | — |
| Comparative Example 4 | Polyamic acid ester (A1-1) (10 g) | — | 4, 4', 4"-methylidenetrisphenol (absorption maximum wavelength: 460 nm) (3.5 g) | — | GBL (50 g) | Tinuvin ® Carboprotect (absorption maximum wavelength: 378 nm) (2 g) |
| Comparative Example 5 | Cardo resin (A2-1) (10 g) | — | 4, 4', 4"-methylidenetrisphenol (absorption maximum wavelength: 460 nm) (3.5 g) | — | GBL (50 g) | — |
| Comparative Example 6 | — | Phenolic resin (A3-2) (10 g) | — | — | GBL (50 g) | — |
| Comparative Example 7 | — | Polyhydroxystyrene resin (A3-4) (10 g) | — | — | GBL (50 g) | — |

TABLE 4

| | Light transmittance properties | |
|---|---|---|
| | Light transmittance (%) at wavelength within 365-436 nm before heat treatment | Light transmittance (%) at wavelength within 350-460 nm after heat treatment |
| Comparative Example 1 | A (≥50%) | C (>5.0% in some range) |
| Comparative Example 2 | A (≥50%) | C (>5.0% in some range) |
| Comparative Example 3 | A (≥50%) | C (>5.0% in some range) |
| Comparative Example 4 | C (≤50% in some range) | A (≤4.3%) |
| Comparative Example 5 | A (≥50%) | C (>5.0% in some range) |
| Comparative Example 6 | A (≥50%) | C (>5.0% in some range) |
| Comparative Example 7 | A (≥50%) | C (>5.0% in some range) |

In Each of Example 2 to 6 which were resin compositions each contained (A1) a polyimide, a polybenzoxazole, a polyimide precursor or a polybenzoxazole precursor or (A2) a resin having such a backbone structure that two cyclic structures are bonded to a cyclic-structure-constituting quaternary carbon atom, (A3) a phenolic resin and/or a polyhydroxystyrene resin, (B) a thermally color-developing compound and (D) a solvent, wherein the component (A3) was contained in an amount of 5 to 50 parts by weight inclusive relative to 100 parts by weight of the component (A1), the transmittance at a wavelength within the range from 365 to 436 nm before the heat treatment was 50% or more. In each of Example 2 to 6, the transmittance at a wavelength within the range from 350 to 460 nm after the heat treatment was 5.0% or less. In each of Comparative Examples 1 to 2 in which the component (A3) was not contained and Comparative Examples 3 to 6 in which the component (A1) and the component (B) were not contained, the transmittance at a wavelength within the range from 365 to 436 nm before the heat treatment was 50% or more. However, the transmittance at a wavelength within the range from 350 to 460 nm after the heat treatment was higher than 5.0% in some range. In Comparative Example 7 in which a compound having a maximum absorption wavelength of 378 nm was contained, the transmittance at a wavelength within the range from 365 to 436 nm before the heat treatment was lower than 50%.

Example 7

A polyamic acid ester (A1-1) (10 g), a phenolic resin (A3-1) (3 g), 4,4',4'',4'''-(1,4-phenylenedimethylidene)tetrakisphenol (maximum absorption wavelength: 440 nm) (3.5 g) which was a thermally color-developing compound and the quinone diazide compound (C-1) (4.0 g) produced in Synthesis Example 8 were weighed and then dissolved in GBL (50 g) to produce a varnish of a polyimide precursor composition. The varnish was used to evaluate photosensitiveness, and the sensitivity was 120 mJ/cm². The formation of scums was not observed after the development. The transmittance at a wavelength within the range from 350 to 460 nm after the heat treatment was 4.2% or less.

Examples 8 to 27, Comparative Examples 8 to 17

Varnishes were produced in the same procedure as in Example 7, except that the types and amounts of the compounds were as shown in Tables 5-1, 5-2 and 7. The names and the structures of the compounds shown in Tables 5-1 and 5-2 are as follows.

Component (F): HMOM-TPHAP (product name, manufactured by Honshu Chemical Industry Co., Ltd.)

[Chemical formula 19]

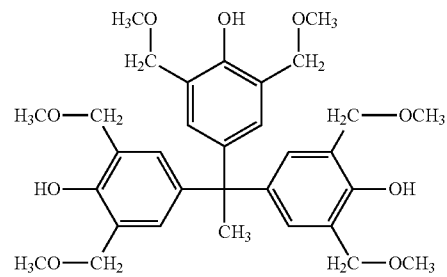

Each of the varnishes was used to evaluate photosensitive and measure transmittances before and after a heat treatment. The evaluation results are shown in Tables 6 and 8.

TABLE 5-1

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Example 7 | Polyamic acid ester (A1-1) (10 g) | Phenolic resin (A3-1) (3 g) | 4, 4', 4'', 4'''-(1, 4-phenylenedimethylidene) tetrakisphenol (absorption maximum wavelength: 440 nm) (3.5 g) | quinonediazide compound (C-1) (4 g) | GBL (50 g) | — |
| Example 8 | Polyamic acid ester (A1-1) (10 g) | Phenolic resin (A3-1) (3 g) | 4-[bis(4-hydroxyphenyl) methyl]-2-methoxyphenol (absorption maximum wavelength: 470 nm) (3.5 g) | quinonediazide compound (C-1) (4 g) | GBL (50 g) | — |
| Example 9 | Polyamic acid ester (A1-1) (10 g) | Phenolic resin (A3-1) (3 g) | 4, 4', 4''-methylidenetrisphenol (absorption maximum wavelength: 460 nm) (3.5 g) | quinonediazide compound (C-1) (4 g) | GBL (50 g) | — |
| Example 10 | Polyamic acid ester (A1-1) (10 g) | Polyhydroxystyrene resin (A3-3) (3 g) | 4, 4', 4''-methylidenetrisphenol (absorption maximum wavelength: 460 nm) (3.5 g) | quinonediazide compound (C-1) (4 g) | GBL (50 g) | — |
| Example 11 | Polyamic acid ester (A1-1) (10 g) | Phenolic resin (A3-1) (3 g) | 4, 4', 4''-methylidenetrisphenol (absorption maximum wavelength: 460 nm) (3.5 g) | quinonediazide compound (C-1) (4 g) | GBL (50 g) | Oil Yellow 5001 (absorption maximum wavelength: 480 nm) (1.5 g) |

TABLE 5-1-continued

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Example 12 | Polyamic acid ester (A1-1) (10 g) | Phenolic resin (A3-1) (1 g) | 4, 4', 4"-methylidenetrisphenol (absorption maximum wavelength: 460 nm) (3.5 g) | quinonediazide compound (C-1) (4 g) | GBL (50 g) | — |
| Example 13 | Polyamic acid ester (A1-1) (10 g) | Phenolic resin (A3-1) (4 g) | 4, 4', 4"-methylidenetrisphenol (absorption maximum wavelength: 460 nm) (3.5 g) | quinonediazide compound (C-1) (4 g) | GBL (50 g) | — |
| Example 14 | Polyamic acid ester (A1-1) (10 g) | Phenolic resin (A3-1) (2 g) Polyhydroxystyrene resin (A3-3) (2 g) | 4, 4', 4"-methylidenetrisphenol (absorption maximum wavelength: 460 nm) (3.5 g) | quinonediazide compound (C-1) (4 g) | GBL (50 g) | — |
| Example 15 | Polyamic acid ester (A1-1) (10 g) | Phenolic resin (A3-1) (3 g) | 4, 4', 4"-methylidenetrisphenol (absorption maximum wavelength: 460 nm) (3.5 g) | quinonediazide compound (C-1) (4 g) | GBL (50 g) | Valifast Red 3311 (absorption maximum wavelength: 525 nm) (2.5 g) Valifast Blue 2620 (absorption maximum wavelength: 690 nm) (2.5 g) |
| Example 16 | Polyamic acid ester (A1-1) (10 g) | Phenolic resin (A3-1) (3 g) | 4, 4', 4"-methylidenetrisphenol (absorption maximum wavelength: 460 nm) (3.5 g) | quinonediazide compound (C-1) (4 g) | GBL (50 g) | Plast Red 8380 (absorption maximum wavelength: 550 nm, 590 nm) (3 g) Plast Blue DB463 (absorption maximum wavelength: 590 nm, 630 nm) (3.5 g) |

TABLE 5-2

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Example 17 | Cardo resin (A2-1) (10 g) | Phenolic resin (A3-1) (3 g) | 4, 4', 4"-methylidenetrisphenol (absorption maximum wavelength: 460 nm) (3.5 g) | quinonediazide compound (C-1) (4 g) | GBL (50 g) | — |
| Example 18 | Polyamic acid ester (A1-1) (10 g) | Phenolic resin (A3-1) (3 g) | 4, 4', 4"-methylidenetrisphenol (absorption maximum wavelength: 460 nm) (3.5 g) | quinonediazide compound (C-1) (4 g) | GBL (50 g) | (F) MOM—TPHAP (1.5 g) |
| Example 19 | Polyamic acid ester (A1-1) (10 g) | Phenolic resin (A3-2) (3 g) | 4, 4', 4"-methylidenetrisphenol (absorption maximum wavelength: 460 nm) (3.5 g) | quinonediazide compound (C-1) (4 g) | GBL (50 g) | — |
| Example 20 | Polyamic acid ester (A1-1) (10 g) | Polyhydroxystyrene resin (A3-4) (3 g) | 4, 4', 4"-methylidenetrisphenol (absorption maximum wavelength: 460 nm) (3.5 g) | quinonediazide compound (C-1) (4 g) | GBL (50 g) | — |
| Example 21 | Polyamic acid ester (A1-1) (10 g) | Phenolic resin (A3-2) (3 g) | 4, 4', 4"-methylidenetrisphenol (absorption maximum wavelength: 460 nm) (2.5 g) | quinonediazide compound (C-1) (4 g) | GBL (50 g) | (E) Plast Yellow 8070 (absorption maximum wavelength: 445 nm) (1.5 g) |
| Example 22 | Polyamic acid ester (A1-1) (10 g) | Polyhydroxystyrene resin (A3-3) (3 g) | 4, 4', 4"-methylidenetrisphenol (absorption maximum wavelength: 460 nm) (2.5 g) | quinonediazide compound (C-1) (4 g) | GBL (50 g) | (E) Plast Yellow 8070 (absorption maximum wavelength: 445 nm) (1.5 g) |
| Example 23 | Polyamic acid ester (A1-1) (10 g) | Polyhydroxystyrene resin (A3-4) (3 g) | 4, 4', 4"-methylidenetrisphenol (absorption maximum wavelength: 460 nm) (2.5 g) | quinonediazide compound (C-1) (4 g) | GBL (50 g) | (E) Plast Yellow 8070 (absorption maximum wavelength: 445 nm) (1.5 g) |
| Example 24 | Polyamic acid ester (A1-1) (10 g) | Phenolic resin (A3-1) (3 g) | 4, 4', 4"-methylidenetrisphenol (absorption maximum wavelength: 460 nm) (3.5 g) | quinonediazide compound (C-1) (4 g) | GBL (50 g) | (E) Plast Yellow 8070 (absorption maximum wavelength: 445 nm) (1.5 g) Valifast Red 3311 (absorption maximum wavelength: 525 nm) (1.5 g) Valifast Blue 2620 (absorption maximum wavelength: 690 nm) (2.0 g) |
| Example 25 | Polyamic acid ester (A1-1) (10 g) | Phenolic resin (A3-2) (3 g) | 4, 4', 4"-methylidenetrisphenol (absorption maximum wavelength: 460 nm) (3.5 g) | quinonediazide compound (C-1) (4 g) | GBL (50 g) | (E) Plast Yellow 8070 (absorption maximum wavelength: 445 nm) (1.5 g) Valifast Red 3311 (absorption maximum wavelength: 525 nm) (1.5 g) Valifast Blue 2620 (absorption maximum wavelength: 690 nm) (2.0 g) |

TABLE 5-2-continued

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Example 26 | Polyamic acid ester (A1-1) (10 g) | Polyhydroxystyrene resin (A3-3) (3 g) | 4, 4', 4"-methylidenetrisphenol (absorption maximum wavelength: 460 nm) (3.5 g) | quinonediazide compound (C-1) (4 g) | GBL (50 g) | (E) Plast Yellow 8070 (absorption maximum wavelength: 445 nm) (1.5 g) Valifast Red 3311 (absorption maximum wavelength: 525 nm) (1.5 g) Valifast Blue 2620 (absorption maximum wavelength: 690 nm) (2.0 g) |
| Example 27 | Polyamic acid ester (A1-1) (10 g) | Polyhydroxystyrene resin (A3-4) (3 g) | 4, 4', 4"-methylidenetrisphenol (absorption maximum wavelength: 460 nm) (3.5 g) | quinonediazide compound (C-1) (4 g) | GBL (50 g) | (E) Plast Yellow 8070 (absorption maximum wavelength: 445 nm) (1.5 g) Valifast Red 3311 (absorption maximum wavelength: 525 nm) (1.5 g) Valifast Blue 2620 (absorption maximum wavelength: 690 nm) (2.0 g) |

TABLE 6

| | Post-development properties | | Post-heat treatment properties Light transmittance |
|---|---|---|---|
| | Sensitivity (i line) (mJ/cm$^2$) | Surface roughness after development | (%) at wavelength within 350-460 nm |
| Example 7 | 120 | A | A (≤4.2%) |
| Example 8 | 120 | A | A (≤4.5%) |
| Example 9 | 90 | A | A (≤4.3%) |
| Example 10 | 90 | A | A (≤4.4%) |
| Example 11 | 120 | A | S (≤3.9%) |
| Example 12 | 100 | A | A (≤4.8%) |
| Example 13 | 80 | A | S (≤3.4%) |
| Example 14 | 90 | A | S (≤3.7%) |
| Example 15 | 400 | A | A (≤4.6%) |
| Example 16 | 200 | A | A (≤4.7%) |
| Example 17 | 120 | A | A (≤4.3%) |
| Example 18 | 90 | A | A (≤4.5%) |
| Example 19 | 90 | A | A (≤4.9%) |
| Example 20 | 90 | A | A (≤4.9%) |
| Example 21 | 120 | A | A (≤4.6%) |
| Example 22 | 120 | A | S (≤3.9%) |
| Example 23 | 120 | A | A (≤4.7%) |
| Example 24 | 200 | A | S (≤3.7%) |
| Example 25 | 200 | A | A (≤4.4%) |
| Example 26 | 200 | A | S (≤3.8%) |
| Example 27 | 200 | A | A (≤4.5%) |

TABLE 7

| | Components of resin composition | | | | | |
|---|---|---|---|---|---|---|
| | Component (A1, A2) (content) | Component (A3) (content) | Component (B) (content) | Component (C) (content) | Solvent (D) (content) | Others (content) |
| Comparative Example 8 | Polyamic acid ester (A1-1) (10 g) | — | 4, 4', 4"-methylidenetrisphenol (absorption maximum wavelength: 460 nm) (3.5 g) | quinonediazide compound (C-1) (4 g) | GBL (50 g) | — |
| Comparative Example 9 | — | Phenolic resin (A3-1) (10 g) | — | quinonediazide compound (C-1) (4 g) | GBL (50 g) | — |
| Comparative Example 10 | — | Polyhydroxystyrene resin (A3-3) (10 g) | — | quinonediazide compound (C-1) (4 g) | GBL (50 g) | — |
| Comparative Example 11 | Polyamic acid ester (A1-1) (10 g) | — | 4, 4', 4"-methylidenetrisphenol (absorption maximum wavelength: 460 nm) (3.5 g) | quinonediazide compound (C-1) (4 g) | GBL (50 g) | Valifast Red 3311 (absorption maximum wavelength: 525 nm) (3 g) Valifast Blue 2620 (absorption maximum wavelength: 690 nm) (3 g) |
| Comparative Example 12 | Polyamic acid ester (A1-1) (10 g) | — | 4, 4', 4"-methylidenetrisphenol (absorption maximum wavelength: 460 nm) (3.5 g) | quinonediazide compound (C-1) (4 g) | GBL (50 g) | Tinuvin ® Carboprotect (absorption maximum wavelength: 378 nm) (2 g) |

TABLE 7-continued

| | Component (A1, A2) (content) | Component (A3) (content) | Component (B) (content) | Component (C) (content) | Solvent (D) (content) | Others (content) |
|---|---|---|---|---|---|---|
| Comparative Example 13 | Polyamic acid ester (A1-1) (10 g) | Phenolic resin (A3-1) (5.5 g) | 4, 4', 4"-methylidenetrisphenol (absorption maximum wavelength: 460 nm) (3.5 g) | quinonediazide compound (C-1) (4 g) | GBL (50 g) | — |
| Comparative Example 14 | Polyamic acid ester (A1-1) (10 g) | Phenolic resin (A3-1) (10 g) | 4, 4', 4"-methylidenetrisphenol (absorption maximum wavelength: 460 nm) (3.5 g) | quinonediazide compound (C-1) (4 g) | GBL (50 g) | — |
| Comparative Example 15 | Cardo resin (A2-1) (10 g) | — | 4, 4', 4"-methylidenetrisphenol (absorption maximum wavelength: 460 nm) (3.5 g) | quinonediazide compound (C-1) (4 g) | GBL (50 g) | — |
| Comparative Example 16 | — | Phenolic resin (A3-2) (10 g) | — | quinonediazide compound (C-1) (4 g) | GBL (50 g) | — |
| Comparative Example 17 | — | Polyhydroxystyrene resin (A3-4) (10 g) | — | quinonediazide compound (C-1) (4 g) | GBL (50 g) | — |

TABLE 8

| | Post-development properties | | Post-heat treatment properties Light transmittance |
|---|---|---|---|
| | Sensitivity (i line) (mJ/cm$^2$) | Surface roughness after development | (%) at wavelength within 350-460 nm |
| Comparative Example 8 | 90 | A | C (>5.0% in some range) |
| Comparative Example 9 | 90 | A | C (>5.0% in some range) |
| Comparative Example 10 | 90 | A | C (>5.0% in some range) |
| Comparative Example 11 | 400 | A | C (>5.0% in some range) |
| Comparative Example 12 | >1000 | A | A (≤4.3%) |
| Comparative Example 13 | 80 | C | S (≤3.5%) |
| Comparative Example 14 | 80 | C | S (≤3.2%) |
| Comparative Example 15 | 110 | A | C (>5.0% in some range) |
| Comparative Example 16 | 90 | A | C (>5.0% in some range) |
| Comparative Example 17 | 90 | A | C (>5.0% in some range) |

In each of Examples 7 to 14, 17 to 23 which were resin compositions each containing (A1) a polyimide, a polybenzoxazole, a polyimide precursor or a polybenzoxazole precursor or (A2) a resin having such a backbone structure that two cyclic structures are bonded to a cyclic-structure-constituting quaternary carbon atom, (A3) a phenolic resin and/or a polyhydroxystyrene resin, (B) a thermally color-developing compound, (C) a photo-acid generator, (D) a solvent and other component wherein the component (A3) was contained in an amount of 5 to 50 parts by weight inclusive relative to 100 parts by weight of the component (A1), and having positive-working photosensitivity, the sensitivity was 120 mJ/cm$^2$ or less. The formation of scums after the development was not observed. The transmittance at a wavelength within the range from 350 to 460 nm after the heat treatment was 5.0% or less. In each of Example 15, 16, 24 to 27 in each of which a combination of two or three types of dyes having different maximum absorption wavelengths from one another was used as a dye component that served as the component (E), the sensitivity was 400 mJ/cm$^2$ or less. The formation of scums after the heat treatment was not observed. The transmittance at a wavelength within the range from 350 to 460 nm after the heat treatment was 5.0% or less. Because of the use of a combination of the three types of dyes having different maximum absorption wavelengths from one another, the finished products were blackened and the OD values were 0.5 or less.

In each of Comparative Examples 8, 11 to 12, 15 in each of which the component (A3) was not contained and Comparative Examples 9 to 10 and 16 to 17 in each of which the component (A1) and the component (B) were not contained, the transmittance after the heat treatment was higher than 5% in some range. In Comparative Example 12 in which the compound having a maximum absorption wavelength of 378 nm was contained, light having the same wavelength as that of exposing light was absorbed by the compound having a maximum absorption wavelength of 378 nm and therefore the sensitivity was deteriorated. In Comparative Examples 13 to 14 in each of which the amount of the phenolic resin (A3) was larger than 50 parts by weight relative to 100 parts by weight of the component (A1), the formation of scums was observed during development.

Example 28

Bottom-gate-type oxide TFTs, which were designed in such a manner as to have a resolution of 200 ppi, were formed on a glass substrate, and then an insulating film made from $Si_3N_4$ was formed in such a manner as to cover the TFTs. Subsequently, contact holes were formed in the insulating film, and then wiring lines (height: 1.0 μm), which were to be connected to the TFTs through the contact holes, were formed on the insulating film. The wiring lines were intended to connect the TFTs to each other or to connect the TFTs to organic EL elements which were formed in the latter step.

Subsequently, in order to planarize projections and depressions produced as the result of the formation of the wiring lines, a planarization film was formed on the insulating film in such a manner as to fill the projections and depressions produced as the result of the formation of the wiring lines. The formation of the planarization film on the insulating film was carried out by spin-coating a varnish of a photosensitive polyimide precursor compositions produced in each of Examples 7 to 27 onto a substrate, then prebaking the varnish on a hot plate at 120° C. for 2 minutes, and then subjecting the prebaked film to a heat treatment at 250° C. for 60 minutes. The coatability during the application of the varnish was good, and wrinkling or cracking did not occur in a heat-resistant resin film produced after the exposure to light, development and burning. The average difference in level of the wiring lines was 500 nm, and the film thickness of the planarization film was 2000 nm.

The photodeterioration upon the irradiation of oxide TFT devices, each having the planarization film provided therein, with light under the application of negative stress was measured. The occurrence of change in a threshold voltage (the shift of a threshold value) before and after the irradiation with light was prevented, and therefore a photodeterioration prevention effect was confirmed.

Example 29

Bottom-gate-type oxide TFTs, which were designed in such a manner as to have a resolution of 200 ppi, were formed on a glass substrate, and then an insulating film made from $Si_3N_4$ was formed in such a manner as to cover the TFTs. Subsequently, contact holes were formed in the insulating film, and then wiring lines (height: 1.0 μm), which were to be connected to the TFTs through the contact holes, were formed on the insulating film. The wiring lines were intended to connect the TFTs to each other or to connect the TFTs to organic EL elements which were formed in the latter step.

Subsequently, in order to planarize projections and depressions produced as the result of the formation of the wiring lines, a planarization film was formed on the insulating film in such a manner as to fill the projections and depressions produced as the result of the formation of the wiring lines. The formation of the planarization film on the insulating film was carried out by spin-coating a varnish of a photosensitive polyimide precursor compositions produced in each of Examples 7 to 27 onto a substrate, then prebaking the varnish on a hot plate at 120° C. for 2 minutes, and then subjecting the prebaked film to a heat treatment at 250° C. for 60 minutes. The coatability during the application of the varnish was good, and wrinkling or cracking did not occur in a heat-resistant resin film produced after the exposure to light, development and burning. The average difference in level of the wiring lines was 500 nm, and the film thickness of the planarization film was 2000 nm.

Subsequently, top-emission-type organic EL elements were formed on the planarization film. First, bottom electrodes each made from ITO were formed on the planarization film by sputtering in such a manner as to be connected to the wiring lines through the contact holes. Subsequently, a resist was applied and then prebaked, then light was emitted over the prebaked product through a mask having a desired pattern, and then the light-exposed product was developed. A pattern processing was carried out using the resist pattern as a mask by wet etching using an ITO etchant. Subsequently, the resist pattern was stripped with a resist stripping solution (a mixed solution of monoethanolamine and DMSO (dimethyl sulfoxide)). The bottom electrodes thus produced correspond to anodes for the organic EL elements.

Subsequently, an insulating layer having such a shape as to cover the peripheries of the bottom electrodes was formed. For the material of the insulating layer, a varnish of a photosensitive polyimide precursor composition produced in each of Examples 7 to 27 was used. When the insulating layer is provided, it becomes possible to prevent the occurrence of short out between the bottom electrode and an upper electrode that were formed in the latter step. The insulating layer was patterned, and was then subjected to a heat treatment at 250° C. for 60 minutes to form an insulating layer.

Subsequently, a hole-transport layer, a red organic light-emitting layer, a green organic light-emitting layer, a blue organic light-emitting layer and an electron-transport layer were formed in this order by deposition through a desired pattern mask in a vacuum evaporator. Subsequently, an upper electrode made from Al was formed over the whole area of the upper surface of the substrate. The upper electrode corresponds to a cathode of the organic EL elements. The substrate thus produced was removed from the evaporator, and was then sealed by adhering to a glass substrate for sealing use using an ultraviolet-ray-curable epoxy resin.

In this manner, an active-matrix-type organic EL display device, in which TFTs for driving organic EL elements were connected to the organic EL elements, was produced. When a voltage was applied to the device through a driving circuit, good emission of light was observed.

Next, the invention according to the second aspect will be described by way of examples. However, the present invention is not limited by these examples. The evaluations of the resin compositions in the examples were carried out by the methods mentioned below.

(1) Measurement of Maximum Absorption Wavelength of (I) Compound whose Maximum Absorption Wavelength Shifts by Heat Treatment The component (I) was dissolved in gamma-butyrolactone, and the absorption was measured using a spectrophotometer MultiSpec-150 (manufactured by Shimadzu Corporation).

(2) Evaluation of Light Transmittance of Resin Composition

A resin composition (referred to as a "varnish", hereinafter) was spin-coated on a 5-cm-square glass substrate in such a manner that the film thickness of the resultant film after a heat treatment became 3.0 μm, and the film was prebaked at 120° C. for 2 minutes. Subsequently, the film was cured under nitrogen stream (oxygen concentration: 20 ppm or less) at 250° C. for 60 minutes using a high-temperature clean oven CLH-21CD(V)-S (manufactured by Koyo Thermo Systems Co., Ltd.) to produce a heat-resistant resin film. The film thickness of the heat-resistant resin film was measured using SURFCOM 1400D (manufactured by Tokyo Seimitsu Co., Ltd.) under the assumption that the refractive index was 1.629. The prebaked film and the cured film thus produced were measured with respect to transmission spectra in a wavelength range of 300 to 800 nm using an ultraviolet and visible spectrophotometer "MultiSpec-1500" (manufactured by Shimadzu Corporation). A prebaked film having such a result that a light transmittance at a wavelength of 365 to 436 nm was less than 50% was rated as "insufficient (C)", and a prebaked film having such a result that a light transmittance at a wavelength of 365 to 436 nm was 50% or more was rated as "good (A)". A cured film having such a result that a light transmittance at a wavelength of 365 to 436 nm was more than 10% was rated as "insufficient (C)", and a cured film having such a result that a light transmittance at a wavelength of 365 to 436 nm was 10% or less was rated as "good (A)". When the heat-resistant resin film does not have a thickness of 3.0 μm after a heat treatment, the light transmittance of the heat-resistant resin film can be determined by converting the thickness of the measured heat-resistant resin film to 3.0 μm in accordance with the Lambert's law, and the transmission spectra were determined with respect to the heat-resistant resin film having a thickness of 3.0 µm.

(3) Formation of Relief Pattern

A varnish produced in each of Examples and Comparative Examples was spin-coated on an 8-inch-square silicon wafer, and then the varnish was subjected to a heat treatment (prebaking) at 120° C. for 2 minutes using a hot plate (a coater/developer "Act-8", manufactured by Tokyo Electron Limited) to produce a prebaked film having a thickness of 3.7 µm. The prebaked film was exposed to light at a light exposure amount of 0 to 1000 mJ/cm$^2$ at steps of 20 mJ/cm$^2$ using an i line stepper (NSR-2005i9C, manufactured by Nikon Corporation) or a mask aligner (PEM-6M, manufactured by Union Optical Co., LTD.). Line & space patterns employed in the exposure to light, were as follows: 1, 2, 3, 4, 5, 6, 7, 8, 9, 10, 15, 20, 30, 50 and 100 µm. After the exposure to light, the resultant film was developed with a 2.38-wt % aqueous tetramethylammonium (TMAH) solution (ELM-D, manufactured by Mitsubishi Gas Chemical Company, Inc.) for 40 to 100 seconds, and was then rinsed with purified water to form a relief pattern. The film thicknesses after the prebaking and the development were measured using an interferometer type film thickness measurement system Lambda Ace STM-602 (manufactured by Dainippon Screen Manufacturing Co. Ltd.) under the assumption that the refractive index was 1.629.

(4) Calculation of Sensitivity

A minimum light exposure amount at which 50 µm-wide line-and-space (L/S) patterns were formed at a ratio of 1:1 after exposure to light and development was determined as a value of sensitivity.

(Synthesis Example 1) Compound whose Maximum Absorption Wavelength Shifts by Heat Treatment (I-1

Under a dry nitrogen stream, tetrahydrofuran (abbreviated as "THF", hereinafter) (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, acetic anhydride (4.08 g) (0.040 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-1, maximum absorption wavelength: 282 nm).

(Synthesis Example 2) Compound whose Maximum Absorption Wavelength Shifts by Heat Treatment (I-2

Under a dry nitrogen stream, THF (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, acetic anhydride (2.04 g) (0.020 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-2, maximum absorption wavelength: 322 nm).

[Chemical formula 21]

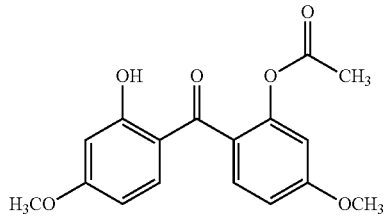

(Synthesis Example 3) Compound whose Maximum Absorption Wavelength Shifts by Heat Treatment (I-3

Under a dry nitrogen stream, N-methyl pyrrolidone (abbreviated as "NMP", hereinafter) (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, di-tert-butyl dicarbonate (abbreviated as "t-Boc$_2$O", hereinafter) (8.73 g) (0.040 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-3, maximum absorption wavelength: 282 nm).

[Chemical formula 20]

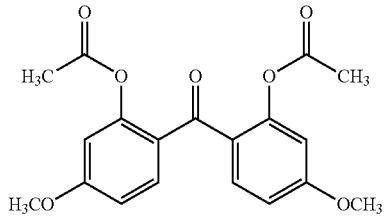

[Chemical formula 22]

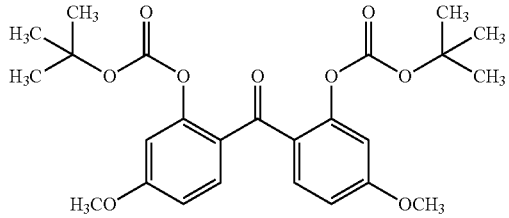

(Synthesis Example 4) Compound whose Maximum Absorption Wavelength Shifts by Heat Treatment (I-4

Under a dry nitrogen stream, NMP (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, t-Boc$_2$O (4.37 g) (0.020 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-4, maximum absorption wavelength: 324 nm).

[Chemical formula 23]

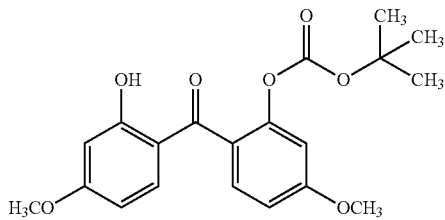

(Synthesis Example 5) Compound whose Maximum Absorption Wavelength Shifts by Heat Treatment (I-5

Under a dry nitrogen stream, NMP (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, butyl isocyanate (3.96 g) (0.040 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-5, maximum absorption wavelength: 280 nm).

[Chemical formula 24]

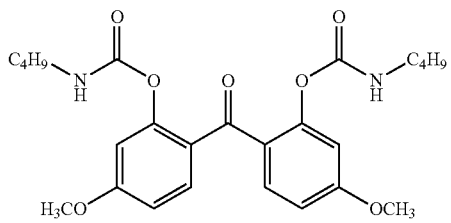

(Synthesis Example 6) Compound whose Maximum Absorption Wavelength Shifts by Heat Treatment (I-6)

Under a dry nitrogen stream, NMP (50 g) was added to 2,2'-dihydroxy-4,4'-dimethoxybenzophenone (product name: SEESORB107, manufactured by Shipro Kasei Kaisha, Ltd., maximum absorption wavelength: 347 nm) (5.49 g) (0.020 mole), and the resultant solution was stirred at 40° C. to dissolve in each other. Subsequently, butyl isocyanate (1.98 g) (0.020 mole) and N,N-dimethyl-4-aminopyridine (0.24 g) (0.002 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-6, maximum absorption wavelength: 325 nm).

[Chemical formula 25]

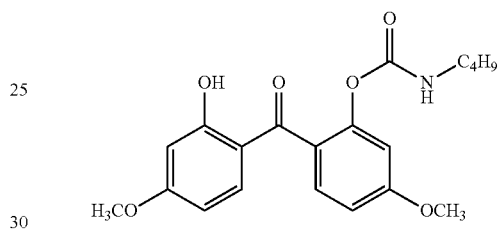

(Synthesis Example 7) Compound whose Maximum Absorption Wavelength Shifts by Heat Treatment (I-7)

Under a dry nitrogen stream, NMP (50 g) was added to 2,2',4,4'-tetrahydroxylbenzophenone (product name: SEESORB106, manufactured by Shipro Kasei Kaisha, Ltd., maximum absorption wavelength: 350 nm) (4.92 g) (0.020 mole), and the resultant solution was stirred at 40° C. to dissolve in each other. Subsequently, acetic anhydride (8.17 g) (0.080 mole) and N,N-dimethyl-4-aminopyridine (0.48 g) (0.004 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-7, maximum absorption wavelength: 280 nm).

[Chemical formula 26]

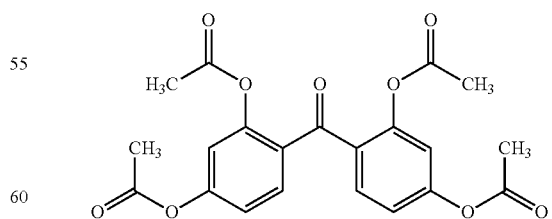

(Synthesis Example 8) Compound whose Maximum Absorption Wavelength Shifts by Heat Treatment (I-8)

Under a dry nitrogen stream, NMP (50 g) was added to 2-(2'-hydroxy-4'-octyloxyphenyl)benzotriazole (product name: SEESORB707, manufactured by Shipro Kasei Kaisha, Ltd., maximum absorption wavelength: 345 nm) (6.79 g) (0.020 mole), and the resultant solution was stirred at 40° C. to dissolve in each other. Subsequently, acetic anhydride (2.04 g) (0.020 mole) and N,N-dimethyl-4-aminopyridine (0.48 g) (0.004 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-8, maximum absorption wavelength: 315 nm).

[Chemical formula 27]

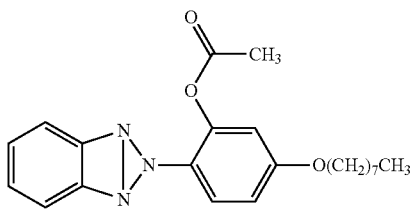

(Synthesis Example 9) Compound whose Maximum Absorption Wavelength Shifts by Heat Treatment (I-9)

Under a dry nitrogen stream, NMP (50 g) was added to 2,4-bis[2-hydroxy-4-butoxyphenyl]-6-(2,4-dibutoxyphenyl)-1,3-5-triazine (product name: TINUVIN460, manufactured by BASF, maximum absorption wavelength: 350 nm) (12.6 g) (0.020 mole), and the resultant solution was stirred at 40° C. to dissolve in each other. Subsequently, acetic anhydride (4.08 g) (0.040 mole) and N,N-dimethyl-4-aminopyridine (0.48 g) (0.004 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (1-9, maximum absorption wavelength: 285 nm).

[Chemical formula 28]

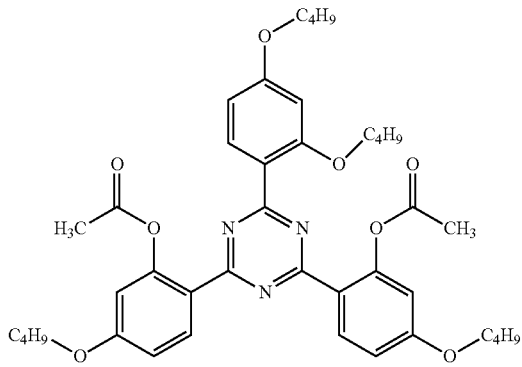

(Synthesis Example 10) Compound whose Maximum Absorption Wavelength Shifts by Heat Treatment (I-10)

Under a dry nitrogen stream, THF (50 g) was added to 4,5-dihydroxyanthraquinone-2-carboxylic acid (maximum absorption wavelength: 430 nm) (5.68 g) (0.020 mole), and the resultant solution was stirred at 40° C. to dissolve in each other. Subsequently, acetic anhydride (4.08 g) (0.040 mole) and N,N-dimethyl-4-aminopyridine (0.48 g) (0.004 mole) were added to the solution, and the resultant solution was stirred at 40° C. for 2 hours. After the completion of the stirring, the solution was introduced into water (1 L), and precipitates of a polymer solid material were collected by filtration. The precipitates were washed with water (500 mL) three times, and the collected polymer solid material was dried with a vacuum drier at 50° C. for 72 hours to produce a compound whose maximum absorption wavelength shifts by a heat treatment (I-10, maximum absorption wavelength: 338 nm).

[Chemical formula 29]

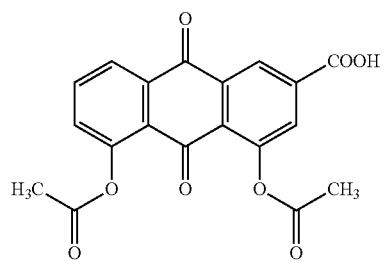

(Synthesis Example 11) Synthesis of Hydroxyl-Group-Containing Diamine Compound 2,2-Bis(3-amino-4-hydroxyphenyl) hexafluoropropane (manufactured by Central Glass Co., Ltd., abbreviated as "BAHF", hereinafter) (18.3 g) (0.05 mole) was dissolved in acetone (100 mL) and propylene oxide (manufactured by Tokyo Chemical Industry Co., Ltd.) (17.4 g) (0.3 mole), and the resultant solution was cooled to −15° C. To the resultant solution was dropwisely added a solution prepared by dissolving 3-nitrobenzoyl chloride (manufactured by Tokyo Chemical Industry Co., Ltd.) (20.4 g) (0.11 mole) in acetone (100 mL). After the completion of the dropwise addition, the solution was stirred at −15° C. for 4 hours and then warmed to room temperature. A precipitated white solid material was filtered off and then dried in vacuo at 50° C.

The white solid material thus produced (30 g) was introduced into a 300-mL stainless autoclave and was then dispersed in methyl cellosolve (250 mL), and then 5% palladium-carbon (manufactured by Wako Pure Chemical Industries, Ltd.) (2 g) was added thereto. Hydrogen was introduced into the reaction solution with a balloon to perform a reduction reaction at room temperature. After about 2 hours, it was confirmed that the balloon could not shrink any more, and the reaction was terminated. After the completion of the reaction, the reaction solution was filtered to remove the palladium compound that was a catalyst, and then the filtrate was concentrated with a rotary evaporator to produce a hydroxyl-group-containing diamine compound represented by the following formula.

[Chemical formula 17]

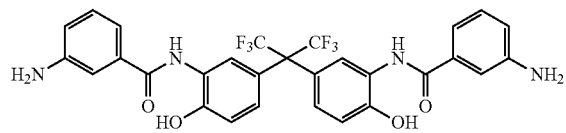

(Synthesis Example 12) Synthesis of Polyamic Acid Ester (A1-1)

Under a dry nitrogen stream, the hydroxyl-group-containing diamine (57.4 g) (0.095 mole) produced in Synthesis Example 11 and 1,3-bis(3-aminopropyl)tetramethyldisiloxane (abbreviated as "SiDA", hereinafter) (1.24 g) (0.005 mole) were dissolved in NMP (200 g). 4,4'-Oxydiphthalic anhydride (abbreviated as "ODPA", hereinafter) (31.0 g) (0.1 mole) was added to the solution, and the resultant solution was stirred at 40° C. for 2 hours. Subsequently, a solution prepared by diluting dimethylformamide dimethyl acetal (manufactured by Mitsubishi Rayon Co., Ltd., abbreviated as "DFA", hereinafter) (7.14 g) (0.06 mole) with NMP (5 g) was dropwisely added to the solution over 10 minutes. After the dropwise addition, the stirring of the resultant solution was continued 40° C. for 2 hours. After the completion of the stirring, the solution was introduced into water (2 L), and then precipitates of a polymer solid material were collected by filtration. The precipitates were further washed with water (2 L) three times, and then the collected polymer solid material was dried with a vacuum drier at 50° C. for 72 hours to produce a polyamic acid ester (A1-1).

(Synthesis Example 13) Synthesis of Quinone Diazide Compound (C-1)

Under a dry nitrogen stream, 4,4'-[1-[4-[1-(4-hydroxyphenyl-1)-1-methylethyl]phenyl]ethylidene]bisphenol (manufactured by Honshu Chemical Industry Co., Ltd., abbreviated as "TrisP-PA", hereinafter) (21.22 g) (0.05 mole) and 5-naphthoquinonediazidesulfonic acid chloride (NAC-5, manufactured by Toyo Gosei Co., Ltd) (26.8 g) (0.1 mole) were dissolved in 1,4-dioxane (450 g) at room temperature. Triethylamine (12.65 g) that was mixed with 1,4-dioxane (50 g) was dropwisely added to the solution in such a manner that the temperature in the system did not become 35° C. or higher. After the dropwise addition, the solution was stirred at 40° C. for 2 hours. A triethylamine salt was filtered off, and a filtrate was introduced into water. Subsequently, precipitates were collected by filtration and then washed with 1% aqueous hydrochloric acid (1 L). Subsequently, the washed product was further washed with water (2 L) two times. The precipitates were dried with a vacuum drier to produce a quinone diazide compound (C-1) represented by the following formula.

[Chemical formula 18]

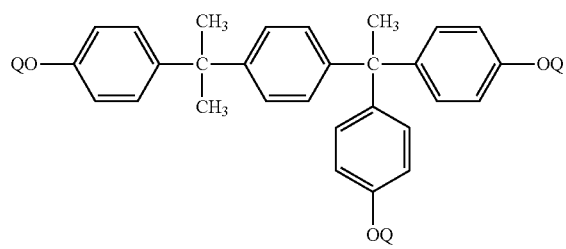

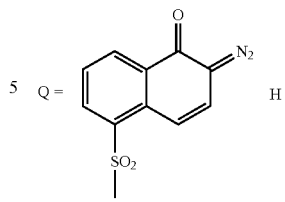

Example 1

The compound (I-1) (2 g) (maximum absorption wavelength: 282 nm) produced in Synthesis Example 1 and the polyamic acid ester (A1-1) (10 g) produced in Synthesis Example 12 were weighed and then dissolved in γ-butyrolactone (abbreviated as "GBL", hereinafter) (40 g) to produce a varnish of a polyimide precursor composition. The varnish was used to measure light transmittance, and the light transmittance at a wavelength within 365 to 436 nm before a heat treatment was 50% or more. The light transmittance at a wavelength within 350 to 378 nm after the heat treatment was 10% or less.

Examples 2 to 3, Comparative Examples 1 to 4

Varnishes were produced in the same procedure as in Example 1, except that the types and amounts of the compounds were as shown in Table 9. Each of the varnishes was used to measure the transmittances before and after a heat treatment. The evaluation results are shown in Table 10.

TABLE 9

| | Components of resin composition | | | | |
|---|---|---|---|---|---|
| | (A) Alkali-soluble resin (content) | (I) Compound of which maximum absorption wavelength shifts by heat treatment (content) | (C) Photo-acid generator (content) | (D) Solvent (content) | Other compound (content) |
| Example 1 | (A1-1) (10 g) | I-1 (2 g) | — | GBL (40 g) | — |
| Example 2 | (A1-1) (10 g) | I-2 (2 g) | — | GBL (40 g) | — |
| Example 3 | (A1-1) (10 g) | I-7 (2 g) | — | GBL (40 g) | — |
| Comparative Example 1 | (A1-1) (10 g) | — | — | GBL (40 g) | SEESORB 107 (1 g) |
| Comparative Example 2 | (A1-1) (10 g) | — | — | GBL (40 g) | SEESORB 106 (1 g) |
| Comparative Example 3 | (A1-1) (10 g) | — | — | GBL (40 g) | SEESORB 707 (1 g) |
| Comparative Example 4 | (A1-1) (10 g) | — | — | GBL (40 g) | TINUVIN 460 (1 g) |

TABLE 10

| | Absorption maximum wavelength of component (I) (nm) | Wavelength at which transmittance becomes 50% or more before heat treatment (nm) | Wavelength at which transmittance becomes 10% or less after heat treatment (nm) |
|---|---|---|---|
| Example 1 | 282 | A (365-436) | A (365-378) |
| Example 2 | 322 | A (365-436) | A (365-379) |
| Example 3 | 280 | A (365-436) | A (365-375) |
| Comparative Example 1 | — | C (395-436) | A (365-380) |
| Comparative Example 2 | — | C (400-436) | A (365-385) |
| Comparative Example 3 | — | C (390-436) | A (365-376) |
| Comparative Example 4 | — | C (395-436) | A (365-382) |

In each of Examples 2 to 3 which were resin compositions each containing (A) an alkali-soluble resin, (I) a compound whose maximum absorption wavelength shifts by a heat treatment and (D) a solvent, the transmittance at a wavelength within 365 to 436 nm before a heat treatment was 50% or more. The transmittance in some range having a wavelength of 380 nm or less among wavelengths within 365 to 436 nm after the heat treatment was 10% or less. In each of Comparative Examples 1 to 4 in each of which a component (I) was not contained and a compound having such a structure that a protecting group in a component (I) was removed was used, there was observed a range in which the transmittance was lower than 50% in the wavelength range of 365 to 436 nm.

Example 4

The compound (I-1) (2 g) (maximum absorption wavelength: 282 nm) produced in Synthesis Example 1, the polyamic acid ester (A1-1) (10 g) produced in Synthesis Example 12 and the quinone diazide compound (C-1) (3 g) produced in Synthesis Example 13 were weighed and then dissolved in γ-butyrolactone (abbreviated as "GBL", hereinafter) (40 g) to produce a varnish of a polyimide precursor composition. The varnish was used to evaluate photosensitiveness, and the sensitivity to i line was 280 mJ/cm² and the sensitivity to ghi line was 130 mJ/cm². The light transmittance at a wavelength within 365 to 378 nm after the heat treatment was 10% or less.

Examples 5 to 16, Comparative Examples 5 to 9

Varnishes were produced in the same procedure as in Example 4, except that the types and amounts of the compounds were as shown in Tables 11 and 13. Each of the varnishes was used to evaluate photosensitive and measure the transmittance after a heat treatment. The evaluation results are shown in Tables 12 and 14.

TABLE 11

| | | Components of resin composition | | | |
|---|---|---|---|---|---|
| | (A) Alkali-soluble resin (content) | (I) Compound of which maximum absorption wavelength shifts by heat treatment (content) | (C) Photo-acid generator (content) | (D) Solvent (content) | Other compound (content) |
| Example 4 | (A1-1) (10 g) | I-1 (2 g) | C-1 (3 g) | GBL (40 g) | — |
| Example 5 | (A1-1) (10 g) | I-2 (2 g) | C-1 (3 g) | GBL (40 g) | — |
| Example 6 | (A1-1) (10 g) | I-3 (2 g) | C-1 (3 g) | GBL (40 g) | — |
| Example 7 | (A1-1) (10 g) | I-4 (2 g) | C-1 (3 g) | GBL (40 g) | — |
| Example 8 | (A1-1) (10 g) | I-5 (2 g) | C-1 (3 g) | GBL (40 g) | — |
| Example 9 | (A1-1) (10 g) | I-6 (2 g) | C-1 (3 g) | GBL (40 g) | — |
| Example 10 | (A1-1) (10 g) | I-7 (2 g) | C-1 (3 g) | GBL (40 g) | — |
| Example 11 | (A1-1) (10 g) | I-8 (2 g) | C-1 (3 g) | GBL (40 g) | — |

TABLE 11-continued

| | | Components of resin composition | | | |
|---|---|---|---|---|---|
| | (A) Alkali-soluble resin (content) | (I) Compound of which maximum absorption wavelength shifts by heat treatment (content) | (C) Photo-acid generator (content) | (D) Solvent (content) | Other compound (content) |
| Example 12 | (A1-1) (10 g) | I-9 (2 g) | C-1 (3 g) | GBL (40 g) | — |
| Example 13 | (A1-1) (10 g) | I-10 (2 g) | C-1 (3 g) | GBL (40 g) | — |
| Example 14 | (A1-1) (10 g) | I-1 (2 g) I-10 (2 g) | C-1 (3 g) | GBL (40 g) | — |
| Example 15 | (A1-1) (10 g) | I-1 (2 g) | C-1 (3 g) | GBL (40 g) | Valifast Yellow 4120 (0.5 g) (absorption maximum wavelength: 445 nm) Valifast RED 3311 (0.6 g) (absorption maximum wavelength: 525 nm) Valifast Blue 2620 (0.6 g) (absorption maximum wavelength: 690 nm) PlastYellow8070 (0.3 g) (absorption maximum wavelength: 445 nm) |
| Example 16 | (A1-1) (10 g) | I-1 (2 g) | C-1 (3 g) | GBL (40 g) | Oil Scarlet5206 (0.6 g) (absorption maximum wavelength: 515 nm) Plast Blue8540 (1.2 g) (absorption maximum wavelength: 645 nm) |

TABLE 12

| | Absorption maximum wavelength of component (I) (nm) | photosensitivity properties | | Absorption maximum wavelength of component (I) after heat treatment (nm) | Wavelength at which transmittance becomes 10% or less after heat treatment (nm) |
|---|---|---|---|---|---|
| | | Sensitivity (i line) (mJ/cm²) | Sensitivity (ghi line) (mJ/cm²) | | |
| Example 4 | 282 | 280 | 130 | 347 | A (365-378) |
| Example 5 | 322 | 340 | 160 | 347 | A (365-379) |
| Example 6 | 282 | 280 | 130 | 347 | A (365-375) |
| Example 7 | 324 | 350 | 160 | 347 | A (365-377) |
| Example 8 | 280 | 270 | 130 | 347 | A (365-378) |
| Example 9 | 325 | 340 | 160 | 347 | A (365-377) |
| Example 10 | 280 | 270 | 130 | 350 | A (365-368) |
| Example 11 | 315 | 320 | 150 | 345 | A (365-374) |
| Example 12 | 285 | 280 | 130 | 350 | A (365-380) |
| Example 13 | 338 | 420 | 180 | 430 | A (390-436) |
| Example 14 | 282, 338 | 360 | 160 | 347, 430 | A (365-436) |
| Example 15 | 282 | 360 | 160 | 347 | A (365-375) |
| Example 16 | 282 | 360 | 160 | 347 | A (365-375) |

TABLE 13

| | Components of resin composition | | | | |
|---|---|---|---|---|---|
| | (A) Alkali-soluble resin (content) | (I) Compound of which maximum wavelength shifts by heat treatment (content) | (C) Photo-acid generator (content) | (D) Solvent (content) | Other compound (content) |
| Comparative Example 5 | (A1-1) (10 g) | — | C-1 (3 g) | GBL (40 g) | — |
| Comparative Example 6 | (A1-1) (10 g) | — | C-1 (3 g) | GBL (40 g) | SEESORB 107 (1 g) |
| Comparative Example 7 | (A1-1) (10 g) | — | C-1 (3 g) | GBL (40 g) | SEESORB 106 (1 g) |
| Comparative Example 8 | (A1-1) (10 g) | — | C-1 (3 g) | GBL (40 g) | SEESORB 707 (1 g) |
| Comparative Example 9 | (A1-1) (10 g) | — | C-1 (3 g) | GBL (40 g) | TINUVIN 460 (1 g) |

TABLE 14

| | Absorption maximum wavelength of component (I) (nm) | photosensitivity properties | | Absorption maximum wavelength of component (I) after heat treatment (nm) | Wavelength at which transmittance becomes 10% or less after heat treatment (nm) |
|---|---|---|---|---|---|
| | | Sensitivity (i line) (mJ/cm$^2$) | Sensitivity (ghi line) (mJ/cm$^2$) | | |
| Comparative Example 5 | — | 220 | 120 | — | C (<350) |
| Comparative Example 6 | — | >1000 | 300 | — | A (365-380) |
| Comparative Example 7 | — | >1000 | 300 | — | A (365-385) |
| Comparative Example 8 | — | >1000 | 300 | — | A (365-376) |
| Comparative Example 9 | — | >1000 | 340 | — | A (365-382) |

In each of Examples 5 to 12 which were resin compositions each containing (A) an alkali-soluble resin, (I) a compound whose maximum absorption wavelength shifts by a heat treatment, (C) a photo-acid generator, (D) a solvent and other component and having positive-working photosensitiveness, the sensitivity to i line was 350 mJ/cm$^2$ or less and the sensitivity to ghi line was 180 mJ/cm$^2$ or less. The transmittance in a range having a wavelength of 380 nm or less in the wavelength range of 365 to 436 nm after the heat treatment was 10% or less. In Example 13 in which the compound (I-10) produced in Synthesis Example 10 was used, the sensitivity to i line was 420 mJ/cm$^2$ and the sensitivity to ghi line was 180 mJ/cm$^2$. With respect to the transmittance after the heat treatment, the transmittance at a wavelength range of 390 nm or more, among wavelengths of 365 to 436 nm, was 10% or less. In Example 14 in which the compound (I-1) produced in Synthesis Example 1 and the compound (I-10) produced in Synthesis Example 10 were used, the sensitivity to i line was 360 mJ/cm$^2$ and the sensitivity to ghi line was 160 mJ/cm$^2$. With respect to the transmittance after the heat treatment, the transmittance at a wavelength within the whole wavelength range of 365 to 436 nm was 10% or less. In each of Examples 15 and 16 in each of which a combination of three types of dyes having different maximum absorption wavelengths from one another was used as the component (J), the sensitivity to i line was 360 mJ/cm$^2$ and the sensitivity to ghi line was 160 mJ/cm$^2$. With respect to the transmittance after the heat treatment, the transmittance at a wavelength within a wavelength range of 380 nm or less among wavelengths of 365 to 436 nm was 10% or less. Because of the addition of the dyes, the products were blackened and had OD values of 0.2. In Comparative Example 5 in which the component (I) was not contained, the transmittance at a wavelength within the whole wavelength range of 350 to 460 nm after the heat treatment was 10% or more. In Comparative Examples 6 to 9 in each of which the component (I) was not contained and a compound having such a structure that a protecting group is removed from the component (I) was used instead, the sensitivity was significantly deteriorated.

Example 17

Bottom-gate-type oxide TFTs, each of which was designed in such a manner as to have a degree of resolution of 200 ppi, were formed on a glass substrate, and then an insulating film made from Si$_3$N$_4$ was formed in such a manner as to cover the TFTs. Subsequently, contact holes were formed in the insulating film, and then wiring lines (height: 1.0 μm) which were to be respectively connected to the TFTs through the contact holes was formed on the insulating film. The wiring lines were intended to connect the TFTs to each other or connect organic EL elements that were formed in the latter step to the TFTs.

For the purpose of planarizing projections and depressions which occurred as the result of the formation of the wiring lines, a planarization film was formed on the insulating film in such a manner as to fill the projections and depressions occurring as the result of the formation of the wiring line. The formation of the planarization film on the insulating film was carried out by spin-coating a varnish of a photosensitive polyimide precursor composition produced in any one of Examples 4 to 16 onto a substrate, then pre-baking the varnish on a hot plate at 120° C. for 2 minutes, and then subjecting the pre-baked product to a heat treatment under a nitrogen flow at 250° C. for 60 minutes. The coatability during the application of the varnish was good, and the occurrence of wrinkling or cracking was not observed in a heat-resistant resin film that was produced after the exposure to light, development and baking of the varnish. The average difference in level of the wiring lines was 500 nm, and the film thickness of the planarization film produced was 2000 nm.

The photodeterioration upon the irradiation of the oxide TFT device having the planarization film provided therein with light under negative bias stress was measured. The fluctuation in threshold voltage (i.e., the shift of a threshold voltage) before and after the irradiation with light was reduced, and a photodeterioration reduction effect was confirmed.

Example 18

Bottom-gate-type oxide TFTs, each of which was designed in such a manner as to have a degree of resolution of 200 ppi, were formed on a glass substrate, and then an insulating film made from Si$_3$N$_4$ was formed in such a manner as to cover the TFTs. Subsequently, contact holes were formed in the insulating film, and then wiring lines (height: 1.0 μm) which were to be respectively connected to the TFTs through the contact holes were formed on the insulating film. The wiring lines were intended to connect the TFTs to each other or connect organic EL elements that were formed in the latter step to the TFTs.

For the purpose of planarizing projections and depressions which occurred as the result of the formation of the wiring lines, a planarization film was formed on the insulating film in such a manner as to fill the projections and depressions occurring as the result of the formation of the wiring line. The formation of the planarization film on the insulating film was carried out by spin-coating a varnish of a photosensitive polyimide precursor composition produced in any one of Examples 4 to 16 onto a substrate, then pre-baking the varnish on a hot plate at 120° C. for 2 minutes, and then subjecting the pre-baked product to a heat treatment under a nitrogen flow at 250° C. for 60 minutes. The coatability during the application of the varnish was good, and the occurrence of wrinkling or cracking was not observed in a heat-resistant resin film that was produced after the exposure to light, development and baking of the varnish. The average difference in level of the wiring lines was 500 nm, and the film thickness of the planarization film produced was 2000 nm.

Subsequently, top-emission-type organic EL elements were formed on the planarization film. First, bottom electrodes made from ITO were formed on the planarization film by sputtering in such a manner as to be respectively connected to the wiring lines through the contact holes. Subsequently, a resist was applied, and the resultant product was pre-baked and then was exposed to light through a mask having a desired pattern to develop the pattern. A pattern processing was carried out by wet etching using an ITO etchant and using the resist pattern as a mask. Subsequently, the resist pattern was stripped with a resist stripping solution (a mixed solution of monoethanolamine and DMSO). The bottom electrodes produced in this manner correspond to anodes of the organic EL elements.

Subsequently, an insulating layer having a shape capable of covering the peripheries of the bottom electrodes was formed. For the formation of the insulating layer, a varnish of a photosensitive polyimide precursor composition produced in any one of Examples 4 to 16 was also used. When the insulating layer is provided, it becomes possible to prevent the occurrence of shorting out between bottom electrodes and an upper electrode produced in the latter step. The insulating layer was patterned and then subjected to a heat treatment at 250° C. for 60 minutes to form an insulating layer having proper absorption at a wavelength around 450 nm.

On the resultant product, a hole-transport layer, a red organic light-emitting layer, a green organic light-emitting layer, a blue organic light-emitting layer and an electron-transport layer were formed in this order by deposition through a desired mask pattern in a vacuum evaporator. Subsequently, an upper electrode made from Al was formed over the whole upper surface of the substrate. The upper electrode corresponds to a cathode of the organic EL elements. The substrate was removed from the evaporator, and then was sealed by adhering the substrate to a glass substrate for sealing use with an ultraviolet-ray-curable epoxy resin.

In the above-mentioned manner, an active-matrix-type organic EL display device, in which TFTs for driving organic EL elements were respectively connected to the organic EL elements, was produced. A voltage was applied to the device through a driving circuit, and good luminescence was observed.

DESCRIPTION OF REFERENCE SIGNS

1: TFT
2: Wiring line
3: Insulating film
4: Planarization film
5: ITO
6: Substrate
7: Contact hole
8: Insulating layer

The invention claimed is:

1. An organic EL display device comprising:
   a substrate having metal oxide thin film transistors formed thereon;
   a planarization film disposed on the substrate and thin film transistors; and
   display elements disposed on the planarization film, wherein
   the display elements have a degree of resolution of 200 ppi or more, and
   the planarization film is a heat-resistant resin film comprising a resin composition that has positive-working photosensitivity, wherein the planarization film comprises:
   (A1) a polyimide, a polybenzoxazole, a polyimide precursor or a polybenzoxazole precursor,
   (A3) a phenolic resin and/or a polyhydroxystyrene resin,
   (B) a thermally color-developing compound,
   (C) a photo-acid generator comprising a quinone diazide compound, and
   (D) a solvent, and
   (E1) a dye and/or a pigment each having an absorption maximum at a wavelength of 400 nm or more and less than 490 nm,
   wherein the component (A3) is contained in an amount of 5 to 50 parts by weight inclusive relative to 100 parts by weight of the component (A1), and
   the thermally color-developing compound (B) is able to produce a color upon a heat treatment and has an absorption maximum at a wavelength of 350 to 500 nm inclusive.

2. An organic EL display device comprising:
   a substrate having metal oxide thin film transistors formed thereon;
   a planarization film disposed on the substrate and thin film transistors; and
   display elements disposed on the planarization film, wherein
   the display elements have a degree of resolution of 200 ppi or more, and
   the planarization film is a heat-resistant resin film comprising a resin composition that has positive-working photosensitivity, wherein the planarization film comprises:
   (A2) a resin having such a backbone structure that two cyclic structures are bonded to a cyclic-structure-constituting quaternary carbon atom,
   (A3) a phenolic resin and/or a polyhydroxystyrene resin,
   (B) a thermally color-developing compound,
   (C) a photo-acid generator comprising a quinone diazide compound, and
   (D) a solvent,
   wherein the component (A3) is contained in an amount of 5 to 50 parts by weight inclusive relative to 100 parts by weight of the component (A2).

* * * * *